(12) United States Patent
Yamazaki et al.

(10) Patent No.: US 9,245,484 B2
(45) Date of Patent: Jan. 26, 2016

(54) E-BOOK READER

(75) Inventors: Shunpei Yamazaki, Setagaya (JP); Atsushi Umezaki, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 625 days.

(21) Appl. No.: 12/906,163

(22) Filed: Oct. 18, 2010

(65) Prior Publication Data

US 2011/0090186 A1    Apr. 21, 2011

(30) Foreign Application Priority Data

Oct. 21, 2009   (JP) ................................ 2009-242698
Oct. 21, 2009   (JP) ................................ 2009-242707

(51) Int. Cl.
| | |
|---|---|
| *H01L 27/14* | (2006.01) |
| *G09G 3/34* | (2006.01) |
| *H01L 27/12* | (2006.01) |
| *H01L 29/786* | (2006.01) |

(52) U.S. Cl.
CPC ............ *G09G 3/344* (2013.01); *H01L 27/1225* (2013.01); *H01L 29/7869* (2013.01); *G09G 2330/02* (2013.01)

(58) Field of Classification Search
CPC .............. G09G 3/344; G09G 2330/02; H01L 27/1225; H01L 29/7869
USPC ........................................................ 257/72
See application file for complete search history.

(56) References Cited

U.S. PATENT DOCUMENTS

| | | |
|---|---|---|
| 5,305,128 A | 4/1994 | Stupp et al. |
| 5,731,856 A | 3/1998 | Kim et al. |
| 5,744,864 A | 4/1998 | Cillessen et al. |
| 5,847,413 A | 12/1998 | Yamazaki et al. |
| 5,929,463 A | 7/1999 | Stupp et al. |
| 6,235,546 B1 | 5/2001 | Stupp et al. |
| 6,274,413 B1 | 8/2001 | Fang et al. |

(Continued)

FOREIGN PATENT DOCUMENTS

| | | |
|---|---|---|
| CN | 101258607 A | 9/2008 |
| EP | 0434161 A | 6/1991 |

(Continued)

OTHER PUBLICATIONS

Machine translation of korean patent applicaiton KR10-2004-0071600, Im et al.*

(Continued)

*Primary Examiner* — Shaun Campbell
(74) *Attorney, Agent, or Firm* — Eric J. Robinson; Robinson Intellectual Property Law Office, P.C.

(57) ABSTRACT

An e-book reader including a display panel having a thin film transistor with stable electrical characteristics is provided. Alternatively, an e-book reader capable of holding images for a long time is provided. Alternatively, a high-resolution e-book reader is provided. Alternatively, an e-book reader with low power consumption is provided. Display on the display panel of the e-book reader is controlled by a thin film transistor whose channel formation region is formed using an oxide semiconductor which is an intrinsic or substantially intrinsic semiconductor by removal of an impurity that might be an electron donor in the oxide semiconductor and has a larger energy gap than a silicon semiconductor.

22 Claims, 25 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,791,074 B2 | 9/2010 | Iwasaki |
| 7,910,490 B2 | 3/2011 | Akimoto et al. |
| 7,932,521 B2 | 4/2011 | Akimoto et al. |
| 7,935,582 B2 | 5/2011 | Iwasaki |
| 7,956,361 B2 | 6/2011 | Iwasaki |
| 8,154,024 B2 | 4/2012 | Iwasaki |
| 8,274,077 B2 | 9/2012 | Akimoto et al. |
| 8,466,463 B2 | 6/2013 | Akimoto et al. |
| 8,513,661 B2 | 8/2013 | Takahashi et al. |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0062119 A1* | 3/2008 | Park et al. ............ 345/107 |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0153039 A1* | 6/2008 | Akimoto ............ 430/313 |
| 2008/0166834 A1 | 7/2008 | Kim et al. |
| 2008/0182358 A1 | 7/2008 | Cowdery-Corvan |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284933 A1 | 11/2008 | Ito et al. |
| 2008/0296568 A1 | 12/2008 | Ryu et al. |
| 2008/0308805 A1 | 12/2008 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2009/0284225 A1* | 11/2009 | Nakanuma et al. ............ 320/134 |
| 2009/0305461 A1 | 12/2009 | Akimoto et al. |
| 2010/0026169 A1* | 2/2010 | Jeong et al. ............ 313/504 |
| 2010/0051957 A1* | 3/2010 | Kim et al. ............ 257/72 |
| 2010/0097684 A1* | 4/2010 | Ono et al. ............ 359/270 |
| 2010/0252826 A1* | 10/2010 | Yamazaki et al. ............ 257/43 |
| 2010/0276689 A1 | 11/2010 | Iwasaki |
| 2010/0279462 A1 | 11/2010 | Iwasaki |
| 2010/0295042 A1 | 11/2010 | Yano et al. |
| 2011/0012118 A1* | 1/2011 | Yamazaki et al. ............ 257/59 |
| 2011/0104851 A1 | 5/2011 | Akimoto et al. |
| 2011/0121290 A1 | 5/2011 | Akimoto et al. |

FOREIGN PATENT DOCUMENTS

| | | |
|---|---|---|
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2339639 A | 6/2011 |
| EP | 2816607 A | 12/2014 |
| JP | 60-198861 A | 10/1985 |
| JP | 63-208896 A | 8/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-163530 A | 7/1991 |
| JP | 04-046321 A | 2/1992 |
| JP | 05-251705 A | 9/1993 |
| JP | 08-264794 A | 10/1996 |
| JP | 10-091099 A | 4/1998 |
| JP | 11-505377 | 5/1999 |
| JP | 3064790B U | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |

(56) References Cited

FOREIGN PATENT DOCUMENTS

| | | | | |
|---|---|---|---|---|
| JP | 2003-086000 | A | 3/2003 | |
| JP | 2003-086808 | A | 3/2003 | |
| JP | 200448036 | A * | 2/2004 | ............ H01L 29/786 |
| JP | 2004-103957 | A | 4/2004 | |
| JP | 2004-273614 | A | 9/2004 | |
| JP | 2004-273732 | A | 9/2004 | |
| JP | 2006-165527 | | 6/2006 | |
| JP | 2006-165528 | | 6/2006 | |
| JP | 2006-165529 | | 6/2006 | |
| JP | 2007-073563 | A | 3/2007 | |
| JP | 2007-103918 | | 4/2007 | |
| JP | 2007-123861 | A | 5/2007 | |
| JP | 2007173307 | A * | 7/2007 | |
| JP | 2007-529117 | | 10/2007 | |
| JP | 2007-298627 | A | 11/2007 | |
| JP | 2008-286911 | | 11/2008 | |
| JP | 2009-021480 | A | 1/2009 | |
| JP | 2009-117620 | A | 5/2009 | |
| JP | 2009-176865 | A | 8/2009 | |
| KR | 10-2004-0071600 | * | 8/2004 | |
| TW | 404070 | | 9/2000 | |
| WO | WO-2004/114391 | | 12/2004 | |
| WO | WO-2005/093847 | | 10/2005 | |
| WO | WO2007/029844 | * | 3/2007 | ............ H01L 29/786 |
| WO | WO-2007/029844 | | 3/2007 | |
| WO | WO-2009/093625 | | 7/2009 | |
| WO | WO-2009/093722 | | 7/2009 | |

OTHER PUBLICATIONS

Oana, Yasuhisa, Translation JP 2007173307A, Japan, pp. 1-13.*
Koyama et al., Translation JP 200448036A, Japan, pp. 1-10.*
International Search Report (Application No. PCT/JP2010/067192), dated Dec. 28, 2010.
Written Opinion (Application No. PCT/JP2010/067192), dated Dec. 28, 2010.
Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Xinc Oxide Thin-Fil Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga: m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs,", IDW '02 : Proceedings of the 9th International Display Workshops, Dec. 4, 2002, pp. 295-298.
Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-plane,", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,Or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Taiwanese Office Action (Application No. 099134422) Dated Mar. 27, 2015.

* cited by examiner

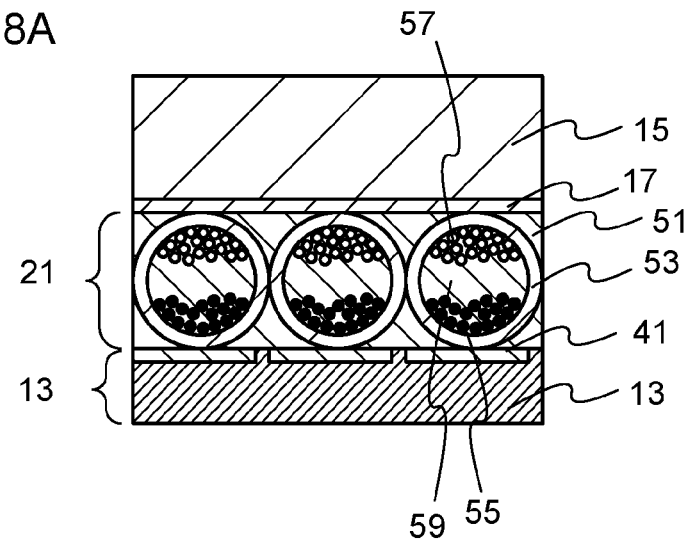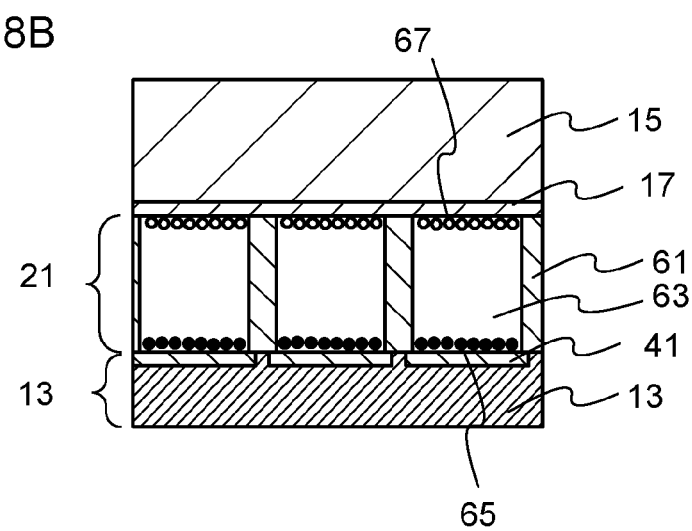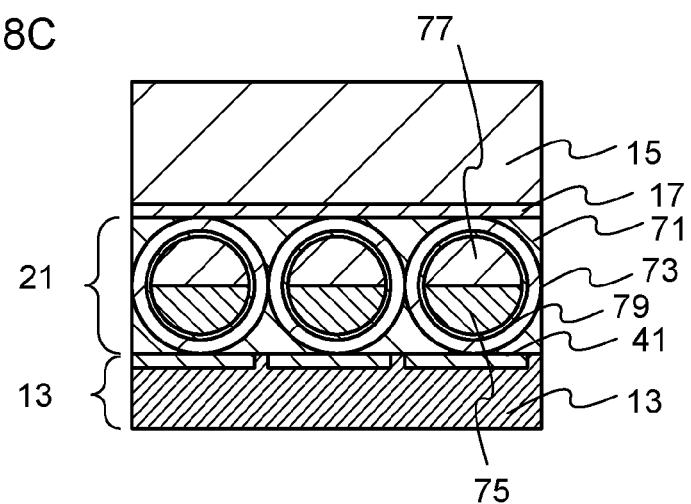

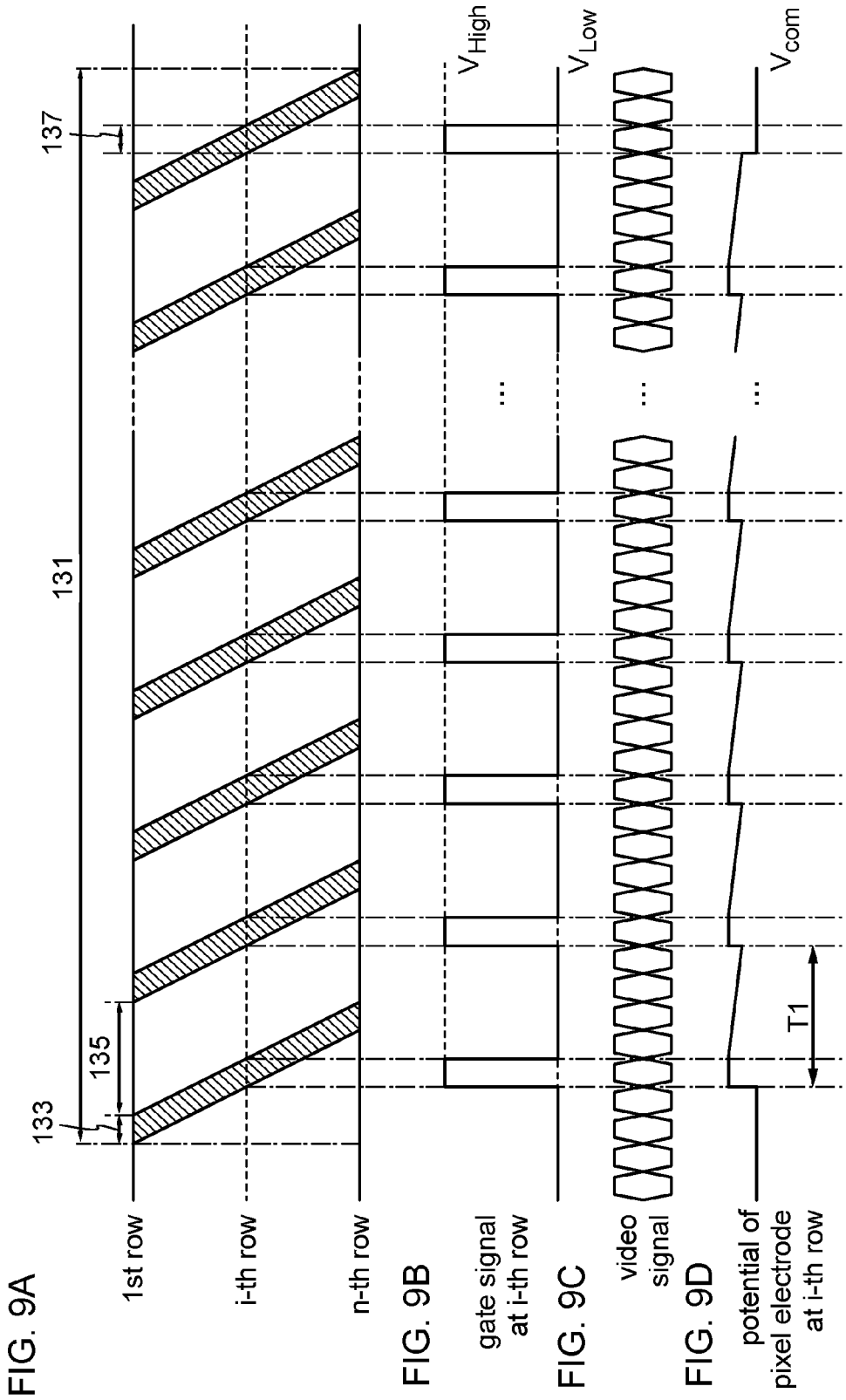

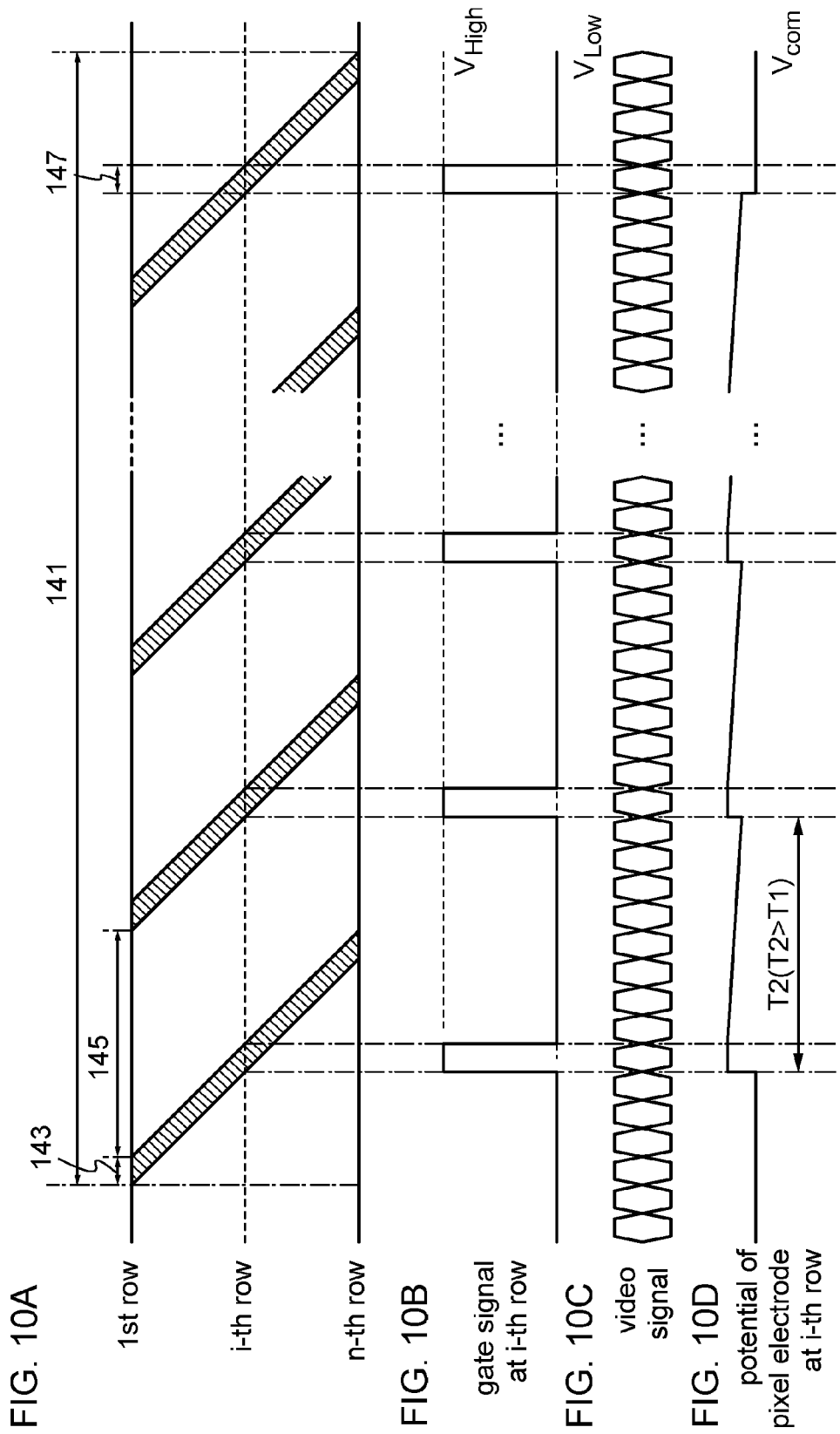

E-BOOK READER

TECHNICAL FIELD

One embodiment of the present invention relates to an e-book reader including a display panel formed using a field-effect transistor including an oxide semiconductor.

BACKGROUND ART

A technique for forming a thin film transistor (TFT) with the use of a semiconductor thin film formed over a substrate having an insulating surface has attracted attention. Thin film transistors have been used in display devices typified by liquid crystal televisions. A silicon-based semiconductor material has been known as a semiconductor thin film applicable to a thin film transistor. As another material, an oxide semiconductor has attracted attention.

As an oxide semiconductor material, for example, zinc oxide and a substance containing zinc oxide have been known. In addition, a thin film transistor formed using an amorphous oxide (an oxide semiconductor) whose concentration of carriers (electrons) is lower than $10^{18}/cm^3$ has been disclosed (References 1 to 3).

REFERENCE

[Reference 1] Japanese Published Patent Application No. 2006-165527
[Reference 2] Japanese Published Patent Application No. 2006-165528
[Reference 3] Japanese Published Patent Application No. 2006-165529

DISCLOSURE OF INVENTION

Deviation from the stoichiometric composition of an oxide semiconductor occurs in a process of forming a thin film. For example, the electrical conductivity of the oxide semiconductor is changed due to excess or deficiency of oxygen. Mixture of hydrogen in a process of forming an oxide semiconductor thin film forms an O—H (oxygen-hydrogen) bond and serves as an electron donor, which results in a change in electrical conductivity. Further, the O—H bond is a bond having polarity; thus, the O—H bond might cause variation in characteristics of an active device such as a thin film transistor formed using an oxide semiconductor.

If the concentration of carriers (electrons) is less than $10^{18}/cm^3$, the oxide semiconductor has substantially n-type conductivity, and the on/off ratio of each thin film transistor disclosed in References 1 to 3 is only $10^3$. The reason for the low on/off ratio of such a thin film transistor is high off-state current.

In view of the foregoing problems, it is an object of one embodiment of the present invention to provide an e-book reader including a display panel having a thin film transistor with stable electrical characteristics (e.g., significantly low off-state current). It is an object of one embodiment of the present invention to provide an e-book reader capable of holding images for a long time. It is an object of one embodiment of the present invention to provide a high-resolution e-book reader. It is an object of one embodiment of the present invention to provide an e-book reader with low power consumption.

In one embodiment of the present invention, display on a display panel of an e-book reader is controlled by a thin film transistor whose channel formation region is formed using an oxide semiconductor which is an intrinsic or substantially intrinsic semiconductor by removal of an impurity that might be an electron donor in the oxide semiconductor and has a larger energy gap than a silicon semiconductor. Typically, voltage applied to a pixel electrode in a pixel of the display panel is controlled.

In other words, in one embodiment of the present invention, display on a display panel of an e-book reader is controlled by a thin film transistor whose channel formation region is formed using an oxide semiconductor film. In the oxide semiconductor film, the concentration of hydrogen in an oxide semiconductor is $5\times10^{19}/cm^3$ or lower, preferably $5\times10^{18}/cm^3$ or lower, more preferably $5\times10^{17}/cm^3$ or lower; hydrogen or an O—H bond contained in the oxide semiconductor is removed; and the concentration of carriers is $5\times10^{14}/cm^3$ or lower, preferably $5\times10^{12}/cm^3$ or lower. Typically, voltage applied to a pixel electrode in a pixel of the display panel is controlled.

The energy gap of the oxide semiconductor is 2 eV or higher, preferably 2.5 eV or higher, more preferably 3 eV or higher. An impurity such as hydrogen, which forms donors, is reduced as much as possible. The concentration of carriers is set to $1\times10^{14}/cm^3$ or lower, preferably $1\times10^{12}/cm^3$ or lower.

When such a highly purified oxide semiconductor is used for the channel formation region of the thin film transistor, even when the channel width is 10 mm, drain current is set to $1\times10^{-13}$ A or less in the range of gate voltage of $-20$ V to $-5$ V when drain voltage is 1 V and 10 V.

In addition, an e-book reader in one embodiment of the present invention includes a primary battery, a secondary battery having a function of storing electric charge, or a capacitor as a power supply device. The e-book reader in one embodiment of the present invention further includes a display panel including a display element which has a pair of electrodes and a display medium provided between the pair of electrodes, as the display panel. In one embodiment of the present invention, the display panel is a display panel capable of holding images which have already been displayed once, such as an electrophoretic display panel, a particle movement display panel, a particle rotation display panel, a liquid crystal display panel, an electrolytic precipitation display panel, an electrochromic display panel, or a film transfer display panel.

In accordance with one embodiment of the present invention, by control of display on a display panel of an e-book reader with the use of a thin film transistor including a highly purified oxide semiconductor whose concentration of hydrogen is low, the potential of a pixel electrode provided in each pixel in the display panel is held for a longer time. Therefore, the number of scanning of pixels can be reduced and the drive frequency of a scan line driver circuit can be lowered, so that power consumption of the e-book reader can be reduced and images can be held for a long time. Further, off-state current is reduced to $1\times10^{-13}$ A or less; thus, a capacitor for holding signal voltage applied to the pixel can be made small and the area of the capacitor can be decreased. Accordingly, the resolution of the e-book reader can be increased.

BRIEF DESCRIPTION OF DRAWINGS

In the accompanying drawings:

FIGS. 8A to 8C are cross-sectional views illustrating structures of display media;

FIGS. 9A to 9D illustrate a display method of a conventional display panel;

FIGS. 10A to 10D illustrate a display method of a display panel in one embodiment of the present invention;

BEST MODE FOR CARRYING OUT THE INVENTION

Figure 1A:
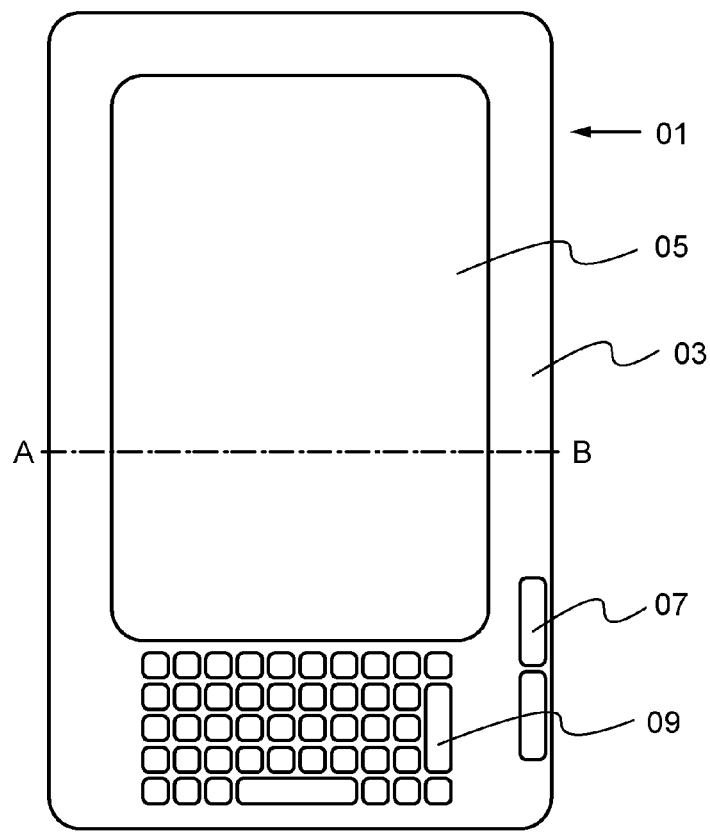
FIGS. 1A and 1B are a top view and a cross-sectional view of an e-book reader.

Embodiments of the present invention will be described in detail with reference to the drawings. Note that the present invention is not limited to the following description, and it will be readily appreciated by those skilled in the art that modes and details of the present invention can be changed in various ways without departing from the spirit and scope of the present invention. Therefore, the present invention should not be construed as being limited to the following description of the embodiments. Note that in structures of the present invention described below, the same portions or portions having similar functions are denoted by the same reference numerals in different drawings, and description thereof is not repeated.

Note that in each drawing described in this specification, the size, the layer thickness, or the region of each component is exaggerated for clarity in some cases. Therefore, embodiments of the present invention are not limited to such scales.

Note that in this specification, terms such as "first", "second", and "third" are used in order to avoid confusion among components and do not limit the number. Therefore, for example, the term "first" can be replaced with the term "second", "third", or the like as appropriate.

Embodiment 1

In this embodiment, the structure of an e-book reader which is one embodiment of the present invention is described with reference to FIGS. 1A and 1B.

Figure 1B:
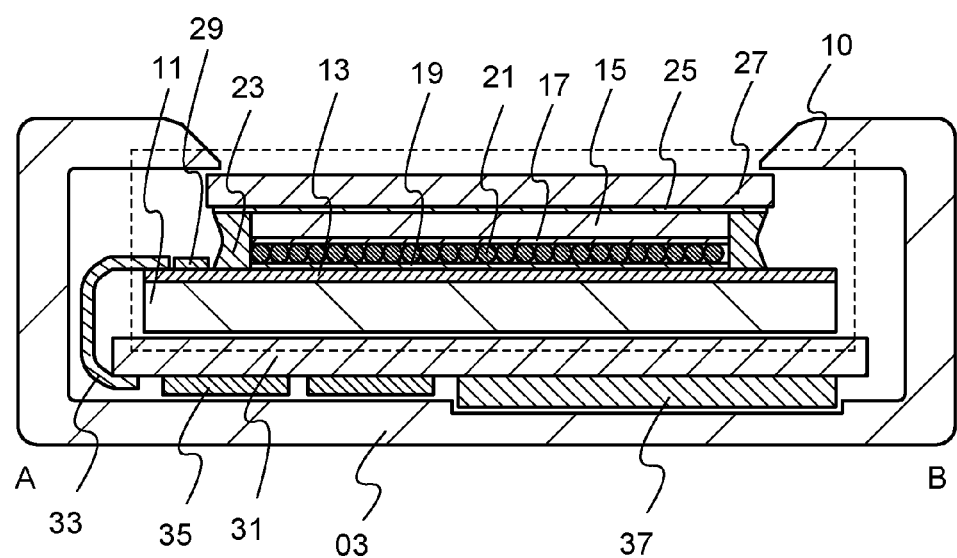

FIG. 1A is a plan view of an e-book reader, and FIG. 1B corresponds to a cross-sectional view taken along dashed line A-B in FIG. 1A.

As illustrated in FIG. 1A, an e-book reader 01 includes a display portion 05 surrounded by a housing 03, and operation keys 07 and 09. Although not illustrated in FIG. 1A, the e-book reader 01 may further include an external connection terminal (e.g., an earphone terminal, a USB terminal, or a terminal which can be connected to a variety of cables such as USB cables), a recording medium insertion portion, a speaker, a sound volume adjustment button, or the like on a reverse side or a side surface of the housing. Pages can be turned, characters can be entered, data displayed can be enlarged or downsized, and other operations can be performed with the operation keys 07 and 09.

Next, the inside of the housing 03 of the e-book reader 01 is described with reference to FIG. 1B.

A display panel 10, a wiring board 31, a flexible printed circuit (FPC) 33 for connecting the display panel 10 and the wiring board 31 to each other, a semiconductor device 35 mounted on the wiring board 31, and a power supply device 37 are provided inside the housing 03.

The display panel 10 includes a first substrate 11, an element layer 13, a display medium 21, a second electrode 17, a second substrate 15, a third substrate 27, and a sealant 23 for firmly fixing the first substrate 11, the second substrate 15, and the third substrate 27 to each other. Here, the display panel 10 further includes an adhesive 19 for bonding the element layer 13 and the display medium 21 to each other and an adhesive 25 for bonding the second substrate 15 and the third substrate 27 to each other.

The first substrate 11 is a substrate used for forming the element layer 13. It is necessary that the first substrate 11 have at least heat resistance high enough to withstand heat treatment to be performed later. A glass substrate formed using barium borosilicate glass, aluminoborosilicate glass, or the like can be used as the first substrate 11.

In the case where the temperature of the heat treatment to be performed later is high, a substrate whose strain point is higher than or equal to 730° C. is preferably used as the glass substrate. For the glass substrate, for example, a glass material such as aluminosilicate glass, aluminoborosilicate glass, or barium borosilicate glass is used. By containing more barium oxide (BaO) than boron oxide, a more practical heat-resistant glass substrate can be obtained. Therefore, a glass substrate containing more BaO than $B_2O_3$ is preferably used.

Note that instead of the glass substrate, a substrate formed using an insulator, such as a ceramic substrate, a quartz substrate, or a sapphire substrate, may be used. Alternatively, a crystallized glass substrate or the like can be used.

Alternatively, a plastic film or the like formed using polyethylene terephthalate, polyimide, an acrylic resin, polycarbonate, polypropylene, polyester, polyvinyl chloride, or the like can be used as long as it has heat resistance high enough to withstand the heat treatment to be performed later.

The element layer 13 includes an active element for driving the display medium 21, a passive element, and a first electrode serving as a pixel electrode. Examples of the active element include a thin film transistor, a diode, and the like. In addition, examples of the passive element include a resistor, a capacitor, and the like.

Here, one embodiment of the structure of the element layer 13 is described with reference to FIGS. 2A and 2B.

Figure 2A:
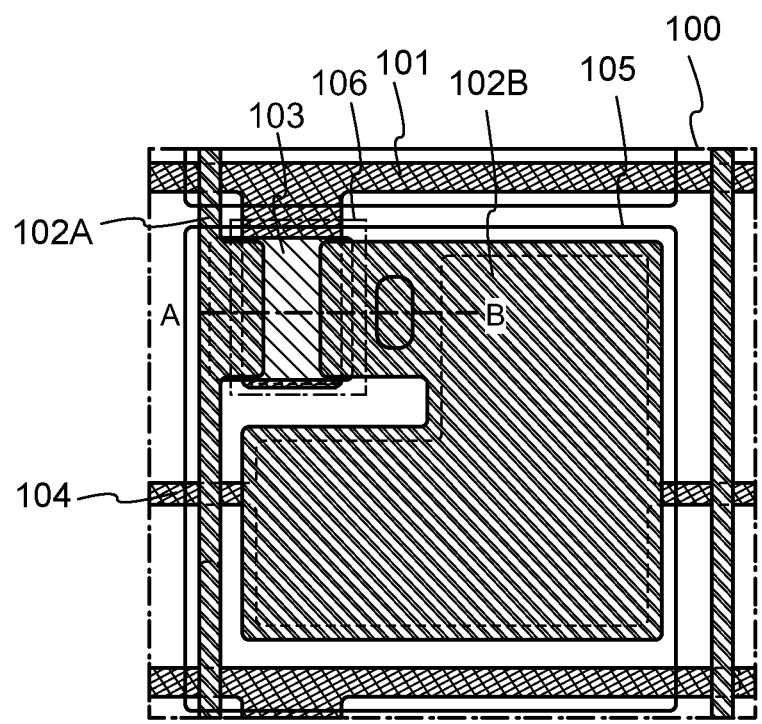
FIGS. 2A and 2B are a top view and a cross-sectional view of a display panel.
Figure 2B:
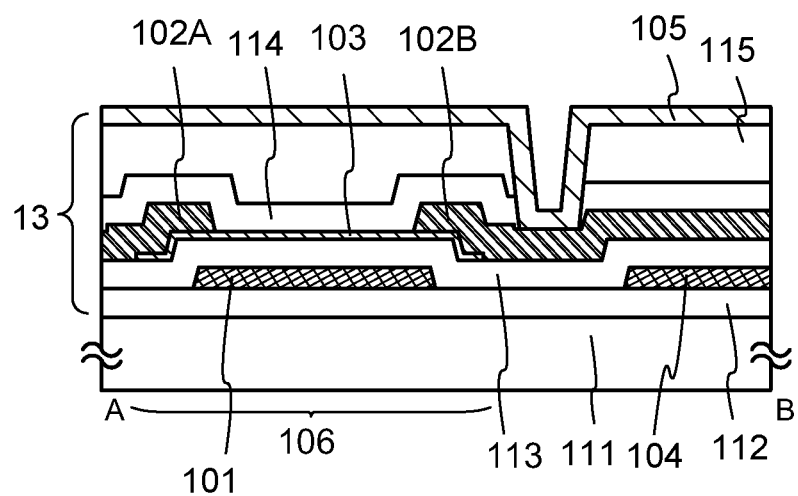

In FIGS. 2A and 2B, a thin film transistor (hereinafter also referred to as a TFT) included in a pixel in the element layer 13, and a first electrode serving as a pixel electrode (such an electrode is also simply referred to as a pixel electrode) connected to the TFT are described. Note that the pixel refers to an element group which includes elements used for controlling display in accordance with electric signals, such as a thin film transistor, an electrode serving as a pixel electrode, and a wiring. Note that the pixel may include a color filter or the like, and may correspond to one color element whose brightness can be controlled. Therefore, as one embodiment, in the case of a color display device including color elements of R, G, and B, the minimum unit of an image includes three pixels of an R pixel, a G pixel, and a B pixel, and an image can be displayed by a plurality of pixels.

Note that when it is described that "A and B are connected to each other", the case where A and B are electrically connected to each other and the case where A and B are directly connected to each other are included therein. Here, each of A and B is an object (e.g., a device, an element, a circuit, a wiring, an electrode, a terminal, or a conductive film).

FIG. 2A is a top view of the pixel. Note that the structure of the TFT illustrated in FIG. 2A is a bottom-gate structure as an example. Specifically, a so-called inverted staggered structure, where wirings serving as a source electrode and a drain electrode of the TFT are in contact with part of an upper surface of an oxide semiconductor film that overlaps with a wiring serving as a gate electrode and serves as a channel region, is described.

A pixel 100 illustrated in FIG. 2A includes a first wiring 101 serving as a scan line, a second wiring 102A serving as a signal line, an oxide semiconductor film 103, a capacitor line 104, and a pixel electrode 105. The pixel 100 further includes a third wiring 102B for electrically connecting the oxide semiconductor film 103 and the pixel electrode 105 to each other, and a thin film transistor 106. The first wiring 101 also serves as a gate of the thin film transistor 106. The second wiring 102A also serves as one of a source electrode and a drain electrode and one terminal of a storage capacitor. The third wiring 102B also serves as the other of the source electrode and the drain electrode. The capacitor line 104 serves as the other electrode of the storage capacitor. Note that the first wiring 101 and the capacitor line 104 are provided in the same layer, and the second wiring 102A and the third wiring 102B are provided in the same layer. In addition, the third wiring 102B and the capacitor line 104 partly overlap with each other, so that a storage capacitor of a display medium is formed. In order to widen an area where voltage is applied to the display medium, the pixel electrode 105 overlaps with the first wiring 101 and the second wiring 102A. Note that the oxide semiconductor film 103 included in the thin film transistor 106 is provided over a wiring that branches from the first wiring 101 with a gate insulating film (not illustrated) therebetween. Further, in FIG. 2A, the hatch pattern of the pixel electrode 105 is not illustrated.

FIG. 2B is a cross-sectional view taken along dashed line A-B in FIG. 2A. The first wiring 101 serving as the gate and the capacitor line 104 are provided over a first substrate 111 with a base film 112 therebetween. A gate insulating film 113 is provided so as to cover the first wiring 101 and the capacitor line 104. The oxide semiconductor film 103 is provided over the gate insulating film 113. The second wiring 102A and the third wiring 102B are provided over the oxide semiconductor film 103. An oxide insulating film 114 serving as a passivation film is provided over the oxide semiconductor film 103, the second wiring 102A, and the third wiring 102B. A planarization insulating film 115 is provided over the oxide insulating film 114. An opening is formed in the oxide insulating film 114 and the planarization insulating film 115, and the pixel electrode 105 and the third wiring 102B are connected to each other through the opening. The third wiring 102B and the capacitor line 104 form a capacitor with the gate insulating film 113 used as a dielectric. Here, a stack including the base film 112 to the pixel electrode 105 are denoted by the element layer 13.

Note that a thin film transistor is an element having at least three terminals: a gate, a drain, and a source. The thin film transistor has a channel formation region between a drain region and a source region, and current can flow through the drain region, the channel formation region, and the source region. Here, since the source and the drain of the transistor change depending on the structure, the operating condition, and the like of the transistor, it is difficult to define which is a source or a drain. Thus, a region which serves as a source and a drain is not referred to as a source or a drain in some cases. In that case, one of the source and the drain might be referred to as a first terminal and the other of the source and the drain might be referred to as a second terminal, for example. Alternatively, one of the source and the drain might be referred to as a first electrode and the other of the source and the drain might be referred to as a second electrode. Alternatively, one of the source and the drain might be referred to as a first region and the other of the source and the drain might be referred to as a second region.

Next, the oxide semiconductor film 103 included in the thin film transistor 106 in this embodiment is described.

In the oxide semiconductor used in this embodiment, the concentration of hydrogen in the oxide semiconductor is $5 \times 10^{19}/cm^3$ or lower, preferably $5 \times 10^{18}/cm^3$ or lower, more preferably $5 \times 10^{17}/cm^3$ or lower; and hydrogen or an O—H bond contained in the oxide semiconductor is removed. The concentration of carriers is $5 \times 10^{14}/cm^3$ or lower, preferably $1 \times 10^{14}/cm^3$ or lower, more preferably $5 \times 10^{12}/cm^3$ or lower, still more preferably $1 \times 10^{12}/cm^3$ or lower. That is, the concentration of carriers in the oxide semiconductor film is as close to zero as possible. Further, the energy gap of the oxide semiconductor is 2 eV or more, preferably 2.5 eV or more, more preferably 3 eV or more. Note that the concentration of hydrogen in the oxide semiconductor film may be measured by secondary ion mass spectrometry (SIMS).

Next, the operation of the thin film transistor including the oxide semiconductor film 103 is described with reference to energy band diagrams.

Figure 3:
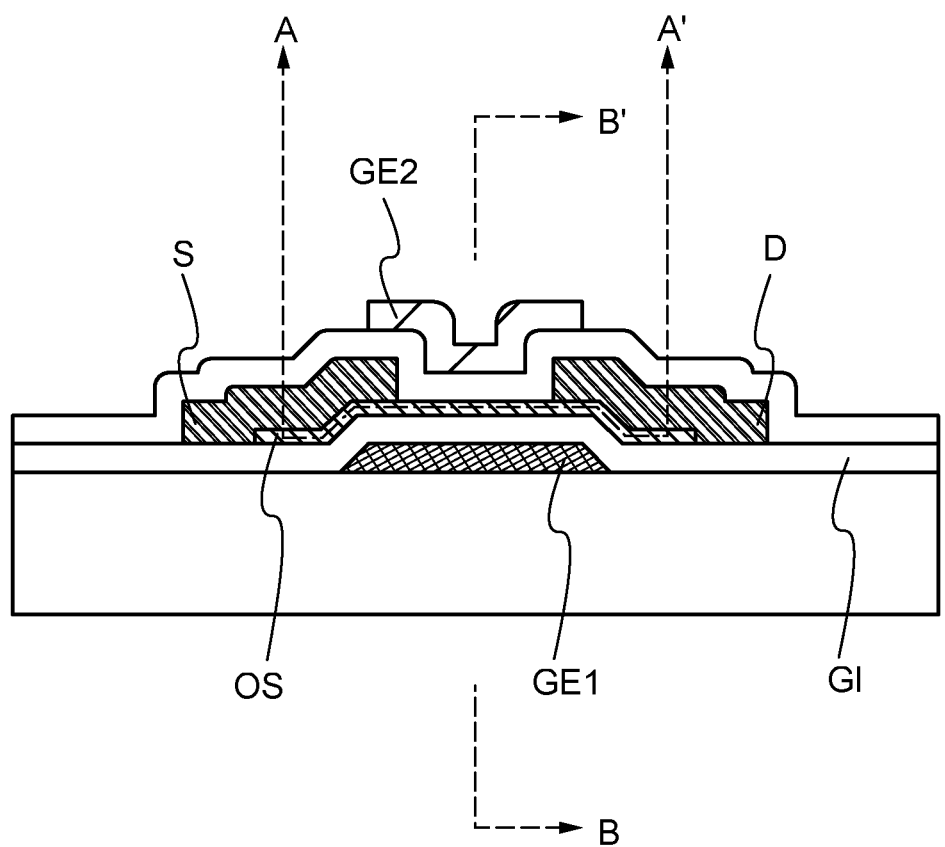
FIG. 3 is a longitudinal cross-sectional view of an inverted staggered thin film transistor including an oxide semiconductor.

FIG. 3 is a longitudinal cross-sectional view of an inverted staggered thin film transistor including an oxide semiconductor in this embodiment. An oxide semiconductor film (OS) is provided over a gate electrode (GE1) with a gate insulating film (GI) therebetween. A source electrode (S) and a drain electrode (D) are provided thereover.

Figure 4A:
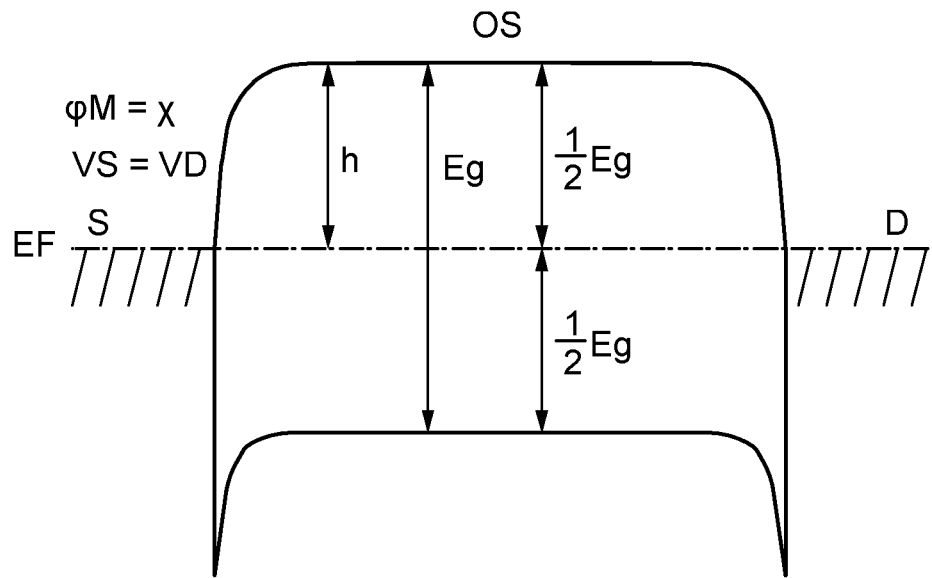
FIGS. 4A and 4B are energy band diagrams (schematic views) in an A-A' cross section in FIG. 3.
Figure 4B:
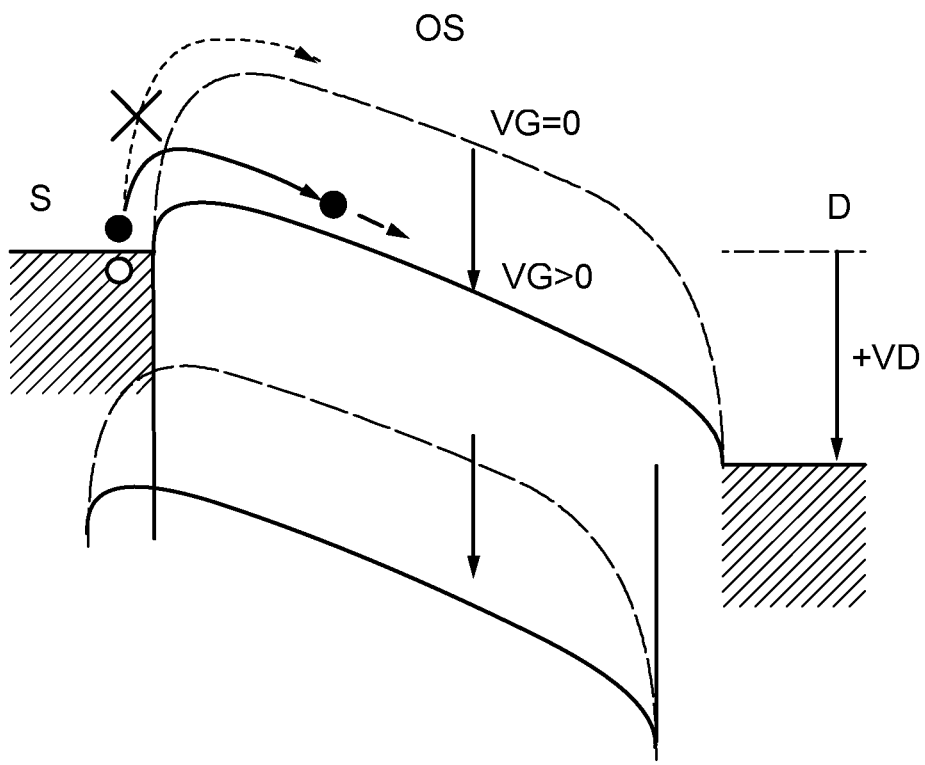

FIGS. 4A and 4B are energy band diagrams (schematic views) in an A-A' cross section in FIG. 3. FIG. 4A illustrates the case where the voltage of a source and the voltage of a drain are equal ($V_D=0$ V), and FIG. 4B illustrates the case where a positive potential ($V_D>0$ V) is applied to the drain.

Figure 5A:
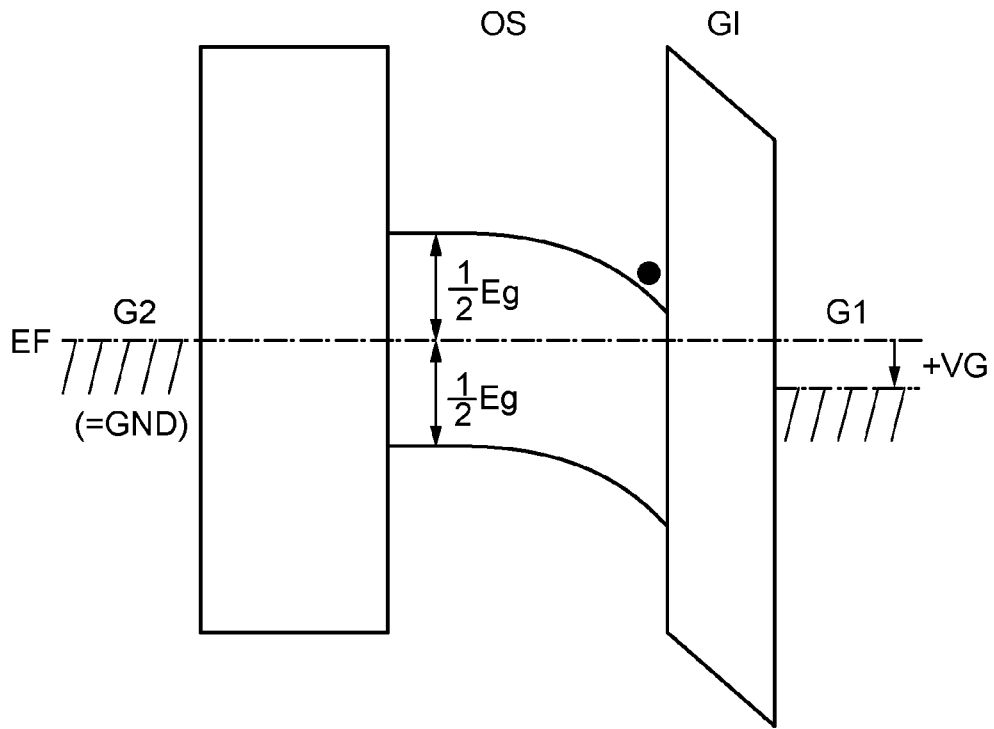
FIG. 5A illustrates a state in which a positive potential (+VG) is applied to a gate (G1)
Figure 5B:
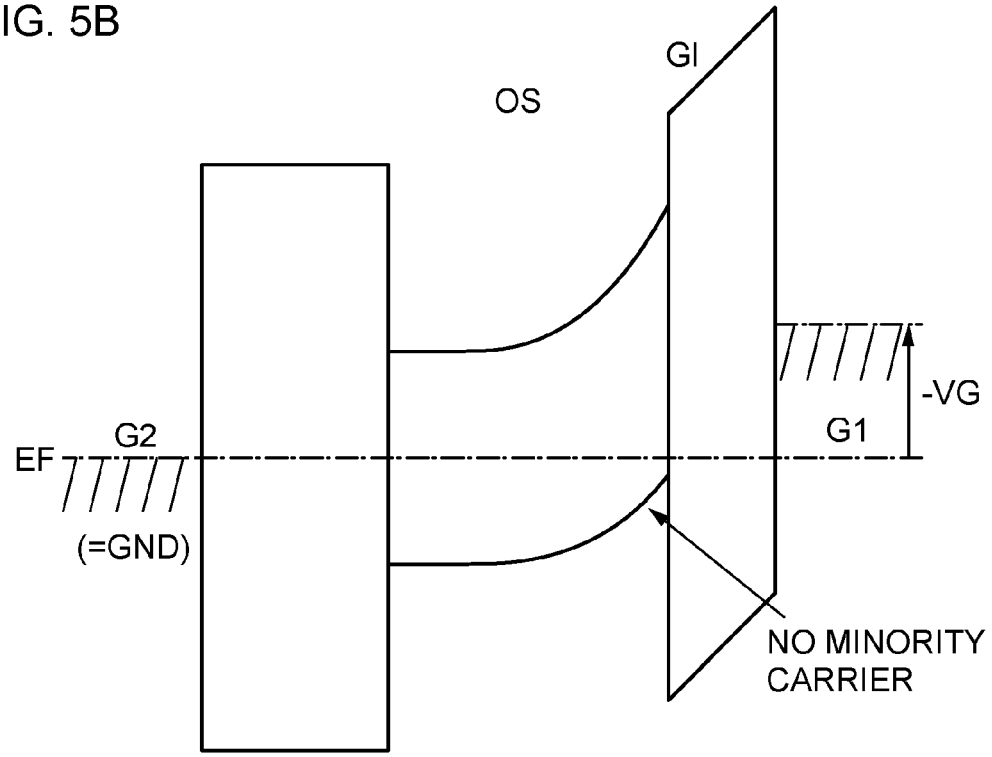
FIG. 5B illustrates a state in which a negative potential (−VG) is applied to the gate (G1)

FIGS. 5A and 5B are energy band diagrams (schematic views) in a B-B' cross section in FIG. 3. FIG. 5A illustrates a state in which a positive potential ($+V_G$) is applied to a gate (G1) and carriers (electrons) flow between a source and a drain. Further, FIG. 5B illustrates a state in which a negative potential ($-V_G$) is applied to the gate (G1) and the thin film transistor is off (minority carriers do not flow).

Figure 6:
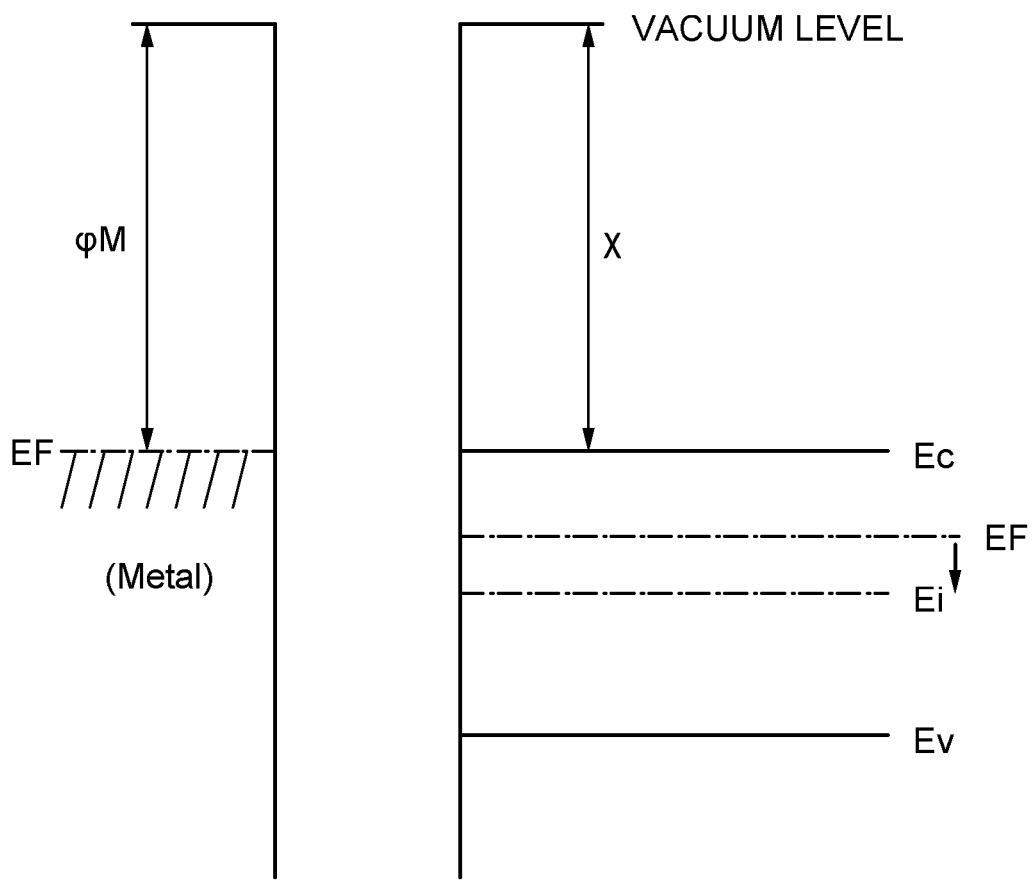
FIG. 6 illustrates a relationship among a vacuum level, a work function ($\phi_M$) of a metal, and electron affinity ($\chi$) of an oxide semiconductor.

FIG. 6 illustrates a relationship among a vacuum level, the work function ($\phi_M$) of a metal, and electron affinity ($\chi$) of an oxide semiconductor.

At normal temperature, electrons in the metal degenerate and the Fermi level is positioned in the conduction band. On the other hand, a conventional oxide semiconductor generally has n-type conductivity, and the Fermi level ($E_F$) of the conventional oxide semiconductor is apart from the intrinsic Fermi level ($E_i$) positioned in the center of the band gap and is positioned near the conduction band. Note that it is known that part of hydrogen in an oxide semiconductor serves as a donor and a factor in having n-type conductivity.

In contrast, the oxide semiconductor in this embodiment is an intrinsic (i-type) or substantially intrinsic oxide semiconductor obtained by removal of hydrogen, which is an n-type impurity, from the oxide semiconductor and the increase in purity so that an impurity other than the main components of the oxide semiconductor is not included as much as possible. In other words, the oxide semiconductor in this embodiment is a highly purified intrinsic (i-type) semiconductor or a semiconductor which is close to a highly purified i-type semiconductor not by addition of an impurity but by removal of an impurity such as hydrogen or water as much as possible. In this manner, the Fermi level ($E_F$) can be the same level as the intrinsic Fermi level ($E_i$).

It is said that in the case where the band gap (Eg) of the oxide semiconductor is 3.15 eV, electron affinity ($\chi$) is 4.3 eV. The work function of titanium (Ti) used for the source electrode and the drain electrode is substantially the same as the electron affinity ($\chi$) of the oxide semiconductor. In this case, the Schottky electron barrier is not formed at an interface between the metal and the oxide semiconductor.

In other words, in the case where the work function ($\phi_M$) of the metal is the same as the electron affinity ($\chi$) of oxide semiconductor, a state in which the metal and the oxide semiconductor are in contact with each other is shown as an energy band diagram (a schematic view) illustrated in FIG. 4A.

In FIG. 4B, a black circle (•) indicates an electron and application of a positive potential to the drain, and a broken line indicates the case where positive potential (VG>0 V) is applied to the gate. In the case where potential is not applied to the gate, the thin film transistor is in an off state in which carriers (electrons) are not injected from an electrode to the oxide semiconductor side due to high ohmic contact resistance and current does not flow. In contrast, in the case where positive potential is applied to the gate, the thin film transistor is in an on state in which ohmic contact resistance is lowered and current flows.

In this case, as illustrated in FIG. 5A, electrons move along the lowest part that is energetically stable on the oxide semiconductor side at an interface between the gate insulating film and the highly purified oxide semiconductor.

Further, in FIG. 5B, holes that are minority carriers are substantially zero when a negative potential is applied to the gate (G1); thus, the amount of current is as close to as zero.

For example, even in the case of a thin film transistor whose channel width W is $1\ 15\times10^4$ μm and whose channel length L is 3 μm, off-state current is $10^{-13}$ A or less and a subthreshold swing (an S value) is 0.1 V/dec (the thickness of a gate insulating film is 100 nm).

By the increase in purity so that an impurity other than the main components of the oxide semiconductor is not included as much as possible in this manner, the thin film transistor can operate favorably. In particular, off-state current can be reduced.

In FIG. 2B, for the first electrode (the pixel electrode 105) formed in the element layer 13, typically, a conductive material having reflectance or light-blocking properties, such as an element selected from aluminum, copper, titanium, tantalum, tungsten, molybdenum, chromium, neodymium, or scandium; an alloy containing any of these elements; a compound (e.g., an oxide or a nitride) containing any of these elements; or the like can be used. Alternatively, a light-transmitting conductive material such as indium tin oxide (hereinafter referred to as ITO), indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, can be used. Alternatively, a layered structure containing any of these materials can be used. When the first electrode formed in the element layer 13 is formed using a reflective conductive material, outside light can be reflected, so that the reflection efficiency of light can be improved.

In the element layer 13, the first electrode (the pixel electrode 105) is provided in each pixel. Further, the first electrode (the pixel electrode 105) is connected to the thin film transistor 106, and voltage applied to the first electrode (the pixel electrode 105) provided in each pixel is controlled by the thin film transistor.

Figure 7:
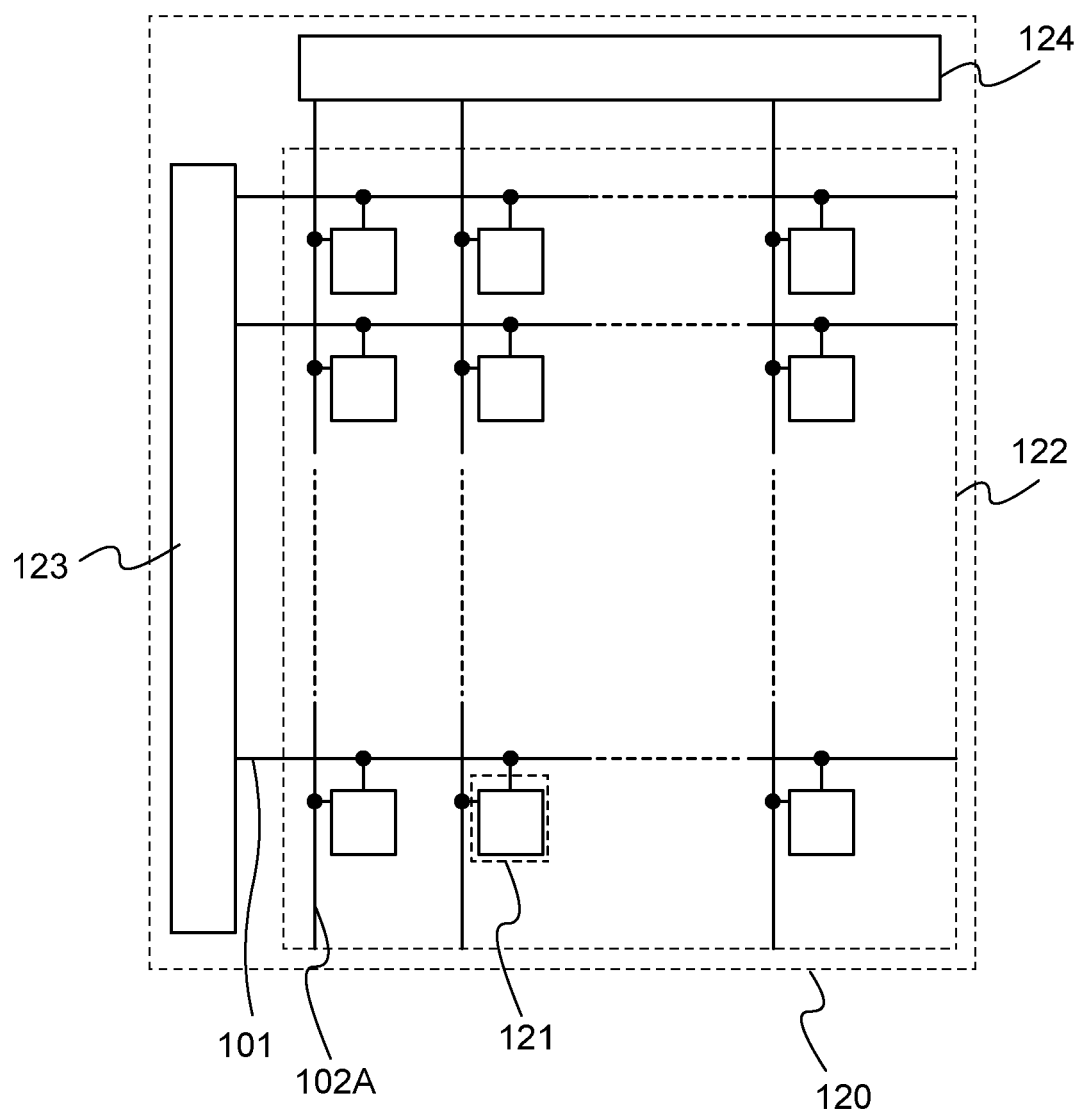
FIG. 7 is a block diagram of a display panel.

Note that the pixel illustrated in FIGS. 2A and 2B corresponds to one of a plurality of pixels 121 arranged in matrix over a first substrate 120, as illustrated in FIG. 7. FIG. 7 illustrates a structure where a pixel portion 122, a scan line driver circuit 123, and a signal line driver circuit 124 are provided over the first substrate 120. Whether the pixels 121 are selected or not is determined in every row in response to a scan signal supplied from the first wiring 101 connected to the scan line driver circuit 123. The pixel 121 selected by the scan signal is supplied with a video signal (also referred to as an image signal, video voltage, or video data) from the wiring 102A connected to the signal line driver circuit 124.

FIG. 7 illustrates a structure where the plurality of pixels 121 are arranged in matrix (in stripe) in the pixel portion 122. Note that the pixels 121 are not necessarily arranged in matrix and may be arranged in a delta pattern or in Bayer arrangement. Further, as the display method of the pixel portion 122, either a progressive method or an interlace method can be employed. Note that color elements controlled in the pixel at the time of color display are not limited to three colors of R, G, and B (R, G, and B correspond to red, greed, and blue, respectively), and color elements of more than three colors may be employed, for example, R, G, B, and W (W corresponds to white); R, G, B, and one or more of yellow, cyan, magenta, and the like; or the like. Further, the size of display regions may be different between respective dots of color elements.

In FIG. 7, the number of the first wirings 101 and the number of the second wirings 102A correspond to the number of pixels in the row direction and the column direction. Note that the number of the first wirings 101 and the number of the second wirings 102A may be increased depending on the number of subpixels included in the pixel or the number of transistors in the pixel. Alternatively, the pixel 121 may be driven with the first wiring 101 and the second wiring 102A used in common between some pixels.

Note that although opposite portions of the second wiring 102A and the third wiring 102B have linear structures in FIG. 2A, a structure may be employed in which the second wiring 102A surrounds the third wiring 102B (particularly, a U-shape or a C-shape) so that an area through which carriers are transferred is increased and the amount of flowing current (also referred to as on-state current) when the thin film transistor is on is increased.

Note that in this specification, on-state current refers to current which flows between a source and a drain when a thin film transistor is on (conducting). In the case of an n-channel thin film transistor, on-state current refers to current which flows between a source and a drain when gate-source voltage is higher than the threshold voltage ($V_{th}$).

One of the scan line driver circuit 123 and the signal line driver circuit 124 which are illustrated in FIG. 7 corresponds to a semiconductor device 29 illustrated in FIG. 1B. Here, a structure where one of the scan line driver circuit 123 and the signal line driver circuit 124 is provided over the first substrate 120 by chip on glass (COG) is described; however, a structure where both the scan line driver circuit 123 and the signal line driver circuit 124 are provided over the first substrate 120 may be employed. Alternatively, a structure where only the pixel portion 122 is provided over the first substrate 120 and the scan line driver circuit 123 or the signal line driver circuit 124 is provided over the wiring board 31 may be employed.

Alternatively, one or both of the scan line driver circuit 123 and the signal line driver circuit 124 may be provided in the element layer 13. In this case, one or both of the scan line driver circuit 123 and the signal line driver circuit 124 can be formed using a thin film transistor formed in a manner similar to that of the thin film transistor connected to the pixel electrode.

The second substrate 15 illustrated in FIG. 1B serves as a substrate used for sealing the display medium 21. The second substrate 15 side is a viewing side; thus, a light-transmitting substrate is preferably used as the second substrate 15. Examples of the light-transmitting substrate include a glass substrate and a plastic film formed using polyethylene terephthalate, polyimide, an acrylic resin, polycarbonate, polypropylene, polyester, polyvinyl chloride, or the like, for example.

The second electrode 17 is formed over the second substrate 15. The second electrode 17 is formed using a light-transmitting conductive film. Typical examples of light-transmitting conductive films include indium tin oxide, indium oxide containing tungsten oxide, indium zinc oxide containing tungsten oxide, indium oxide containing titanium oxide, indium tin oxide containing titanium oxide, indium zinc oxide, and indium tin oxide to which silicon oxide is added.

The second electrode 17 corresponds to a common electrode (a counter electrode) and is electrically connected to a common potential line formed over the first substrate 11.

The display medium 21 can display images by an electrophoretic method, a particle movement method, a particle rotation method, a liquid crystal display method, an electrolytic precipitation method, an electrochromic method, a film transfer method, or the like. In this embodiment, an electrophoretic method, a particle movement method, and a particle rotation method are described in detail; however, a liquid crystal display method, an electrolytic precipitation method, an electrochromic method, a film transfer method, or the like can be used as appropriate.

Typical examples of electrophoretic methods include a microcapsule electrophoretic method, a horizontal transfer electrophoretic method, a vertical transfer electrophoretic method, and the like. Examples of the particle rotation method include a spherical twisting ball method, a magnetic twisting ball method, a cylinder twisting ball method, and the like. Examples of the particle movement method include a method in which a charged toner is used (such a method is also referred to as a charged toner display method), a method in which an electronic liquid powder is used, a method in which a magnetophoretic particle is used (such a method is also referred to as a magnetophoretic particle method), and the like. FIGS. 8A to 8C illustrate the structures of display elements in the display panel. Note that the adhesive 19 illustrated in FIG. 1B is not illustrated in FIGS. 8A to 8C.

FIG. 8A is a cross-sectional view of the display medium 21 using an electrophoretic method and the periphery thereof. A space between a first electrode 41 (which corresponds to the pixel electrode 105 in FIG. 2B) and the second electrode 17 is filled with a filler 51 such as an organic resin, and a microcapsule 53 is provided as the display medium 21. In the microcapsule 53, black particles 55 which are negatively charged and white particles 57 which are positively charged are dispersed in a transparent disperse medium 59. The diameter of the microcapsule 53 is about 10 to 200 μm. The microcapsule 53 is formed using a light-transmitting organic resin or the like.

In the microcapsule 53 provided between the first electrode 41 and the second electrode 17, the black particles 55 which are first particles and the white particles 57 which are second particles move in opposite directions when voltage is applied by the first electrode 41 and the second electrode 17, so that white or black can be displayed in a pixel. A display element using this principle is an electrophoretic display element.

The first particle and the second particle included in the microcapsule 53 may be formed using a single material selected from a conductive material, an insulating material, a semiconductor material, a magnetic material, a liquid crystal material, a ferroelectric material, an electrochromic material, or a magnetophoretic material or formed using a composite material of any of these materials.

Note that the colors of the first particle and the second particle are not limited to black and white, and any color may be used for the first particle and the second particle as long as the colors of the first particle and the second particle are different from each other (the colors include achromatic color). Therefore, color display is possible when one or both of the first particle and the second particle are particles having pigment.

FIG. 8B is a cross-sectional view of the display medium 21 using a particle movement method and the periphery thereof. A space 63 surrounded by the first electrode 41 (which corresponds to the pixel electrode 105 in FIG. 2B), the second electrode 17, and a rib 61 is filled with black electronic liquid powders 65 which are negatively charged and white electronic liquid powders 67 which are positively charged. Note that the space 63 is filled with a gas such as air, nitrogen, or a rare gas. The diameter of each of the black electronic liquid powder 65 and the white electronic liquid powder 67 is about 0.1 to 20 μm.

The black electronic liquid powders 65 and the white electronic liquid powders 67 move in opposite directions when voltage is applied by the first electrode 41 and the second electrode 17, so that white or black can be displayed in a pixel. Color display is possible when color powders such as a red liquid powder, a yellow liquid powder, and a blue liquid powder are used as the liquid powders.

FIG. 8C is a cross-sectional view of the display medium 21 using a particle rotation method and the periphery thereof. In the particle rotation method, spherical particles which are painted in black and white are provided between the first electrode 41 (which corresponds to the pixel electrode 105 in FIG. 2B) and the second electrode 17. The particle rotation method is a method by which images are displayed by control of the directions of the spherical particles with a potential difference between the first electrode 41 and the second electrode 17. Here, as a typical example of the particle rotation method, an example where a spherical twisting ball is used is described.

The spherical twisting ball is filled with a filler 71 such an organic resin. The spherical twisting ball includes a microcapsule 73, a ball which is provided in the microcapsule 73 and includes a black region 75 and a white region 77, and a liquid 79 which fills a space between the ball and the microcapsule 73. The diameter of the spherical twisting ball is about 50 to 100 μm.

A display element capable of displaying images by an electrophoretic method, a particle movement method, a particle rotation method, a liquid crystal display method, an electrolytic precipitation method, an electrochromic method, a film transfer method, or the like has high reflectance; thus, an auxiliary light source is not needed and power consumption is low. In addition, in a state where voltage is not applied, electrophoresis, particle movement, or particle rotation does not occur. Therefore, it is possible to hold an image which has already been displayed once.

In this embodiment, the adhesive 19 is provided between the display medium 21 and the element layer 13 (see FIG. 1B). The adhesive 19 is provided in order to firmly fix the second substrate 15 including the display medium 21 onto the element layer 13. Note that in the case where the display medium 21 is formed directly on the element layer 13, the adhesive 19 is not needed. Further, in the case where the second substrate 15 protects the display medium 21 and has a function of reducing reflection of light or background reflection, the third substrate 27 is not necessarily provided.

The third substrate 27 has functions of preventing glare and reflection of light, protecting the display medium 21, absorbing ultraviolet rays, and the like. In order to prevent glare and scatter outside light, the surface of the third substrate 27 is uneven. In addition, the third substrate 27 is preferably formed using a plurality of layers, and reflected light can be attenuated with the use of interference of the reflected light at an interface between the layers. Further, when the third substrate 27 is formed using an organic resin having high hardness, scratches can be reduced. When the third substrate 27 is formed using a material which absorbs ultraviolet rays, degradation of the particles in the microcapsule due to the ultraviolet rays can be suppressed. A known material having the above functions can be used for the third substrate 27 as appropriate. Here, the second substrate 15 and the third substrate 27 are bonded to each other with the adhesive 25.

The sealant 23 seals the first substrate 11 and the third substrate 27. As the sealant 23, a visible light curable resin, an ultraviolet curable resin, or a thermosetting resin can be used. Typically, a visible light curable acryl-based resin, an ultraviolet curable acryl-based resin, a thermosetting acryl-based resin, a methacrylic resin, an epoxy resin, or the like can be used.

Here, the display method of the display panel in this embodiment is described with reference to FIGS. 10A to 10D.

First, as a comparison example, the display method of a conventional e-book reader is described with reference to FIGS. 9A to 9D.

FIG. 9A is a timing chart of pixels in first to n-th rows. In an image rewriting period 131, a writing period 133 in the pixels in the first to n-th rows is indicated by a diagonal line. In the image rewriting period 131, a non-writing period 135 is provided between the one writing periods 133. In electronic paper, data of images is written to the pixels in the first to n-th rows more than once.

FIG. 9B illustrates the potential of a gate signal input to a gate line in an i-th row. The potential of the gate signal is $V_{High}$ in the writing period 133, and the potential of the gate signal is $V_{Low}$ in the non-writing period 135.

FIG. 9C illustrates the potential of a video signal input to a source line in a given column. The potential of the video signal is a given potential corresponding to an image.

FIG. 9D illustrates the potential of a pixel electrode in a pixel in the i-th row. In the writing period 133, the potential of the pixel electrode is similar to the potential of the video signal. Here, the potential of the pixel electrode in each writing period 133 is the same potential; however, the potential of the pixel electrode is a given potential corresponding to a written video signal. Further, in the last writing period 137 in the image rewriting period 131, by application of a potential $V_{com}$ which is the same as the potential of the common electrode to the pixel electrode, voltage applied to the display medium is set to 0 V and electrophoresis, particle movement, or particle rotation of the display medium is stopped, so that the image is held.

Since the amount of leakage current of a conventional thin film transistor is large, the potential of the pixel electrode is not held in the non-writing period 135 and fluctuates. Therefore, it is necessary to shorten the length of a period T1 from when data of an image is written until when data of the next image is written. Accordingly, the number of scanning of pixels is increased and the drive frequency (clock frequency) of the scan line driver circuit is increased; thus, power consumption is increased.

Next, the display method of the display panel illustrated in this embodiment is described with reference to FIGS. 10A to 10D. FIG. 10A is a timing chart of pixels in first to n-th rows. In an image rewriting period 141, a writing period 143 in the pixels in the first to n-th rows is indicated by a diagonal line. In the image rewriting period 141, a non-writing period 145 is provided between the writing periods 143.

FIG. 10B illustrates the potential of a gate signal input to a gate line in an i-th row. FIG. 10C illustrates the potential of a video signal input to a source line in a given column. FIG. 10D illustrates the potential of a pixel electrode in a pixel in the i-th row. Further, in the last writing period 147 in the image rewriting period 141, the potential $V_{com}$ which is the same as the potential of the common electrode is applied to the pixel electrode.

In the display panel in this embodiment, a thin film transistor which is connected to the pixel electrode includes a highly purified oxide semiconductor whose concentration of hydrogen is lowered. The thin film transistor has a channel width W of several tens to several hundred micrometers and an off-state current of $1\times10^{-16}$ A or less, which is extremely low. Therefore, as illustrated in FIG. 10D, fluctuation in the potential of the pixel electrode in the non-writing period 145 is small. On the other hand, a thin film transistor including low-temperature polysilicon is designed on the assumption that off-state current is $1\times10^{-12}$ A. Therefore, in the case where the thin film transistor including an oxide semiconductor is compared with the thin film transistor including low-temperature polysilicon, the time for holding voltage of the thin film transistor including an oxide semiconductor can be extended 10000 times when storage capacitance is the same or substantially the same (about 0.1 pF). That is, it is possible to extend the length of a period T2 from when writing of data of an image is started until when wiring of data of the next image is started. Thus, the number of scanning of pixels can be reduced and the drive frequency of the scan line driver circuit can be lowered. Therefore, power consumption can be reduced.

In the thin film transistor including a highly purified oxide semiconductor whose concentration of hydrogen is lowered in this embodiment, off-state current can be reduced, so that the plane area of a capacitor formed in each pixel can be made small. In a display panel capable of holding images which have already been displayed once, such as an electrophoretic display panel, a particle movement display panel, a particle rotation display panel, a liquid crystal display panel, an electrolytic precipitation display panel, an electrochromic display panel, or a film transfer display panel, drive voltage is high (about several tens of volts). When a conventional thin film transistor is used, leakage current is increased, so that the potential applied to the pixel electrode is likely to fluctuate. Therefore, it is necessary to increase the storage capacitance, that is, to increase the plane area of the capacitor. Thus, the plane area of the capacitor in the pixel is large, so that it is difficult to decrease the area of the pixel. In contrast, when off-state current of the thin film transistor is small, fluctuation in voltage applied to the pixel electrode is small, so that it is possible to decrease the plane area of the capacitor. Accordingly, when a thin film transistor including a highly purified oxide semiconductor whose concentration of hydrogen is lowered is used as described in this embodiment, the areas of the capacitor and the pixel electrode can be made small, and the resolution of the display panel can be increased.

When the off-state current of the thin film transistor is low, fluctuation in the potential applied to the pixel electrode is small. Thus, the voltage of the pixel electrode and the common electrode is held constant. In other words, voltage applied to the display medium provided between the pixel electrode and the common electrode can be held constant. Therefore, transfer of charged particles can be suppressed, so that the gray level of each pixel can be held. That is, images can be displayed on the display panel for a long time.

The wiring board 31 illustrated in FIG. 1B is provided with the semiconductor device 35. As the semiconductor device 35, a controller for controlling data displayed on the display panel, typically, a CPU, a storage portion, a power supply circuit, or the like can be used.

The element layer 13 and the wiring board 31 are connected to each other with the FPC 33. A signal from the semiconductor device 35 is transmitted to the element layer 13 through the FPC 33, so that an image is displayed on the display panel 10.

The power supply device 37 is connected to the semiconductor device 35 with the wiring board 31. The controller is driven with power supplied from the power supply device 37, and an image is displayed on the display panel 10.

As the power supply device 37, a primary battery, a secondary battery having a function of storing electric charge, a capacitor, or the like can be used. Typical examples of primary batteries include a manganese battery, an alkaline manganese battery, a nickel battery, a lithium battery, and the like. Typical examples of secondary batteries include a lithium ion battery, a nickel hydrogen storage battery, a lithium ion polymer battery, and the like. Typical examples of capacitors include a double-layer capacitor, a lithium ion capacitor, and the like.

Here, the structure of the power supply device 37 is described with reference to FIGS. 11A and 11B. In addition, in this embodiment, the case where a secondary battery having a function of storing electric charge and a capacitor are used as the power supply device 37 is described.

Figure 11A:
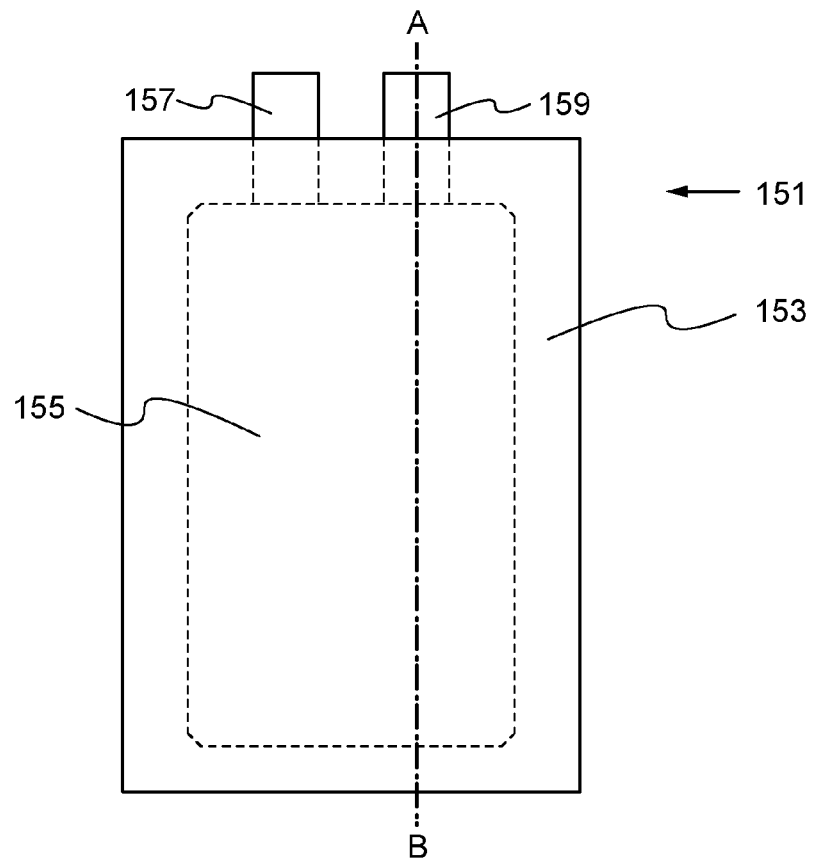
FIGS. 11A and 11B are a top view and a cross-sectional view of a storage device.
Figure 11B:
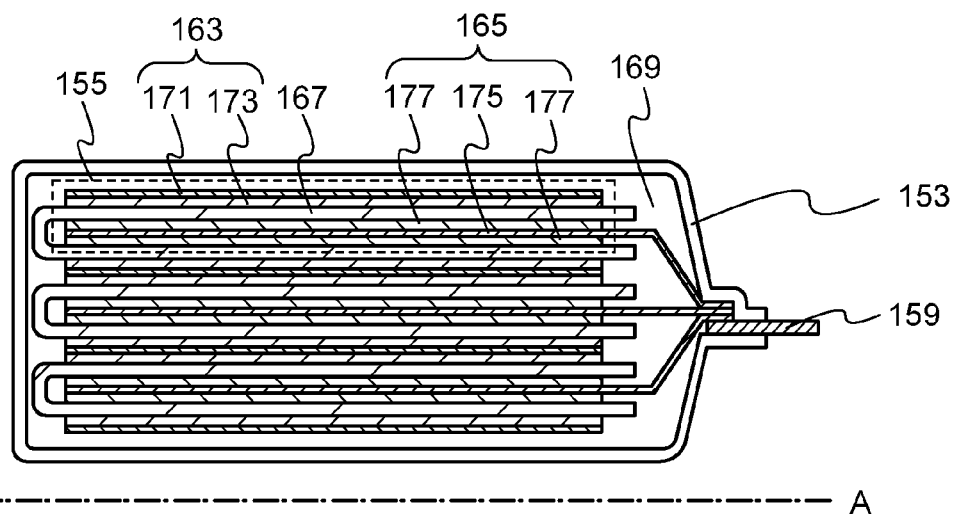

FIG. 11A is a plan view of the power supply device 37, and FIG. 11B is a cross-sectional view taken along dashed line A-B in FIG. 11A.

The power supply device 37 illustrated in FIG. 11A includes a storage cell 155 inside an exterior material 153. The power supply device 37 further includes terminal portions 157 and 159 which are connected to the storage cell 155. For the exterior material 153, a laminate film, a polymer film, a metal film, a metal case, a plastic case, or the like can be used.

As illustrated in FIG. 11B, the storage cell 155 includes a negative electrode 163, a positive electrode 165, a separator 167 provided between the negative electrode and the positive electrode, and an electrolyte 169 in the exterior material 153 and the separator 167. The negative electrode 163 includes a negative electrode collector 171 and a negative electrode active material 173. The positive electrode 165 includes a positive electrode collector 175 and a positive electrode active material 177. The negative electrode active material 173 is formed over one surface or two facing surfaces of the negative electrode collector 171. The positive electrode active material 177 is formed over one surface or two facing surfaces of the positive electrode collector 175.

The negative electrode collector 171 is connected to the terminal portion 159. The positive electrode collector 175 is connected to the terminal portion 157. Further, the terminal portions 157 and 159 each partly extend outside the exterior material 153.

Note that although a pouched thin storage device is described as the power supply device 37 (see FIG. 1B) in this embodiment, a storage device with a variety of structures, such as a cylindrical storage device, a square storage device, a button-type storage device, can be used. Further, although the structure where the positive electrode, the negative electrode, and the separator are stacked is described in this embodiment, a structure where the positive electrode, the negative electrode, and the separator are rolled may be employed.

Among secondary batteries that are one embodiment of the storage cell 155, a lithium ion battery formed using a metal oxide containing lithium, such as $LiCoO_2$, has high capacitance and high safety. Here, the structure of a lithium ion battery that is a typical example of a secondary battery is described with reference to FIG. 11B.

Stainless steel, copper, nickel, or the like is used for the negative electrode collector 171. The negative electrode collector 171 can have a foil shape, a plate shape, a net shape, or the like as appropriate.

The negative electrode active material 173 is formed using a material capable of reversibly occluding lithium ions, a conductive material, and a binder. Typical examples of materials capable of reversibly occluding lithium ions include graphite, non-graphitizable carbon, a polyacenic semiconductor (PAS), and the like, and the material preferably occludes phosphorus. In addition, PAS is preferable because capacitance is high. Further, typical examples of binders include fluoride resins such as polytetrafluoroethylene and polyvinylidene fluoride, thermoplastic resins such as polypropylene and polyethylene, and the like. Furthermore, typical examples of conductive materials include acetylene black, graphite, metal powder, and the like.

Aluminum, stainless steel, or the like is used for the positive electrode collector 175. The electrode collector 175 can have a foil shape, a plate shape, a net shape, or the like as appropriate.

As the positive electrode active material 177, $LiFeO_2$, $LiCoO_2$, $LiNiO_2$, $LiMn_2O_4$, $LiFePO_4$, $LiCoPO_4$, $LiNiPO_4$, $LiMn_2PO_4$, $V_2O_5$, $Cr_2O_5$, $MnO_2$, or other materials can be used.

As the solute of the electrolyte 169, a material which can transfer lithium ions and in which lithium ions stably exist is used. Typical examples of the solute of the electrolyte include lithium salt such as $LiClO_4$, $LiAsF_6$, $LiBF_4$, $LiPF_6$, and $Li(C_2F_5SO_2)_2N$.

As the solvent of the electrolyte 169, a material which can transfer lithium ions is used. As the solvent of the electrolyte 169, an aprotic organic solvent is preferably used. Typical examples of aprotic organic solvents include ethylene carbonate, propylene carbonate, dimethyl carbonate, diethyl carbonate, γ-butyrolactone, acetonitrile, dimethoxyethane, tetrahydrofuran, and the like, and one or more of these materials can be used. When a gelled polymer is used as the solvent of the electrolyte 169, safety against liquid leakage or the like is increased. Typical examples of gelled polymers include a silicon gel, an acrylic gel, an acrylonitrile gel, polyethylene oxide, polypropylene oxide, a fluorine-based polymer, and the like. As the electrolyte 169, a solid electrolyte such as $Li_3PO_4$ can be used.

An insulating porous material is used for the separator 167. Typical examples of the separator 167 include paper, a nonwoven fabric, a glass fiber, a synthetic resin material, and a ceramic material. Note that a material which does not dissolve in the electrolyte should be selected.

The lithium ion battery has a small so-called memory effect, high energy density, high capacitance, and high drive voltage. Thus, the size and weight of the lithium ion battery can be reduced. Further, the lithium ion battery do not easily degrade due to repetitive charge and discharge and can be used for a long time, so that cost can be reduced.

Next, among capacitors that are another embodiment of the storage cell 155, a lithium ion capacitor has high energy density and excellent charge and discharge properties. Here, the structure of a lithium ion capacitor that is a typical example of a capacitor is described with reference to FIG. 11B.

As the negative electrode collector 171, the negative electrode active material 173, and the positive electrode collector 175, materials which are similar to those of the lithium ion battery can be used.

As the positive electrode active material 177, a material capable of reversibly occluding lithium ions and/or anions is preferably used. Typical examples of the positive electrode active material 177 include active carbon, a conductive polymer, and a polyacenic semiconductor (PAS).

As the solute of the electrolyte 169, the solvent of the electrolyte 169, and the separator 167, materials which are similar to those of the lithium ion battery can be used.

The lithium ion capacitor has high efficiency of charge and discharge, capability of rapidly performing charge and discharge, and a long life even when it is repeatedly used. The display panel has high writing voltage and do not need power after writing of data; thus, it is preferable to use a lithium ion capacitor capable of rapidly performing charge and discharge.

In this manner, display on a display panel of the e-book reader in this embodiment is controlled by a thin film transistor including a highly purified oxide semiconductor whose concentration of hydrogen is low, so that the number of scanning of pixels can be reduced and the drive frequency of a scan line driver circuit can be lowered. Thus, the power consumption of the e-book reader can be reduced and images can be held for a long time. Further, the off-state current of the thin film transistor including a highly purified oxide semiconductor whose concentration of hydrogen is low is decreased to $1\times10^{-13}$ A or less, a capacitor for holding signal voltage applied to the pixel can be made small, so that the area of the capacitor and the area of the pixel can be made small. Therefore, the resolution of the e-book reader can be increased.

Embodiment 2

In this embodiment, one embodiment of a thin film transistor applicable to the display panel in Embodiment 1 is described. A thin film transistor 410 illustrated in this embodiment can be used as the thin film transistor 106 in Embodiment 1 (see FIGS. 2A and 2B).

One embodiment of the thin film transistor in this embodiment and a method for manufacturing the thin film transistor is described with reference to FIGS. 12A and 12B and FIGS. 13A to 13E.

Figure 12A:
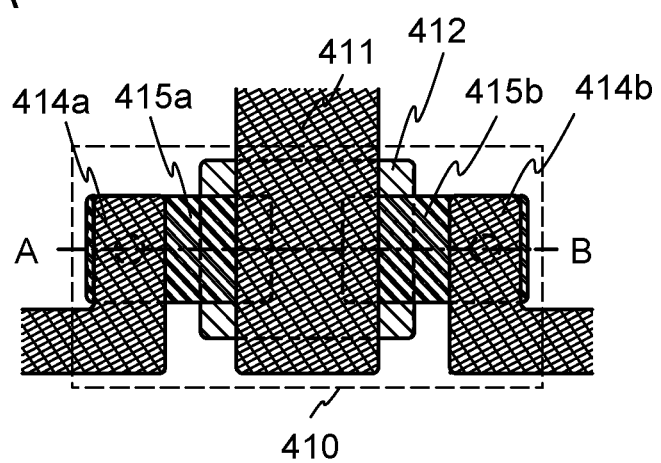
FIGS. 12A and 12B illustrate a thin film transistor.
Figure 12B:
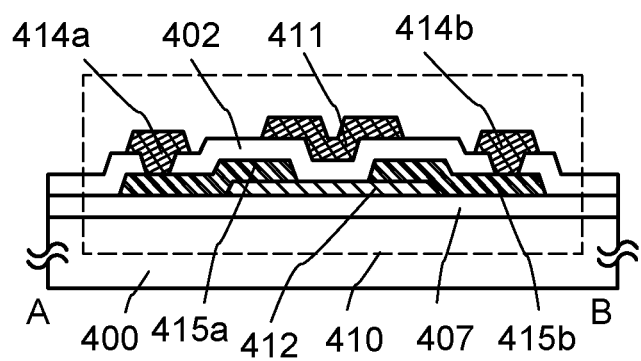

FIGS. 12A and 12B illustrate one embodiment of a planar structure and a cross-sectional structure of the thin film transistor. The thin film transistor 410 illustrated in FIGS. 12A and 12B is a kind of top-gate thin film transistor.

FIG. 12A is a plan view of the top-gate thin film transistor 410. FIG. 12B is a cross-sectional view taken along dashed line A-B in FIG. 12A.

In FIGS. 12A and 12B, over a first substrate 400, the thin film transistor 410 includes an insulating film 407, an oxide semiconductor film 412, one of a source electrode and a drain electrode 415a, the other of the source electrode and the drain electrode 415b, a gate insulating film 402, and a gate electrode 411. One of the source electrode and the drain electrode 415a and the other of the source electrode and the drain electrode 415b are provided in contact with and electrically connected to a wiring 414a and a wiring 414b, respectively.

Although the thin film transistor 410 is described as a single-gate thin film transistor, a multi-gate thin film transistor including a plurality of channel formation regions can be formed when needed.

Steps of forming the thin film transistor 410 over the first substrate 400 are described below with reference to FIGS. 13A to 13E.

First, the insulating film 407 serving as a base film is formed over the first substrate 400. As the insulating film 407 which is in contact with the oxide semiconductor film, an oxide insulating film such as a silicon oxide film, a silicon oxynitride film, an aluminum oxide film, or an aluminum oxynitride film is preferably used. As a method for forming the insulating film 407, plasma-enhanced CVD, sputtering, or the like can be used. In order that a large amount of hydrogen be not contained in the insulating film 407, the insulating film 407 is preferably formed by sputtering.

In this embodiment, as the insulating film 407, a silicon oxide film is formed by sputtering. The silicon oxide film is deposited over the first substrate 400 as the insulating film 407 in such a manner that the first substrate 400 is transferred to a treatment chamber, a sputtering gas containing high-purity oxygen from which hydrogen and moisture are removed is introduced, and a silicon target is used. In addition, the first substrate 400 may be at room temperature or may be heated.

For example, the silicon oxide film is deposited by RF sputtering under the following condition: quartz (preferably synthetic quartz) is used; the temperature of the substrate is 108° C.; the distance between the substrate and a target (the T-S distance) is 60 mm; the pressure is 0.4 Pa; the high-frequency power is 1.5 kW; the atmosphere contains oxygen and argon (an oxygen flow rate of 25 sccm:an argon flow rate of 25 sccm=1:1); and the thickness is 100 nm Instead of quartz (preferably synthetic quartz), a silicon target can be used as a target for depositing the silicon oxide film. Note that oxygen or a mixed gas of oxygen and argon is used as a sputtering gas.

In this case, it is preferable to form the insulating film 407 while moisture remaining in the treatment chamber is removed in order that hydrogen, a hydroxyl group, or moisture be not contained in the insulating film 407.

In order to remove moisture remaining in the treatment chamber, an adsorption vacuum pump is preferably used. For example, a cryopump, an ion pump, or a titanium sublimation pump is preferably used. As an exhaust means, a turbo pump to which a cold trap is added may be used. For example, a hydrogen atom, a compound containing a hydrogen atom, such as water ($H_2O$), (preferably a compound containing a carbon atom), and the like are exhausted from the treatment chamber with the use of a cryopump. Therefore, the concentration of an impurity contained in the insulating film 407 which is deposited in the treatment chamber can be lowered.

As a sputtering gas used for deposition of the insulating film 407, a high-purity gas from which an impurity such as hydrogen, water, a hydroxyl group, or hydride is removed to about a concentration of ppm or ppb is preferably used.

Examples of sputtering include RF sputtering in which a high-frequency power source is used for a sputtering power source, DC sputtering in which a DC power source is used, and pulsed DC sputtering in which a bias is applied in a pulsed manner. RF sputtering is mainly used in the case where an insulating film is deposited, and DC sputtering is mainly used in the case where a metal film is deposited.

In addition, there is also a multi-source sputtering apparatus in which a plurality of targets of different materials can be set. With the multi-source sputtering apparatus, films of different materials can be deposited to be stacked in the same chamber, or a film of plural kinds of materials can be deposited by electric discharge at the same time in the same chamber.

In addition, there are a sputtering apparatus provided with a magnet system inside the chamber and used for magnetron sputtering, and a sputtering apparatus used for ECR sputtering in which plasma generated with the use of microwaves is used without using glow discharge.

Further, as a deposition method using sputtering, reactive sputtering in which a target substance and a sputtering gas component are chemically reacted with each other during deposition to form a thin compound film thereof, or bias sputtering in which voltage is also applied to a substrate during deposition can be used.

Furthermore, the insulating film 407 may have a layered structure. For example, the insulating film 407 may have a layered structure in which a nitride insulating film such as a silicon nitride film, silicon nitride oxide film, an aluminum nitride film, or an aluminum nitride oxide film and the above oxide insulating film are stacked in that order from the first substrate 400 side.

For example, a silicon nitride film is deposited in such a manner that a sputtering gas containing high-purity nitrogen from which hydrogen and moisture are removed is introduced between the silicon oxide film and the substrate and a silicon target is used. Also in this case, as in the case of the silicon oxide film, it is preferable to deposit a silicon nitride film while moisture remaining in the treatment chamber is removed.

Also in the case where a silicon nitride film is deposited, the substrate may be heated in deposition.

In the case where a silicon nitride film and a silicon oxide film are stacked as the insulating film 407, the silicon nitride film and the silicon oxide film can be deposited in the same treatment chamber with the use of a common silicon target.

First, the silicon nitride film is deposited in such a manner that a sputtering gas containing nitrogen is introduced and a silicon target mounted on the treatment chamber is used. Then, the silicon oxide film is deposited in such a manner that the gas is changed to a sputtering gas containing oxygen and the same silicon target is used. The silicon nitride film and the silicon oxide film can be deposited successively without exposure to the air; thus, adsorption of an impurity such as hydrogen or moisture on a surface of the silicon nitride film can be prevented.

Then, an oxide semiconductor film with a thickness of 2 to 200 nm is formed over the insulating film 407.

In order that hydrogen, a hydroxyl group, and moisture be contained in the oxide semiconductor film as little as possible, it is preferable that an impurity such as hydrogen or moisture that is adsorbed on the first substrate 400 be eliminated and exhausted by preheating of the first substrate 400 over which the insulating film 407 is formed in a preheating chamber of a sputtering apparatus, as pretreatment for deposition. As an exhaustion means provided in the preheating chamber, a cryopump is preferable. Note that the preheating treatment can be omitted. In addition, the preheating may be performed on the first substrate 400 before the deposition of the gate insulating film 402 to be formed later, or may be performed on the first substrate 400 over which the films up to one of the source electrode and the drain electrode 415a to be formed later and the other of the source electrode and the drain electrode 415b to be formed later are formed in a similar manner.

Note that before the oxide semiconductor film is formed by sputtering, dust on a surface of the gate insulating film 402 is preferably removed by reverse sputtering in which an argon gas is introduced and plasma is generated. The reverse sputtering refers to a method in which, without application of voltage to a target side, a high-frequency power source is used for application of voltage to a substrate side in an argon atmosphere and plasma is generated in the vicinity of the substrate so that a substrate surface is modified. Note that nitrogen, helium, oxygen, or the like may be used instead of the argon atmosphere.

The oxide semiconductor film is deposited by sputtering. As the oxide semiconductor film, an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film is used. In this embodiment, the oxide semiconductor film is deposited by sputtering with the use of an In—Ga—Zn—O-based oxide semiconductor target. Alternatively, the oxide semiconductor film can be deposited by sputtering in a rare gas (typically argon) atmosphere, an oxygen atmosphere, or an atmosphere including a rare gas (typically argon) and oxygen. In addition, in the case where sputtering is used, deposition may be performed using a target containing $SiO_2$ at 2 to 10 wt %.

As a sputtering gas used for deposition of the oxide semiconductor film, a high-purity gas from which an impurity such as hydrogen, water, a hydroxyl group, or hydride is removed to about a concentration of ppm or ppb is preferably used.

As a target used for forming the oxide semiconductor film by sputtering, a metal oxide target containing zinc oxide as a main component can be used. As another example of a metal oxide target, an oxide semiconductor target containing In, Ga, and Zn (in a composition ratio, $In_2O_3:Ga_2O_3:ZnO=1:1:1$ in a molar ratio, In:Ga:Zn=1:1:0.5 in a molar ratio) can be used. In addition, as the oxide semiconductor target containing In, Ga, and Zn, a target having a composition ratio of In:Ga:Zn=1:1:1 in a molar ratio or In:Ga:Zn=1:1:2 in a molar ratio can be used. The filling rate of the oxide semiconductor target is 90 to 100%, preferably 95 to 99.9%. With the use of the oxide semiconductor target with a high filling rate, the deposited oxide semiconductor film has high density.

The oxide semiconductor film is formed over the first substrate 400 in such a manner that the substrate is held in a treatment chamber kept in a reduced pressure state, moisture remaining in the treatment chamber is removed, a sputtering gas from which hydrogen and moisture are removed is introduced, and a metal oxide is used as a target. In order to remove moisture remaining in the treatment chamber, an adsorption vacuum pump is preferably used. For example, a cryopump, an ion pump, or a titanium sublimation pump is preferably used. As an exhaust means, a turbo pump to which a cold trap is added may be used. For example, a hydrogen atom, a compound containing a hydrogen atom, such as water ($H_2O$), (preferably a compound containing a carbon atom), and the like are exhausted from the treatment chamber with the use of a cryopump. Therefore, the concentration of an impurity contained in the oxide semiconductor film which is deposited in the treatment chamber can be lowered. Further, the substrate may be heated when the oxide semiconductor film is deposited.

As an example of the deposition condition, the following condition is employed: the substrate temperature is room temperature, the distance between the substrate and the target is 110 mm, the pressure is 0.4 Pa, the direct current (DC) power is 0.5 kW, and an atmosphere containing oxygen and argon (the flow rate of oxygen is 15 sccm and the flow rate of argon is 30 sccm) is used. Note that it is preferable that pulsed direct-current (DC) power be used because powdered substances (also referred to as particles or dust) generated in deposition can be reduced and the film thickness can be uniform. The thickness of the oxide semiconductor film is preferably 5 to 30 nm. Note that the appropriate thickness of the oxide semiconductor film differs depending on an oxide semiconductor material, and the thickness may be set as appropriate depending on the material.

Figure 13A:
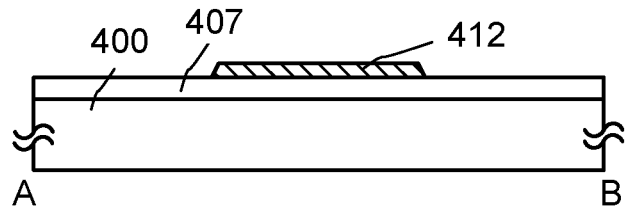
FIGS. 13A to 13E illustrate a method for manufacturing a thin film transistor.

Then, the oxide semiconductor film is etched using a resist mask formed in a first photolithography process, so that an island-shaped oxide semiconductor film 412 is formed (see FIG. 13A). A resist mask used for formation of the island-shaped oxide semiconductor film 412 may be formed by an inkjet method. When the resist mask is formed by an inkjet method, a photomask is not used; thus, manufacturing cost can be reduced.

Note that as the etching of the oxide semiconductor film, dry etching, wet etching, or both of them may be employed.

As an etching gas used for dry etching, a gas containing chlorine (a chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching, parallel plate RIE (reactive ion etching) or ICP (inductively coupled plasma) etching can be used. In order to etch the film to have a desired shape, the etching conditions (the amount of electric power applied to a coil-shaped electrode, the amount of electric power applied to an electrode on a substrate side, the temperature of the electrode on the substrate side, and the like) are adjusted as appropriate.

As an etchant used for wet etching, a solution obtained by mixture of phosphoric acid, acetic acid, and nitric acid, an ammonia hydrogen peroxide mixture (a hydrogen peroxide solution at 31 wt %:ammonia water at 28 wt %=5:2), or the like can be used. Alternatively, ITO07N (produced by KANTO CHEMICAL CO., INC.) may be used.

The etchant used in the wet etching is removed together with the etched material by cleaning. Waste liquid of the etchant including the removed material may be purified and the material contained in the waste liquid may be reused. When a material such as indium contained in the oxide semiconductor film is collected from the waste liquid after the etching and reused, the resources can be efficiently used and cost can be reduced.

In order to form the oxide semiconductor film 412 with a desired shape, the etching conditions (an etchant, etching time, temperature, and the like) are adjusted as appropriate depending on the material.

In this embodiment, the oxide semiconductor film is processed into the island-shaped oxide semiconductor film 412 by wet etching with the use of a solution where phosphoric acid, acetic acid, and nitric acid are mixed as an etchant.

In this embodiment, the oxide semiconductor film 412 is subjected to first heat treatment. The temperature of the first heat treatment is 400 to 750° C., preferably higher than or equal to 400° C. and lower than the strain point of the substrate. Here, after the substrate is put in an electric furnace which is a kind of heat treatment apparatus and the oxide semiconductor film is subjected to heat treatment at 450° C. for one hour in a nitrogen atmosphere, water or hydrogen is prevented from being mixed into the oxide semiconductor film by preventing the substrate from being exposed to the air; thus, the oxide semiconductor film is obtained. Through the first heat treatment, the oxide semiconductor film 412 can be dehydrated or dehydrogenated.

The heat treatment apparatus is not limited to an electric furnace, and may be provided with a device for heating an object to be processed by thermal conduction or thermal radiation from a heater such as a resistance heater. For example, an RTA (rapid thermal annealing) apparatus such as a GRTA (gas rapid thermal annealing) apparatus, or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with an object to be processed by heat treatment, such as nitrogen or a rare gas such as argon, is used.

For example, as the first heat treatment, GRTA may be performed as follows. The substrate is transferred and put in an inert gas heated at a high temperature of 650 to 700° C., is heated for several minutes, and is transferred and taken out of the inert gas heated at the high temperature. GRTA enables high-temperature heat treatment in a short time.

Note that in the first heat treatment, it is preferable that water, hydrogen, and the like be not contained in nitrogen or a rare gas such as helium, neon, or argon. Further, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

Further, the oxide semiconductor film is crystallized and the crystal structure of the oxide semiconductor film is changed into a microcrystalline structure or a polycrystalline structure depending on the condition of the first heat treatment or the material of the oxide semiconductor film in some cases. For example, the oxide semiconductor film might be crystallized to be a microcrystalline oxide semiconductor film having a degree of crystallinity of 90% or more, or 80% or more. Further, depending on the condition of the first heat treatment or the material of the oxide semiconductor film, the oxide semiconductor layer might become an amorphous oxide semiconductor film containing no crystalline component. The oxide semiconductor film might become an oxide semiconductor film in which a microcrystalline portion (with a grain diameter of 1 to 20 nm, typically 2 to 4 nm) is mixed into an amorphous oxide semiconductor.

In addition, the first heat treatment for the oxide semiconductor film can be performed on the oxide semiconductor film before being processed into the island-shaped oxide semiconductor film. In that case, the substrate is taken out from the heat apparatus after the first heat treatment, and then a photolithography process is performed.

The heat treatment for dehydration or dehydrogenation of the oxide semiconductor film may be performed at any of the following timings: after the oxide semiconductor film is formed; after a source electrode and a drain electrode are formed over the oxide semiconductor film; and after a gate insulating film is formed over the source electrode and the drain electrode.

Next, a conductive film is formed over the insulating film 407 and the oxide semiconductor film 412. The conductive film may be formed by sputtering or vacuum evaporation. As the material of the conductive film, any of the following materials can be used: an element selected from aluminum, chromium, copper, tantalum, titanium, molybdenum, or tungsten; an alloy including any of these elements; an alloy film including the above elements in combination; or the like. Further, one or more materials selected from manganese, magnesium, zirconium, beryllium, or thorium may be used. Furthermore, the metal conductive film may have a single-layer structure or a layered structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in that order, or the like can be used. Alternatively, a film, an alloy film, or a nitride film which contains aluminum (Al) and one or more of elements selected from titanium (Ti), tantalum (Ta), tungsten (W), molybdenum (Mo), chromium (Cr), neodymium (Nd), or scandium (Sc) may be used.

Figure 13B:
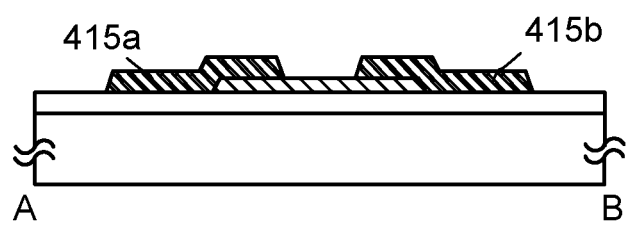

Next, a resist mask is formed over the conductive film in a second photolithography process; the one of the source electrode and the drain electrode 415a and the other of the source electrode and the drain electrode 415b are formed by selective etching; then, the resist mask is removed (see FIG. 13B). Note that when end portions of the formed source electrode and the formed drain electrode are tapered, coverage with a gate insulating film stacked thereover is improved, which is preferable.

In this embodiment, a 150-nm-thick titanium film is formed as the one of the source electrode and the drain electrode 415a and the other of the source electrode and the drain electrode 415b by sputtering.

Note that each material and etching conditions are adjusted as appropriate so that the oxide semiconductor film 412 is not removed in etching of the conductive film and the insulating film 407 formed below the oxide semiconductor film 412 is not exposed.

In this embodiment, a Ti film is used as the conductive film, an In—Ga—Zn—O-based oxide semiconductor is used for the oxide semiconductor film 412, and an ammonia hydrogen peroxide mixture (a mixture of ammonia, water, and a hydrogen peroxide solution) is used as an etchant.

Note that in an etching step performed after the third photolithography process, only part of the oxide semiconductor film 412 is etched so that an oxide semiconductor film having a groove (a depression) is formed in some cases. The resist mask used for forming the one of the source electrode and the drain electrode 415a and the other of the source electrode and the drain electrode 415b may be formed by an inkjet method. When the resist mask is formed by an inkjet method, a photomask is not used; thus, manufacturing cost can be reduced.

An ultraviolet ray, a KrF laser beam, or an ArF laser beam is used for exposure when the resist mask is formed in the second photolithography process. The channel length L of a thin film transistor to be formed later is determined by a pitch between a lower end of the source electrode and a lower end of the drain electrode that are adjacent to each other over the oxide semiconductor film 412. Note that when exposure is performed under a condition that the channel length L is less than 25 nm, the exposure when the resist mask is formed in the second photolithography process is performed using an extreme ultraviolet ray whose wavelength is extremely short (several nanometers to several tens of nanometers). In exposure with an extreme ultraviolet ray, resolution is high and the depth of focus is large. Therefore, the channel length L of the thin film transistor to be formed later can be 10 to 1000 nm, and a circuit can operate at higher speed. Further, since the amount of off-state current is extremely small, power consumption can be reduced.

Figure 13C:
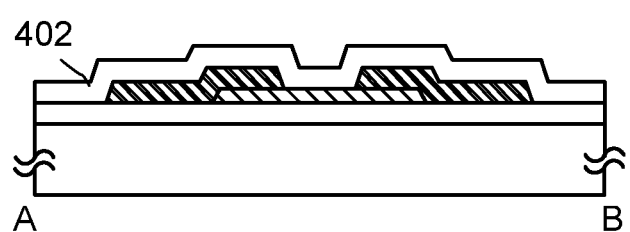

Next, the gate insulating film 402 is formed over the insulating film 407, the oxide semiconductor film 412, the one of the source electrode and the drain electrode 415a, and the other of the source electrode and the drain electrode 415b (see FIG. 13C).

An oxide semiconductor (a highly purified oxide semiconductor) which is made to be intrinsic (i-type) or substantially intrinsic by removal of an impurity is highly sensitive to an interface state and interface charge; thus, an interface between the oxide semiconductor and the gate insulating film 402 is important. Therefore, the gate insulating film 402 which is in contact with the highly purified oxide semiconductor needs high quality.

For example, high-density plasma-enhanced CVD using microwaves (2.45 GHz) is preferable because a dense high-quality insulating film having high withstand voltage can be formed. This is because when the highly purified oxide semiconductor is closely in contact with the high-quality gate insulating film, the interface state can be reduced and interface properties can be favorable.

Needless to say, a different deposition method such as sputtering or plasma-enhanced CVD can be used as long as a high-quality insulating film can be formed as a gate insulating film. In addition, any gate insulating film can be used as long as film quality and properties of an interface with an oxide semiconductor of the gate insulating film are modified by heat treatment performed after deposition. In either case, any gate insulating film can be used as long as film quality as a gate insulating film is high, interface state density with an oxide semiconductor is decreased, and a favorable interface can be formed.

In a bias temperature test (BT test) at 85° C. and 2×10$^6$ V/cm for 12 hours, if an impurity has been added to an oxide semiconductor, the bond between the impurity and the main component of the oxide semiconductor is broken by a high electric field (B: bias) and high temperature (T: temperature), so that a generated dangling bond induces a shift in the threshold voltage ($V_{th}$).

As a countermeasure against this, the impurity in the oxide semiconductor, especially, hydrogen, water, or the like is removed as much as possible so that the properties of an interface with the gate insulating film are favorable as described above. Accordingly, it is possible to obtain a thin film transistor which is stable with respect to the BT test.

The gate insulating film 402 can be formed to have a single layer or a stacked layer of a silicon oxide film, a silicon nitride film, a silicon oxynitride film, a silicon nitride oxide film, or an aluminum oxide film. Note that when the gate insulating film 402 is deposited by sputtering, the concentration of hydrogen in the gate insulating film 402 can be lowered. In the case where a silicon oxide film is deposited by sputtering, a silicon target or a quartz target is used as a target and oxygen or a mixed gas of oxygen and argon is used as a sputtering gas.

The gate insulating film 402 can have a structure where a silicon oxide film and a silicon nitride film are stacked from the one of the source electrode and the drain electrode 415a side and the other of the source electrode and the drain electrode 415b side. For example, a gate insulating film having a total thickness of 55 to 500 nm may be formed in such a manner that a silicon oxide film ($SiO_x$ (x>0)) with a thickness of 5 to 300 nm is formed as a first gate insulating film and a silicon nitride film ($SiN_y$ (y>0)) with a thickness of 50 to 200 nm is stacked over the first gate insulating film as a second gate insulating film by sputtering. In this embodiment, a 100-nm-thick silicon oxide film is formed by RF sputtering under a condition that the pressure is 0.4 Pa, the high-frequency power is 1.5 kW, and an atmosphere containing oxygen and argon (an oxygen flow rate of 25 sccm: an argon flow rate of 25 sccm=1:1) is used.

Figure 13D:
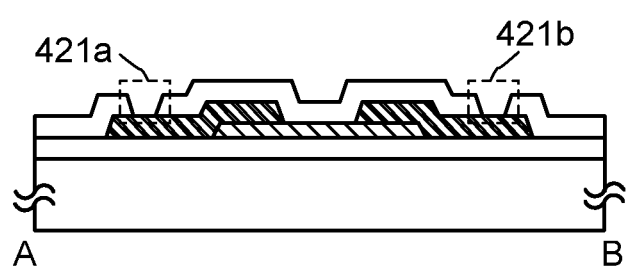

Next, a resist mask is formed in a third photolithography process and part of the gate insulating film 402 is removed by selective etching, so that openings 421a and 421b which reach the one of the source electrode and the drain electrode 415a and the other of the source electrode and the drain electrode 415b are formed (see FIG. 13D).

Then, a conductive film is formed over the gate insulating film 402 and the openings 421a and 421b, and then the gate electrode 411 and the wirings 414a and 414b are formed in a fourth photolithography process. Note that a resist mask may be formed by an inkjet method. When the resist mask is formed by an inkjet method, a photomask is not used; thus, manufacturing cost can be reduced.

The gate electrode 411 and the wirings 414a and 414b can be formed to have a single layer or a stacked layer of a metal material such as molybdenum, titanium, chromium, tantalum, tungsten, aluminum, copper, neodymium, or scandium, or an alloy material which includes any of these materials as a main component.

For example, as a two-layer structure of the gate electrode 411 and the wirings 411a and 411b, the following structures are preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, and a two-layer structure in which a titanium nitride film and a molybdenum film are stacked. As a three-layer structure, a three-layer structure in which a tungsten film or a tungsten nitride film, an alloy of aluminum and silicon or an alloy of aluminum and titanium, and a titanium nitride film or a titanium film are stacked is preferable. Note that the gate electrode can be formed using a light-transmitting conductive film. As an example of a light-transmitting conductive film, a light-transmitting conductive oxide or the like can be given.

In this embodiment, as the gate electrode 411 and the wirings 414a and 414b, a 150-nm-thick titanium film is formed by sputtering.

Next, second heat treatment (preferably at 200 to 400° C., for example, 250 to 350° C.) is performed in an inert gas atmosphere or an oxygen gas atmosphere. In this embodiment, the second heat treatment is performed at 250° C. for one hour in a nitrogen atmosphere. Alternatively, the second heat treatment may be performed after a protective insulating film or a planarization insulating film is formed over the thin film transistor 410.

Furthermore, heat treatment may be performed at 100 to 200° C. for 1 to 30 hours in an air atmosphere.

Figure 13E:
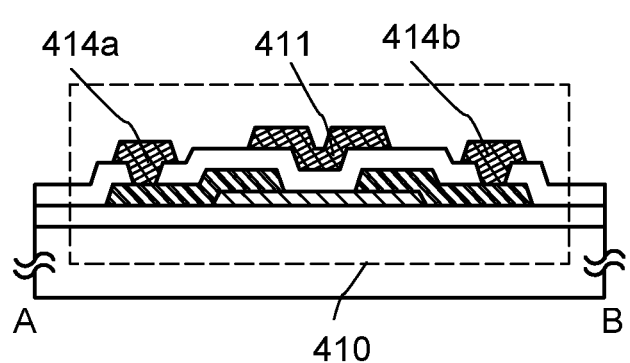

Through the above steps, the thin film transistor 410 including the oxide semiconductor film 412 whose concentration of hydrogen, moisture, hydride, or hydroxide is lowered can be formed (see FIG. 13E).

Next, although not illustrated, the oxide insulating film 114 and the planarization insulating film 115 for planarization that are illustrated in FIGS. 2A and 2B are provided over the thin film transistor 410. For example, the planarization insulating film can be formed using a heat-resistant organic material such as polyimide, acrylic, benzocyclobutene, polyamide, or epoxy. Other than such organic materials, it is possible to use a low-dielectric constant material (a low-k material), a siloxane-based resin, PSG (phosphosilicate glass), BPSG (borophosphosilicate glass), or the like. Note that the planarization insulating film 115 may be formed by stacking a plurality of insulating films formed using these materials.

Note that a siloxane-based resin corresponds to a resin including a Si—O—Si bond formed using a siloxane-based material as a starting material. The siloxane-based resin may include an organic group (e.g., an alkyl group or an aryl group) as a substituent. Further, the organic group may include a fluoro group.

There is no particular limitation on the method for forming the planarization insulating film. The planarization insulating film can be formed, depending on the material, by a method such as sputtering, an SOG method, a spin coating method, a dipping method, a spray coating method, or a droplet discharge method (e.g., an inkjet method, screen printing, or offset printing), or a tool such as a doctor knife, a roll coater, a curtain coater, or a knife coater. Then, an opening which reaches the wiring 414b serving as a source electrode or a drain electrode is formed in the protective insulating film and the planarization insulating film, and a pixel electrode (not illustrated) which is electrically connected to the wiring 414b serving as a source electrode or a drain electrode is formed in the opening.

When remaining moisture in the reaction atmosphere is removed at the time of the deposition of the oxide semiconductor film, the concentration of hydrogen and hydride in the oxide semiconductor film can be lowered and the oxide semiconductor film can be highly purified. Thus, the oxide semiconductor film can be stabilized.

When display on a display panel of an e-book reader is controlled by a thin film transistor having a highly purified oxide semiconductor whose concentration of hydrogen is low as described in this embodiment, the number of scanning of pixels can be reduced and the drive frequency of a scan line driver circuit can be lowered. Thus, the power consumption of the e-book reader can be reduced and images can be held for a long time. Further, the off-state current of the thin film transistor including a highly purified oxide semiconductor whose concentration of hydrogen is low is decreased to $1 \times 10^{-13}$ A or less, a capacitor for holding signal voltage applied to the pixel can be made small, so that the area of the capacitor and the area of the pixel can be made small. Therefore, the resolution of the e-book reader can be increased.

This embodiment can be combined with any of the structures described in the other embodiments as appropriate.

Embodiment 3

In this embodiment, a different embodiment of a thin film transistor applicable to the display panel in Embodiment 1 is described. Note that the same portions as Embodiment 2, portions having functions similar to those in Embodiment 2, and steps similar to those in Embodiment 2 may be formed or performed as in Embodiment 2, and description thereof is not repeated. In addition, detailed description of the same portions is omitted. A thin film transistor 460 illustrated in this embodiment can be used as the thin film transistor 106 in Embodiment 1 (see FIGS. 2A and 2B).

One embodiment of the thin film transistor in this embodiment and a method for manufacturing the thin film transistor is described with reference to FIGS. 14A and 14B and FIGS. 15A to 15E.

Figure 14A:
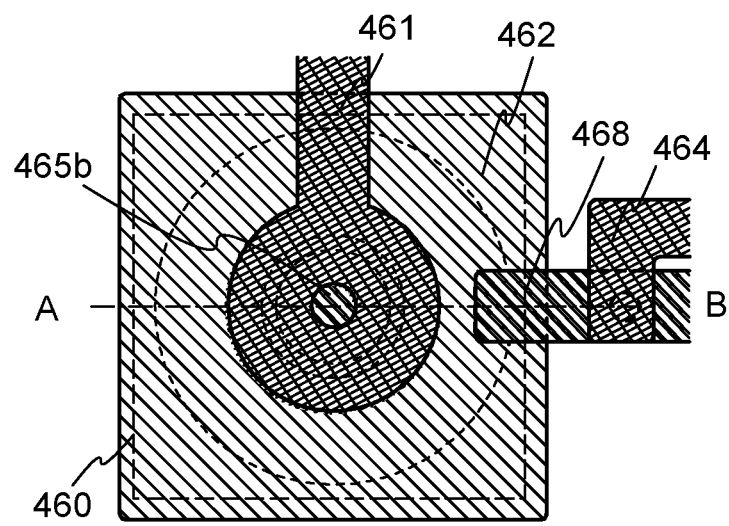
FIGS. 14A and 14B illustrates a thin film transistor.
Figure 14B:
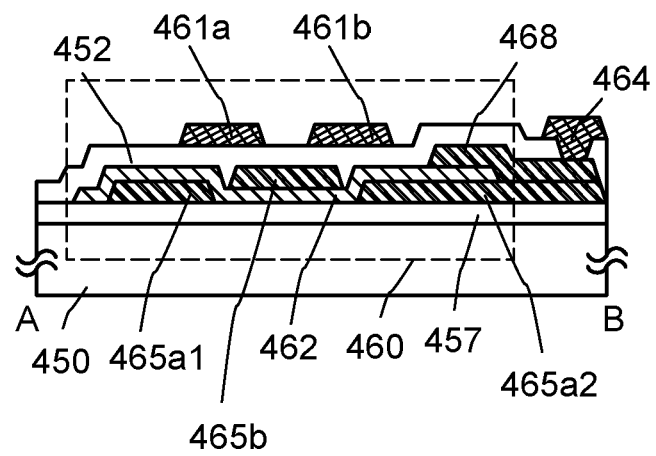

FIGS. 14A and 14B illustrate one embodiment of a planar structure and a cross-sectional structure of the thin film transistor. The thin film transistor 460 illustrated in FIGS. 14A and 14B is a kind of top-gate thin film transistor.

FIG. 14A is a plan view of the top-gate thin film transistor 460. FIG. 14B is a cross-sectional view taken along dashed line A-B in FIG. 14A.

In FIGS. 14A and 14B, over a first substrate 450, the thin film transistor 460 includes an insulating film 457, source electrodes or drain electrodes 465a1 and 465a2, an oxide semiconductor film 462, a source electrode or drain electrode 465b, a wiring 468, a gate insulating film 452, and a gate electrode 461 (gate electrodes 461a and 461b). The source electrodes or drain electrodes 465a1 and 465a2 are electrically connected to a wiring 464 through the wiring 468. Further, although not illustrated, the source electrode or drain electrode 465b is electrically connected to a wiring through an opening formed in the gate insulating film 452.

Steps of forming the thin film transistor 460 over the first substrate 450 are described below with reference to FIGS. 15A to 15E.

First, the insulating film 457 serving as a base film is formed over the first substrate 450.

In this embodiment, the insulating film 457 can be formed in a manner similar to that of the insulating film 407 in Embodiment 2.

Figure 15A:
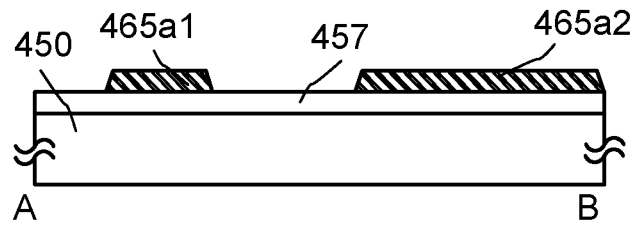
FIGS. 15A to 15E illustrate a method for manufacturing a thin film transistor.

Next, a conductive film is formed over the insulating film 457; a resist mask is formed over the conductive film in a first photolithography process; the source electrode and the drain electrode 465a1 and 465a2 are formed by selective etching; then, the resist mask is removed (see FIG. 15A). Although the source electrodes or drain electrodes 465a1 and 465a2 are separated from each other, they are continuous. Note that when end portions of the formed source electrode and the drain electrode are tapered, coverage with a gate insulating film stacked thereover is improved, which is preferable.

The source electrodes or drain electrodes 465a1 and 465a2 can be formed in a manner similar to that of the source electrode and the drain electrode 415a and 415b in Embodiment 2.

Figure 15B:
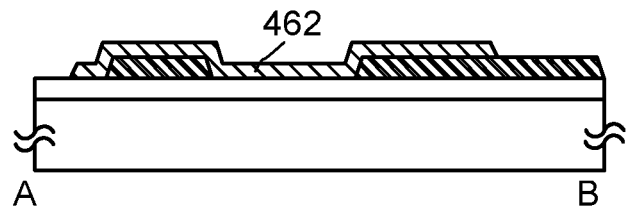

Then, an oxide semiconductor film with a thickness of 2 to 200 nm is formed over the gate insulating film 452, and etching is performed on the oxide semiconductor film with the use of a resist mask formed in a second photolithography process so that the island-shaped oxide semiconductor film 462 is formed (see FIG. 15B). The oxide semiconductor film serving as the oxide semiconductor film 462 can be formed in a manner similar to that of the oxide semiconductor film serving as the oxide semiconductor film 412 in Embodiment 2.

In this embodiment, the oxide semiconductor film 462 is subjected to first heat treatment as in Embodiment 2. The oxide semiconductor film is crystallized and the crystal structure of the oxide semiconductor film is changed into a microcrystalline structure or a polycrystalline structure depending on the condition of the first heat treatment or the material of the oxide semiconductor film in some cases.

In addition, the first heat treatment for the oxide semiconductor film can be performed on the oxide semiconductor film before being processed into the island-shaped oxide semiconductor film. In that case, the substrate is taken out from a heat apparatus after the first heat treatment, and then a photolithography process is performed.

The heat treatment for dehydration or dehydrogenation of the oxide semiconductor film may be performed at any of the following timings: after the oxide semiconductor film is formed; after a source electrode and a drain electrode are formed over the oxide semiconductor film; and after a gate insulating film is formed over the source electrode and the drain electrode.

Figure 15C:
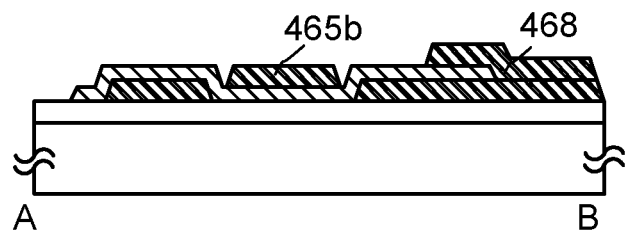

Next, a conductive film is formed over the insulating film 457 and the oxide semiconductor film 462; a resist mask is formed over the conductive film in a third photolithography process; the source electrode or drain electrode 465b and the wiring 468 are formed by selective etching; then, the resist mask is removed (see FIG. 15C). The source electrode or drain electrode 465b and the wiring 468 may be formed using a material and a step which are similar to those of the source electrodes or drain electrodes 465a1 and 465a2.

In this embodiment, a 150-nm-thick titanium film is formed as the source electrode or drain electrode 465b and the wiring 468 by sputtering. In this embodiment, the same titanium film is used for the source electrodes or drain electrodes 465a1 and 465a2 and the source electrode or drain electrode 465b; thus, etching selectivity between the source electrodes or drain electrodes 465a1 and 465a2 and the source electrode or drain electrode 465b cannot be determined. Therefore, in order that the source electrodes or drain electrodes 465a1 and 465a2 be not etched when the source electrode or drain electrode 465b is etched, the wiring 468 is provided over the source electrode or drain electrode 465a2 which is not covered with the oxide semiconductor film 462. In the case where different materials having high etching selectivity are used for the source electrodes or drain electrodes 465a1 and 465a2 and the source electrode or drain electrode 465b, the wiring 468 which protects the source electrode or drain electrode 465a2 in etching is not necessarily provided.

Note that each material and etching conditions are adjusted as appropriate so that the oxide semiconductor film 462 is not removed in etching of the conductive film.

In this embodiment, a Ti film is used as the conductive film, an In—Ga—Zn—O-based oxide semiconductor is used for the oxide semiconductor film 462, and an ammonia hydrogen peroxide mixture (a mixture of ammonia, water, and a hydrogen peroxide solution) is used as an etchant.

Note that in etching performed after the second photolithography process, only part of the oxide semiconductor film 462 is etched so that an oxide semiconductor film having a groove (a depression) is formed in some cases. The resist mask used for forming the source electrode or drain electrode 465b and wiring 468 may be formed by an inkjet method. When the resist mask is formed by an inkjet method, a photomask is not used; thus, manufacturing cost can be reduced.

Next, the gate insulating film 452 is formed over the insulating film 457, the oxide semiconductor film 462, the source electrodes or drain electrodes 465a1 and 465a2, and the source electrode or drain electrode 465b.

The gate insulating film 452 can be formed in a manner similar to that of the gate insulating film 402 in Embodiment 2.

Figure 15D:
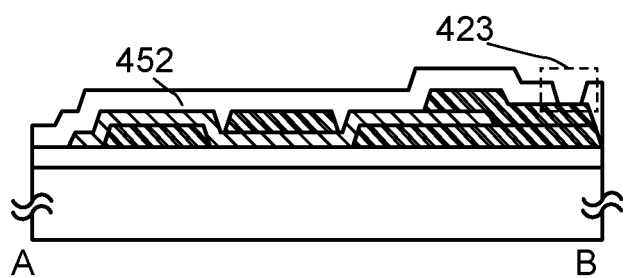

Next, a resist mask is formed in a fourth photolithography process and part of the gate insulating film 452 is removed by selective etching, so that an opening 423 which reaches the wiring 468 is formed (see FIG. 15D). Although not illustrated, an opening which reaches the source electrode or drain electrode 465b may be formed when the opening 423 is formed. In this embodiment, the opening which reaches the source electrode or drain electrode 465b is formed after an interlayer insulating film is stacked, and a wiring which is electrically connected to the source electrode or drain electrode 465b is formed in the opening.

Then, a conductive film is formed over the gate insulating film 452 and the opening 423, and then etching is performed using a resist mask formed in a fifth photolithography process so that the gate electrode 461 (the gate electrodes 461a and 461b) and the wiring 464 are formed. Note that the resist mask may be formed by an inkjet method. When the resist mask is formed by an inkjet method, a photomask is not used; thus, manufacturing cost can be reduced.

Further, the gate electrode 461 (the gate electrodes 461a and 461b) and the wiring 464 can be formed in a manner similar to that of the gate electrode 411 and the wirings 414a and 414b in Embodiment 2.

Next, as in Embodiment 2, second heat treatment (preferably at 200 to 400° C., for example, 250 to 350° C.) is performed in an inert gas atmosphere or an oxygen gas atmosphere.

Furthermore, as in Embodiment 2, heat treatment may be performed at 100 to 200° C. for 1 to 30 hours in an air atmosphere.

Figure 15E:
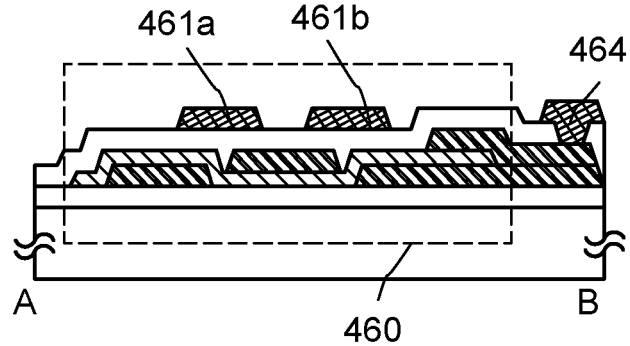

Through the above steps, the thin film transistor 460 including the oxide semiconductor film 462 whose concentration of hydrogen, moisture, hydride, or hydroxide is lowered can be formed (see FIG. 15E).

Next, although not illustrated, the oxide insulating film 114 and the planarization insulating film 115 for planarization that are illustrated in FIGS. 2A and 2B are provided over the thin film transistor 460. Then, an opening which reaches the source electrode or drain electrode 465b is formed in a protective insulating film and the planarization insulating film, and a pixel electrode (not illustrated) which is electrically connected to the source electrode or drain electrode 465b is formed in the opening.

When remaining moisture in the reaction atmosphere is removed at the time of the deposition of the oxide semiconductor film, the concentration of hydrogen and hydride in the oxide semiconductor film can be lowered and the oxide semiconductor film can be highly purified. Thus, the oxide semiconductor film can be stabilized.

When display on a display panel of an e-book reader is controlled by a thin film transistor including a highly purified oxide semiconductor whose concentration of hydrogen is low as described in this embodiment, the number of scanning of pixels can be reduced and the drive frequency of a scan line driver circuit can be lowered. Thus, the power consumption of the e-book reader can be reduced and images can be held for a long time. Further, the off-state current of the thin film transistor including a highly purified oxide semiconductor whose concentration of hydrogen is low is decreased to $1 \times 10^{-13}$ A or less, a capacitor for holding signal voltage applied to the pixel can be made small, so that the area of the capacitor and the area of the pixel can be made small. Therefore, the resolution of the e-book reader can be increased.

This embodiment can be combined with any of the structures described in the other embodiments as appropriate.

Embodiment 4

In this embodiment, a different embodiment of a thin film transistor applicable to the display panel in Embodiment 1 is described. Note that the same portions as Embodiment 2, portions having functions similar to those in Embodiment 2, and steps similar to those in Embodiment 2 may be formed or performed as in Embodiment 2, and description thereof is not repeated. In addition, detailed description of the same portions is omitted. Thin film transistors 425 and 426 illustrated in this embodiment can be used as the thin film transistor 106 in Embodiment 1 (see FIGS. 2A and 2B).

Thin film transistors in this embodiment are described with reference to FIGS. 16A and 16B.

Figure 16A:
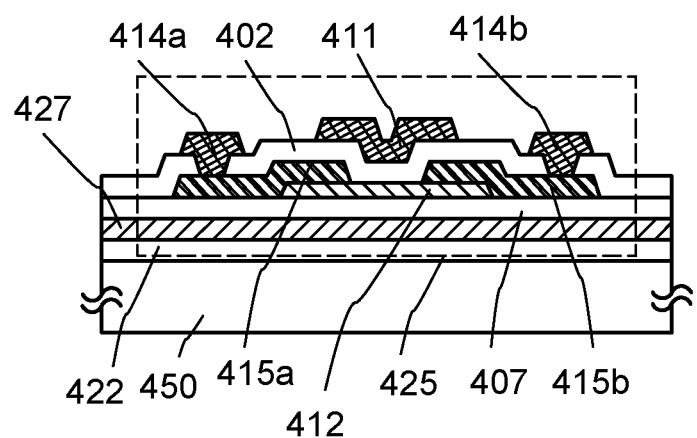
FIGS. 16A and 16B each illustrate a thin film transistor.
Figure 16B:
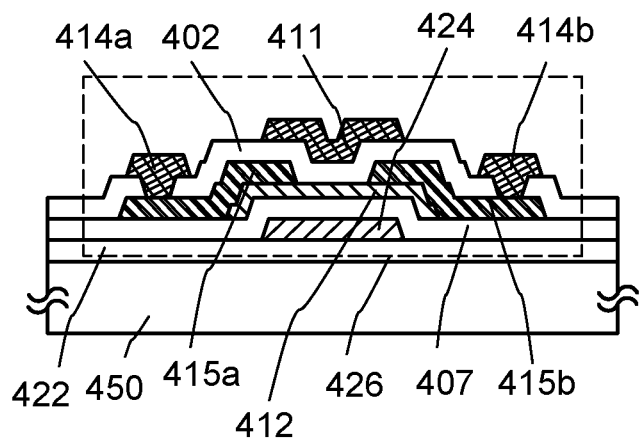

FIGS. 16A and 16B illustrate one embodiment of cross-sectional structures of the thin film transistors. Each of the thin film transistors 425 and 426 illustrated in FIGS. 16A and 16B is a kind of thin film transistor where an oxide semiconductor film is sandwiched between a conductive film and a gate electrode.

In addition, in FIGS. 16A and 16B, the substrate 400 in Embodiment 2 can be used as the first substrate 450. Alternatively, a silicon wafer may be used as the first substrate 450. The thin film transistors 425 and 426 are provided over an insulating film 422 provided over the first substrate 450.

In FIG. 16A, a conductive film 427 is provided between the insulating film 422 and the insulating film 407 which are provided over the first substrate 450 so as to overlap with at least the entire oxide semiconductor film 412.

Note that in FIG. 16B, a conductive film provided between the insulating films 422 and 407 is etched to be a conductive film 424 and overlaps with part of the oxide semiconductor film that includes a channel formation region.

Any metal material can be used for the conductive films 427 and 424 as long as it can withstand the temperature of heat treatment to be performed in a later step. An element selected from titanium (Ti), tantalum (Ta), tungsten (W), molybdenum (Mo), chromium (Cr), neodymium (Nd), or scandium (Sc); an alloy including any of these elements; an alloy film including a combination of any of these elements; a nitride including any of these elements; or the like can be used. Further, the conductive films 427 and 424 may each have either a single-layer structure or a layered structure. For example, a single layer of a tungsten film, a layered structure of a tungsten nitride film and a tungsten film, or the like can be used.

The potential of each of the conductive films 427 and 424 may be the same as or different from the potential of the gate electrode 411 in the thin film transistors 425 and 426. Each of the conductive films 427 and 424 can function as a second gate electrode. Alternatively, the potential of each of the conductive films 427 and 424 may be a fixed potential such as GND or 0V.

The electrical characteristics of the thin film transistors 425 and 426 can be controlled with the conductive films 427 and 424.

When display on a display panel of an e-book reader is controlled by a thin film transistor including a highly purified oxide semiconductor whose concentration of hydrogen is low as described in this embodiment, the number of scanning of pixels can be reduced and the drive frequency of a scan line driver circuit can be lowered. Thus, the power consumption of the e-book reader can be reduced and images can be held for a long time. Further, the off-state current of the thin film transistor including a highly purified oxide semiconductor whose concentration of hydrogen is low is decreased to $1 \times 10^{-13}$ A or less, a capacitor for holding signal voltage applied to the pixel can be made small, so that the area of the capacitor and the area of the pixel can be made small. Therefore, the resolution of the e-book reader can be increased.

This embodiment can be combined with any of the other embodiments as appropriate.

Embodiment 5

In this embodiment, an embodiment of a thin film transistor applicable to the display panel in Embodiment 1 is described.

One embodiment of the thin film transistor in this embodiment and a method for manufacturing the thin film transistor is described with reference to FIGS. 17A to 17E.

FIGS. 17A to 17E illustrate one embodiment of a cross-sectional structure of the thin film transistor. A thin film transistor 390 illustrated in FIGS. 17A to 17E is a kind of bottom-gate thin film transistor (also referred to as an inverted staggered thin film transistor).

Although the thin film transistor 390 is described as a single-gate thin film transistor (see Embodiment 1), a multi-gate thin film transistor including a plurality of channel formation regions can be formed when needed.

Steps of forming the thin film transistor 390 over a first substrate 394 are described below with reference to FIGS. 17A to 17E.

First, a conductive film is formed over the first substrate 394, and then etching is performed on the conductive film with the use of a resist mask formed in a first photolithography process so that a gate electrode 391 is formed. Note that when end portions of the formed gate electrode are tapered, coverage with a gate insulating film stacked thereover is improved, which is preferable. Note that the resist mask may be formed by an inkjet method. When the resist mask is formed by an inkjet method, a photomask is not used; thus, manufacturing cost can be reduced.

There is no particular limitation on the substrate which can be used as the first substrate 394. As the first substrate 394, especially among substrates which can be used as the first substrate 11 in Embodiment 1, a substrate having at least heat resistance high enough to withstand heat treatment to be performed late can be used as appropriate.

An insulating film serving as a base film may be provided between the first substrate 394 and the gate electrode 391. The base film has a function of preventing diffusion of an impurity element from the first substrate 394 and can be formed in a manner similar to that of the insulating film 407 serving as a base film in Embodiment 2.

The gate electrode 391 can be formed in a manner similar to that of the gate electrode 411 in Embodiment 2.

Next, a gate insulating film 397 is formed over the gate electrode 391.

The gate insulating film 397 can be formed in a manner similar to that of the gate insulating film 402 in Embodiment 2.

The gate insulating film 397 can have a structure in which a silicon nitride film and a silicon oxide film are sequentially stacked from the gate electrode 391 side. For example, a gate insulating film with a thickness of 55 to 500 nm can be formed in such a manner that a silicon nitride film ($SiN_y$ (y>0)) with a thickness of 50 to 200 nm is formed as a first gate insulating film by sputtering and a silicon oxide film ($SiO_x$ (x>0)) with a thickness of 5 to 300 nm is stacked as a second gate insulating film over the first gate insulating film.

In order that hydrogen, a hydroxyl group, and moisture be contained in the gate insulating film 397 and an oxide semiconductor film 393 as little as possible, it is preferable that an impurity such as hydrogen or moisture that is adsorbed on the first substrate 394 be eliminated and exhausted by preheating of the first substrate 394 over which the gate electrode 391 is formed in a preheating chamber of a sputtering apparatus, as pretreatment for deposition. Note that the temperature of preheating is 100 to 400° C., preferably 150 to 300° C. As an exhaustion means provided in the preheating chamber, a cryopump is preferable. Note that the preheating treatment can be omitted. In addition, the preheating may be performed on the first substrate 394 over which films up to a source electrode 395a and a drain electrode 395b are formed in a similar manner before the deposition of an oxide insulating film 396.

Figure 17A:
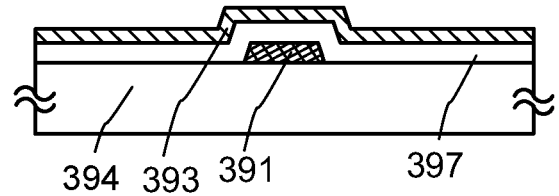
FIGS. 17A to 17E illustrate a method for manufacturing a thin film transistor.

The oxide semiconductor film 393 with a thickness of 2 to 200 nm is formed over the gate insulating film 397 (see FIG. 17A).

Note that before the oxide semiconductor film 393 is formed by sputtering, dust on a surface of the gate insulating film 397 is preferably removed by reverse sputtering in which an argon gas is introduced and plasma is generated. Note that nitrogen, helium, oxygen, or the like may be used instead of the argon atmosphere.

The oxide semiconductor film 393 can be formed in a manner similar to that of the oxide semiconductor film in Embodiment 2.

Figure 17B:
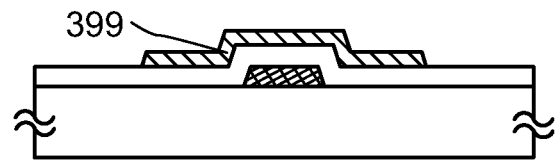

Then, the oxide semiconductor film is etched using a resist mask formed in a second photolithography process, so that the island-shaped oxide semiconductor film 399 is formed (see FIG. 17B). A resist mask used for formation of the island-shaped oxide semiconductor film 399 may be formed by an inkjet method. When the resist mask is formed by an inkjet method, a photomask is not used; thus, manufacturing cost can be reduced.

In the case where a contact hole is formed in the gate insulating film 397, a step of forming the contact hole can be performed at the time of formation of the oxide semiconductor film 399.

Note that as etching of the oxide semiconductor film 393 here, the etching methods of the oxide semiconductor film that are described in Embodiment 2 can be used as appropriate.

Note that it is preferable that reverse sputtering be performed before the formation of a conductive film in a subsequent step so that a resist residue or the like that attaches onto surfaces of the oxide semiconductor film 399 and the gate insulating film 397 is removed.

Figure 17C:
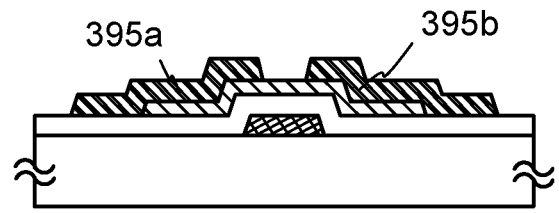

Then, the source electrode 395a and the drain electrode 395b are formed over the gate insulating film 397 and the oxide semiconductor film 399 (see FIG. 17C). The source electrode 395a and the drain electrode 395b can be formed in a manner similar to that of the source electrode and the drain electrode 415a and 415b in Embodiment 2.

Note that each material and etching conditions are adjusted as appropriate so that the oxide semiconductor film 399 is not removed in etching in a step of forming the source electrode 395a and the drain electrode 395b.

Then, by plasma treatment using a gas such as $N_2O$, $N_2$, or Ar, water or the like which attaches or is adsorbed to an exposed surface of the oxide semiconductor film may be removed. Further, plasma treatment may be performed using a mixed gas of oxygen and argon.

Figure 17D:
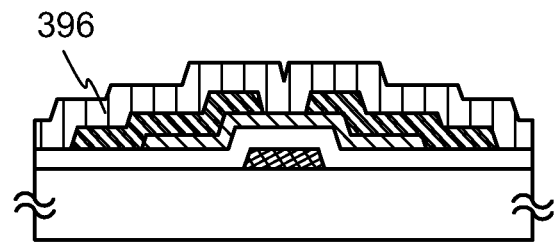

In the case where plasma treatment is performed, the oxide insulating film 396 is formed as an oxide insulating film which serves as a protective insulating film formed in contact with part of the oxide semiconductor film, without exposure to the air (see FIG. 17D). In this embodiment, the oxide insulating film 396 is formed in contact with the oxide semiconductor film 399 in a region where the oxide semiconductor film 399 does not overlap with the source electrode 395a and the drain electrode 395b.

In this embodiment, a silicon oxide film having a defect is deposited as the oxide insulating film 396 in such a manner that the first substrate 394 over which the films up to the island-shaped oxide semiconductor film 399, the source electrode 395a, and the drain electrode 395b are formed is heated at room temperature or a temperature lower than 10° C., a sputtering gas including high-purity oxygen from which hydrogen and moisture are removed is introduced, and a silicon target is used.

For example, the silicon oxide film is deposited by pulsed DC sputtering under the following condition: the purity of a sputtering gas is 6N; a silicon target doped with boron (having a resistance value of 0.01 Ωcm) is used; the distance between the substrate and the target (the T-S distance) is 89 mm; the pressure is 0.4 Pa; the DC power is 6 kW; and the atmosphere contains oxygen (an oxygen flow rate ratio is 100%). The thickness of the silicon oxide film is 300 nm Instead of the silicon target, quartz (preferably synthetic quartz) can be used as a target for depositing the silicon oxide film. Note that oxygen or a mixed gas of oxygen and argon is used as the sputtering gas.

In this case, it is preferable to form the oxide insulating film 396 while moisture remaining in a treatment chamber is removed in order that hydrogen, a hydroxyl group, or moisture be not contained in the oxide semiconductor film 399 and the oxide insulating film 396. In order to remove moisture remaining in the treatment chamber, an adsorption vacuum pump is preferably used.

Note that instead of the silicon oxide film, a silicon oxynitride film, an aluminum oxide film, an aluminum oxynitride film, or the like can be used.

In addition, heat treatment may be performed at 100 to 400° C. in a state where the oxide insulating film 396 is in contact with part of the oxide semiconductor film 399. Since the oxide insulating film 396 in this embodiment includes many defects, by the heat treatment, an impurity such as hydrogen, moisture, a hydroxyl group, or hydride contained in the oxide semiconductor film 399 is diffused into the oxide insulating film 396, so that the impurity contained in the oxide semiconductor film 399 can be further reduced. Through the heat treatment, an oxide semiconductor film 392 whose concentration of hydrogen, moisture, a hydroxyl group, or hydride is lowered is formed.

Figure 17E:
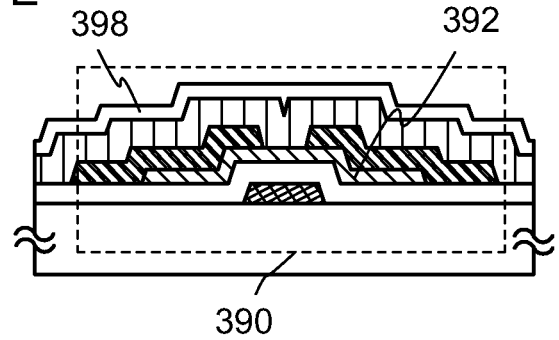

Through the above steps, the thin film transistor 390 including the oxide semiconductor film 392 whose concentration of hydrogen, moisture, a hydroxyl group, or hydride is lowered can be formed (see FIG. 17E).

When remaining moisture in the reaction atmosphere is removed at the time of the deposition of the oxide semiconductor film, the concentration of hydrogen and hydride in the oxide semiconductor film can be lowered. Thus, the oxide semiconductor film can be stabilized.

A protective insulating film may be provided over the oxide insulating film. In this embodiment, a protective insulating film 398 is formed over the oxide insulating film 396. As the protective insulating film 398, a silicon nitride film, a silicon nitride oxide film, an aluminum nitride film, an aluminum nitride oxide film, or the like is used.

As the protective insulating film 398, a silicon nitride film is formed in such a manner that the first substrate 394 over which the films up to the oxide insulating film 396 are formed is heated at a temperature of 100 to 400° C., a sputtering gas including high-purity nitrogen from which hydrogen and moisture are removed is introduced, and a silicon target is used. Also in this case, as in the oxide insulating film 396, it is preferable to deposit the protective insulating film 398 while remaining moisture in the treatment chamber is removed.

In the case where the protective insulating film 398 is formed, when the first substrate 394 is heated at a temperature of 100 to 400° C. at the time of deposition of the protective insulating film 398, hydrogen or moisture contained in the oxide semiconductor film can be diffused into the oxide insulating film. In this case, heat treatment is not necessarily performed after the oxide insulating film 396 is formed.

In the case where a silicon oxide film is formed as the oxide insulating film 396 and a silicon nitride film is stacked as the protective insulating film 398, the silicon oxide film and the silicon nitride film can be deposited in the same treatment chamber with the use of a common silicon target. First, the silicon oxide film is deposited in such a manner that a sputtering gas containing oxygen is introduced and a silicon target mounted on the treatment chamber is used. Then, the silicon nitride film is deposited in such a manner that the gas is changed to a sputtering gas containing nitrogen and the same silicon target is used. The silicon oxide film and the silicon nitride film can be deposited successively without exposure to the air; thus, adsorption of an impurity such as hydrogen or moisture on a surface of the silicon oxide film can be prevented. In this case, after the silicon oxide film is formed as the oxide insulating film 396 and the silicon nitride film is stacked as the protective insulating film 398, heat treatment (at a temperature of 100 to 400° C.) for diffusing hydrogen or moisture contained in the oxide semiconductor film into the oxide insulating film is preferably performed.

Furthermore, after the formation of the protective insulating film, as in Embodiment 2, heat treatment may be performed at 100 to 200° C. for 1 to 30 hours in an air atmosphere. Through this heat treatment, a normally-off thin film transistor can be obtained. Thus, the reliability of a display panel can be improved.

When remaining moisture in the reaction atmosphere is removed at the time of deposition of an oxide semiconductor film having a channel formation region over the gate insulating film, the concentration of hydrogen and hydride in the oxide semiconductor film can be lowered.

Next, although not illustrated, the planarization insulating film 115 for planarization that is illustrated in FIGS. 2A and 2B may be provided over the protective insulating film 398. Then, an opening which reaches the source electrode or drain electrode 395b is formed in the protective insulating film and the planarization insulating film, and a pixel electrode (not illustrated) which is electrically connected to the source electrode or drain electrode 395b is formed in the opening.

When display on a display panel of an e-book reader is controlled by a thin film transistor including a highly purified oxide semiconductor whose concentration of hydrogen is low as described in this embodiment, the number of scanning of pixels can be reduced and the drive frequency of a scan line driver circuit can be lowered. Thus, the power consumption of the e-book reader can be reduced and images can be held for a long time. Further, the off-state current of the thin film transistor including a highly purified oxide semiconductor whose concentration of hydrogen is low is decreased to $1 \times 10^{-13}$ A or less, a capacitor for holding signal voltage applied to the pixel can be made small, so that the area of the capacitor and the area of the pixel can be made small. Therefore, the resolution of the e-book reader can be increased.

This embodiment can be combined with any of the structures described in the other embodiments as appropriate.

Embodiment 6

In this embodiment, a different embodiment of a thin film transistor applicable to the display panel in Embodiment 1 is described. A thin film transistor 310 illustrated in this embodiment can be used as the thin film transistor 106 in Embodiment 1 (see FIGS. 2A and 2B).

One embodiment of the thin film transistor in this embodiment and a method for manufacturing the thin film transistor is described with reference to FIGS. 18A to 18E.

FIGS. 18A to 18E illustrate one embodiment of a cross-sectional structure of the thin film transistor. The thin film transistor 310 illustrated in FIGS. 18A to 18E is a kind of bottom-gate thin film transistor (also referred to as an inverted staggered thin film transistor).

Although the thin film transistor 310 is described as a single-gate thin film transistor, a multi-gate thin film transistor including a plurality of channel formation regions can be formed when needed.

Steps of forming the thin film transistor 310 over a first substrate 300 are described below with reference to FIGS. 18A to 18E.

First, a conductive film is formed over the first substrate 300, and then etching is performed on the conductive film with the use of a resist mask formed in a first photolithography process so that a gate electrode 311 is formed. Note that the resist mask may be formed by an inkjet method. When the resist mask is formed by an inkjet method, a photomask is not used; thus, manufacturing cost can be reduced.

As the first substrate 300, the first substrate 11 in Embodiment 1 can be used as appropriate.

An insulating film serving as a base film may be provided between the first substrate 300 and the gate electrode 311. The base film has a function of preventing diffusion of an impurity element from the first substrate 300 and can be formed in a manner similar to that of the insulating film 407 serving as a base film in Embodiment 2.

The gate electrode 311 can be formed in a manner similar to that of the gate electrode 411 in Embodiment 2.

Next, a gate insulating film 302 is formed over the gate electrode 311.

The gate insulating film 302 can be formed in a manner similar to that of the gate insulating film 402 in Embodiment 2.

Then, an oxide semiconductor film 330 with a thickness of 2 to 200 nm is formed over the gate insulating film 302.

Note that before the oxide semiconductor film 330 is formed by sputtering, dust on a surface of the gate insulating film 302 is preferably removed by reverse sputtering in which an argon gas is introduced and plasma is generated. Note that nitrogen, helium, oxygen, or the like may be used instead of the argon atmosphere.

The oxide semiconductor film 330 can be formed in a manner similar to that of the oxide semiconductor film in Embodiment 2. In this embodiment, the oxide semiconductor film 330 is deposited by sputtering with the use of an In—Ga—Zn—O-based oxide semiconductor target. A cross-sectional view at this stage corresponds to FIG. 18A.

Note that the substrate is placed in a treatment chamber kept in a reduced pressure state, and the temperature of the substrate is 100 to 600° C., preferably 200 to 400° C. By forming the oxide semiconductor film in a state where the substrate is heated, the concentration of an impurity contained in the formed oxide semiconductor film can be lowered. In addition, damage due to sputtering is reduced. A sputtering gas from which hydrogen and moisture are removed is introduced while remaining moisture in the treatment chamber is removed. Then, the oxide semiconductor film 330 is deposited over the first substrate 300 with the use of metal oxide as a target. In order to remove moisture remaining in the treatment chamber, an adsorption vacuum pump is preferably used. For example, a cryopump, an ion pump, or a titanium sublimation pump is preferably used. As an exhaust means, a turbo pump to which a cold trap is added may be used. For example, a hydrogen atom, a compound containing a hydrogen atom, such as water ($H_2O$) (preferably a compound containing a carbon atom), and the like are exhausted from a deposition chamber with the use of a cryopump. Therefore, the concentration of an impurity contained in the oxide semiconductor film deposited in this chamber can be lowered.

Then, the oxide semiconductor film 330 is processed into an island-shaped oxide semiconductor film 331 in a second photolithography process. A resist mask used for formation of the island-shaped oxide semiconductor film 331 may be formed by an inkjet method. When the resist mask is formed by an inkjet method, a photomask is not used; thus, manufacturing cost can be reduced.

Then, the oxide semiconductor film is subjected to first heat treatment as in Embodiment 2. Through the first heat treatment, the oxide semiconductor film can be dehydrated or dehydrogenated (see FIG. 18B).

In addition, the first heat treatment for the oxide semiconductor film can be performed on the oxide semiconductor film 330 before being processed into the island-shaped oxide semiconductor film 331. In that case, the substrate is taken out from the heat apparatus after the first heat treatment, and then a photolithography process is performed.

The heat treatment for dehydration or dehydrogenation of the oxide semiconductor film may be performed at any of the following timings: after the oxide semiconductor film is formed; after a source electrode and a drain electrode are formed over the oxide semiconductor film; and after a protective insulating film is formed over the source electrode and the drain electrode.

Further, in the case where a contact hole is formed in the gate insulating film 302, the formation of the contact hole may be performed before or after the oxide semiconductor film is dehydrated or dehydrogenated.

Note that the etching of the oxide semiconductor film here is not limited to wet etching, and dry etching may be employed. The etching conditions (e.g., an etchant, etching time, and temperature) are adjusted as appropriate depending on the material so that the oxide semiconductor film is etched to have a desired shape.

Figure 18A:
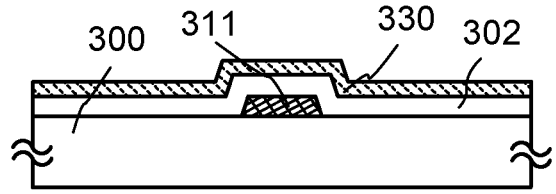
FIGS. 18A to 18E illustrate a method for manufacturing a thin film transistor.
Figure 18B:
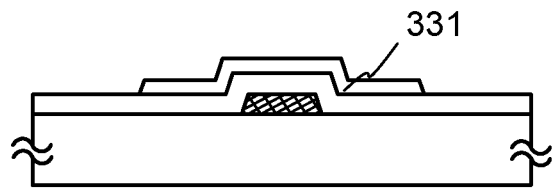
Figure 18C:
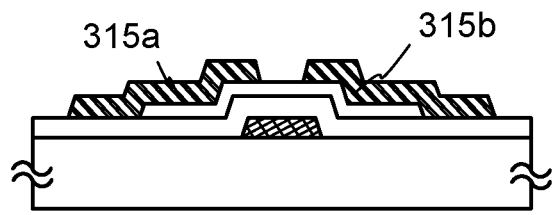
Figure 18D:
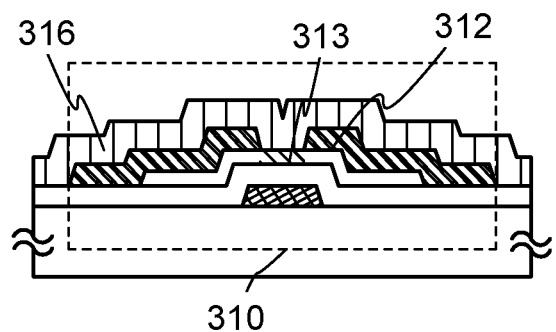
Figure 18E:
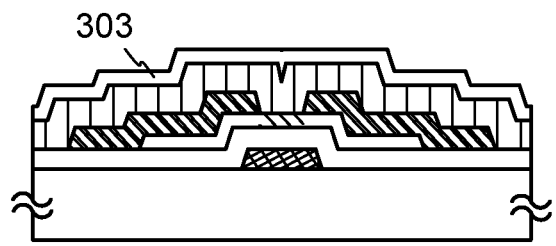

Then, a source electrode 315a and a drain electrode 315b are formed over the gate insulating film 302 and the oxide semiconductor film 331 (see FIG. 18C). The source electrode 315a and the drain electrode 315b can be formed in a manner similar to that of the source electrode and the drain electrode 415a and 415b in Embodiment 2.

Note that each material and etching conditions are adjusted as appropriate so that the oxide semiconductor film 331 is not removed in etching when the source electrode 315a and the drain electrode 315b are formed.

Further, an oxide conductive film may be formed between the oxide semiconductor film, and the source electrode and the drain electrode. The oxide conductive film and a metal film used for forming the source electrode and the drain electrode can be formed successively. The oxide conductive film can serve as a source region and a drain region.

When the oxide conductive film is provided as the source region and the drain region between the oxide semiconductor film, and the source electrode and the drain electrode, the resistance of the source region and the drain region can be lowered and the transistor can operate at high speed.

Then, plasma treatment using a gas such as $N_2O$, $N_2$, or Ar is performed. By the plasma treatment, water or the like which attaches or is adsorbed to an exposed surface of the oxide semiconductor film is removed. Further, plasma treatment may be performed using a mixed gas of oxygen and argon.

After the plasma treatment, an oxide insulating film 316 which serves as a protective insulating film formed in contact with part of the oxide semiconductor film is formed, without exposure to the air.

The oxide insulating film 316 can be formed to a thickness of at least 1 nm by a method by which an impurity such as water or hydrogen is not mixed into the oxide insulating film 316, such as sputtering, as appropriate. When hydrogen is contained in the oxide insulating film 316, entry of hydrogen to the oxide semiconductor film or extraction of oxygen contained in the oxide semiconductor film by hydrogen is caused; thus, a backchannel of the oxide semiconductor film might have n-type conductivity (low resistance) and a parasitic channel might be formed. Therefore, it is important to employ a formation method in which hydrogen is not used in order to form the oxide insulating film 316 containing as little hydrogen as possible.

In this embodiment, a 200-nm-thick silicon oxide film is formed as the oxide insulating film 316 by sputtering. The temperature of the substrate in deposition may be higher than or equal to room temperature and lower than or equal to 300° C., and in this embodiment, 100° C. The silicon oxide film can be formed by sputtering in a rare gas (typically argon) atmosphere, an oxygen atmosphere, or a mixed atmosphere of a rare gas (typically argon) and oxygen. As a target, a silicon oxide target or a silicon target may be used. For example, with the use of a silicon target, silicon oxide can be deposited by sputtering in an atmosphere including oxygen and nitrogen. As the oxide insulating film 316 which is formed in contact with the oxide semiconductor film whose resistance is lowered, an inorganic insulating film which does not include an impurity such as moisture, a hydrogen ion, or $OH^-$ and blocks entry of the impurity from the outside is used. Typically, a silicon oxide film, a silicon oxynitride film, an aluminum oxide film, an aluminum oxynitride film, or the like is used.

In this case, it is preferable to form the oxide insulating film 316 while moisture remaining in the treatment chamber is removed in order that hydrogen, a hydroxyl group, or moisture be not contained in the oxide semiconductor film 331 and the oxide insulating film 316. In order to remove moisture remaining in the treatment chamber, an adsorption vacuum pump is preferably used.

As a sputtering gas used for deposition of the oxide insulating film 316, a high-purity gas from which an impurity such as hydrogen, water, a hydroxyl group, or hydride is removed to about a concentration of ppm or ppb is preferably used.

Next, as in Embodiment 2, second heat treatment (preferably at 200 to 400° C., for example, 250 to 350° C.) is performed in an inert gas atmosphere or an oxygen gas atmosphere. In the second heat treatment, heat is applied while part (a channel formation region) of the oxide semiconductor film is in contact with the oxide insulating film 316.

Through the above steps, after heat treatment for dehydration or dehydrogenation is performed on the deposited oxide semiconductor film 312 in order to lower the resistance of the oxide semiconductor film, part of the oxide semiconductor film 312 is selectively made to be in an oxygen excess state. Accordingly, a channel formation region 313 overlapping with the gate electrode 311 becomes intrinsic. Note that when the source electrode 315a and the drain electrode 315b are formed using titanium (Ti), a high-resistant source region which is in contact with the source electrode 315a and a high-resistant drain region which is in contact with the drain electrode 315b are formed in a self-aligning manner. Through the above steps, the thin film transistor 310 is formed (see FIG. 18D).

Further, as in Embodiment 2, heat treatment may be performed at 100 to 200° C. for 1 to 30 hours in an air atmosphere. In this embodiment, the heat treatment is performed at 150° C. for 10 hours. Through this heat treatment, hydrogen is introduced from the oxide semiconductor film to the oxide insulating film; thus, a normally-off thin film transistor can be obtained. Thus, the reliability of a display panel can be improved. In addition, when a silicon oxide film which has many defects is used as the oxide insulating film, an impurity such as hydrogen, moisture, a hydroxyl group, or hydride that is contained in the oxide semiconductor film is diffused into the oxide insulating film through this heat treatment, and the impurity contained in the oxide semiconductor film can be further reduced.

Note that when the source electrode 315a and the drain electrode 315b are formed using titanium (Ti), the high-resistant drain region (or the high-resistant source region) is formed at an interface between the source electrode 315a and the drain electrode 315b, and the oxide semiconductor film which is contact with the drain electrode 315b (and the source electrode 315a), so that the reliability of the thin film transistor can be improved. Specifically, by the formation of the high-resistant drain region, a structure can be employed in which conductivity can be varied stepwise from the drain electrode 315b to the channel formation region 313 via the high-resistant drain region. Thus, in the case where operation is performed with the drain electrode 315b connected to a wiring for supplying a high power supply potential, the high-resistant drain region serves as a buffer and an electric field is not applied locally even if high voltage is applied between the gate electrode 311 and the drain electrode 315b, so that the withstand voltage of the thin film transistor can be improved.

The high-resistant source region or the high-resistant drain region in the oxide semiconductor film may be formed in the entire region in a thickness direction in the case where the oxide semiconductor film is as thin as 15 nm or less. In the case where the oxide semiconductor film is as thick as 30 to 50 nm, the resistance of part of the oxide semiconductor film, regions which are in contact with the source electrode and the drain electrode, and the vicinity thereof is increased, so that the high-resistant source region and the high-resistant drain region are formed and a region of the oxide semiconductor film that is near the gate insulating film can be intrinsic.

A protective insulating film 316 may be formed over the oxide insulating film 316. For example, a silicon nitride film is formed by RF sputtering. Since the RF sputtering has high productivity, it is preferably used as the deposition method of the protective insulating film. The protective insulating film is formed using an inorganic insulating film which includes an impurity such as moisture, a hydrogen ion, or OH⁻ and blocks entry of the impurity from the outside. For example, a silicon nitride film, an aluminum nitride film, a silicon nitride oxide film, an aluminum nitride oxide film, or the like is used. In this embodiment, a protective insulating film 303 is formed using a silicon nitride film as the protective insulating film (see FIG. 18E).

As the protective insulating film 303, a silicon nitride film is formed in such a manner that the first substrate 300 over which the films up to the oxide insulating film 316 are formed is heated at a temperature of 100 to 400° C., a sputtering gas including high-purity nitrogen from which hydrogen and moisture are removed is introduced, and a silicon target is used. Also in this case, as in the oxide insulating film 316, it is preferable to deposit the protective insulating film 303 while remaining moisture in the treatment chamber is removed.

Next, although not illustrated, the planarization insulating film 115 for planarization that is illustrated in FIGS. 2A and 2B may be provided over the protective insulating film 303. Then, an opening which reaches the source electrode or drain electrode 315b is formed in the protective insulating film and the planarization insulating film, and a pixel electrode (not illustrated) which is electrically connected to the source electrode or drain electrode 315b is formed in the opening.

When display on a display panel of an e-book reader is controlled by a thin film transistor including a highly purified oxide semiconductor whose concentration of hydrogen is low as described in this embodiment, the number of scanning of pixels can be reduced and the drive frequency of a scan line driver circuit can be lowered. Thus, the power consumption of the e-book reader can be reduced and images can be held for a long time. Further, the off-state current of the thin film transistor including a highly purified oxide semiconductor whose concentration of hydrogen is low is decreased to $1 \times 10^{-13}$ A or less, a capacitor for holding signal voltage applied to the pixel can be made small, so that the area of the capacitor and the area of the pixel can be made small. Therefore, the resolution of the e-book reader can be increased.

This embodiment can be combined with any of the structures described in the other embodiments as appropriate.

Embodiment 7

In this embodiment, a different embodiment of a thin film transistor applicable to the display panel in Embodiment 1 is described. A thin film transistor 360 illustrated in this embodiment can be used as the thin film transistor 106 in Embodiment 1 (see FIGS. 2A and 2B).

One embodiment of the thin film transistor in this embodiment and a method for manufacturing the thin film transistor is described with reference to FIGS. 19A to 19D.

FIGS. 19A to 19D illustrate one embodiment of a cross-sectional structure of the thin film transistor. The thin film transistor 360 illustrated in FIGS. 19A to 19D is a kind of bottom-gate thin film transistor (also referred to as a channel protective (channel stop) thin film transistor). The thin film transistor 360 is also referred to as an inverted staggered thin film transistor.

Although the thin film transistor 360 is described as a single-gate thin film transistor, a multi-gate thin film transistor including a plurality of channel formation regions can be formed when needed.

Steps of forming the thin film transistor 360 over a first substrate 320 are described below with reference to FIGS. 19A to 19D.

First, a conductive film is formed over the first substrate 320, and then etching is performed on the conductive film with the use of a resist mask formed in a first photolithography process so that a gate electrode 361 is formed. Note that the resist mask may be formed by an inkjet method. When the resist mask is formed by an inkjet method, a photomask is not used; thus, manufacturing cost can be reduced.

The gate electrode 361 can be formed in a manner similar to that of the gate electrode 411 in Embodiment 2.

Next, a gate insulating film 322 is formed over the gate electrode 361.

The gate insulating film 322 can be formed in a manner similar to that of the gate insulating film 402 in Embodiment 2.

Then, an oxide semiconductor film is formed to a thickness of 2 to 200 nm over the gate insulating film 322 and is processed into an island-shaped oxide semiconductor film in a second photolithography process. The oxide semiconductor film can be formed in a manner similar to that of the oxide semiconductor film in Embodiment 2. In this embodiment, the oxide semiconductor film is deposited by sputtering with the use of an In—Ga—Zn—O-based oxide semiconductor target.

In this case, it is preferable to form the oxide semiconductor film while moisture remaining in a treatment chamber is removed in order that hydrogen, a hydroxyl group, or moisture be not contained in the oxide semiconductor film. In order to remove moisture remaining in the treatment chamber, an adsorption vacuum pump is preferably used.

Then, the oxide semiconductor film is dehydrated or dehydrogenated. The temperature of first heat treatment for dehydration or dehydrogenation is 400 to 750° C., preferably higher than or equal to 400° C. and lower than the strain point of the substrate. Here, after the substrate is put in an electric furnace which is a kind of heat treatment apparatus and the oxide semiconductor film is subjected to heat treatment at 450° C. for one hour in a nitrogen atmosphere, water or hydrogen is prevented from being mixed into the oxide semiconductor film by preventing the substrate from being exposed to the air; thus, an oxide semiconductor film 332 is obtained (see FIG. 19A).

Then, plasma treatment using a gas such as $N_2O$, $N_2$, or Ar is performed. By the plasma treatment, water or the like which attaches or is adsorbed to an exposed surface of the oxide semiconductor film is removed. Further, plasma treatment may be performed using a mixed gas of oxygen and argon.

Next, an oxide insulating film is formed over the gate insulating film 322 and the oxide semiconductor film 332; a resist mask is formed in a third photolithography process; an oxide insulating film 366 is formed by selective etching; then, the resist mask is removed.

The oxide insulating film 366 can be formed in a manner similar to that of the oxide insulating film 316 in Embodiment 6. In the case where the oxide insulating film 366 is formed, it is preferable to form the oxide insulating film while moisture remaining in the treatment chamber is removed in order that hydrogen, a hydroxyl group, or moisture be not contained in the oxide semiconductor film 332 and the oxide insulating film 366. In order to remove moisture remaining in the treatment chamber, an adsorption vacuum pump is preferably used.

Next, as in Embodiment 2, second heat treatment (preferably at 200 to 400° C., for example, 250 to 350° C.) may be performed in an inert gas atmosphere or an oxygen gas atmosphere.

In this embodiment, the oxide semiconductor film 332 which is provided with the oxide insulating film 366 and is partly exposed is subjected to heat treatment in a nitrogen atmosphere or an inert gas atmosphere or under reduced pressure. When the heat treatment is performed in a nitrogen atmosphere or an inert gas atmosphere or under reduced pressure, the resistance of an exposed region of the oxide semiconductor film 332 that is not covered with the oxide insulating film 366 can be lowered. For example, the heat treatment is performed at 250° C. for one hour in a nitrogen atmosphere.

Through the heat treatment performed on the oxide semiconductor film 332 provided with the oxide insulating film 366 in a nitrogen atmosphere, the resistance of the exposed region of the oxide semiconductor film 332 is lowered, so that an oxide semiconductor film 362 including regions with different resistances (indicated as a shaded region and a white region in FIG. 19B) is formed.

Figure 19A:
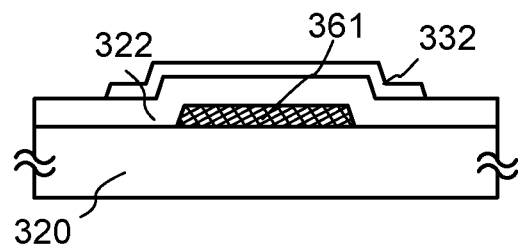
FIGS. 19A to 19D illustrate a method for manufacturing a thin film transistor.
Figure 19B:
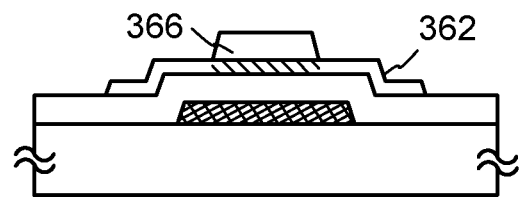
Figure 19C:
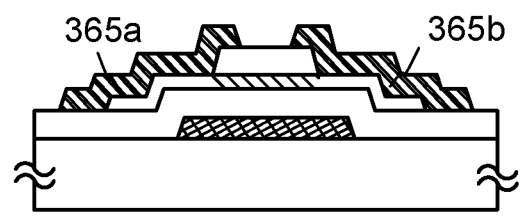
Figure 19D:
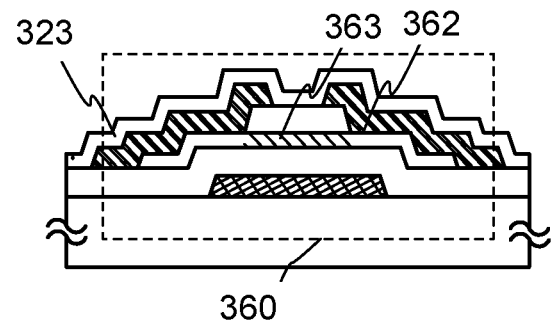

Next, a conductive film is formed over the gate insulating film 322, the oxide semiconductor film 362, and the oxide insulating film 366; a resist mask is formed in a fourth photolithography process; a source electrode 365a and a drain electrode 365b are formed by selective etching; then, the resist mask is removed (see FIG. 19C).

The source electrode 365a and the drain electrode 365b can be formed in a manner similar to that of the source electrode and the drain electrode 415a and 415b in Embodiment 2.

Through the above steps, after the first heat treatment for dehydration or dehydrogenation is performed on the deposited oxide semiconductor film in order to lower the resistance of the oxide semiconductor film, part of the oxide semiconductor film is selectively made to be in an oxygen excess state. Accordingly, a channel formation region 363 overlapping with the gate electrode 361 becomes intrinsic. Note that when the source electrode 365a and the drain electrode 365b are formed using titanium (Ti), a high-resistant source region which is in contact with the source electrode 365a and a high-resistant drain region which is in contact with the drain electrode 365b are formed in a self-aligning manner. Through the above steps, the thin film transistor 360 is formed.

Further, as in Embodiment 2, heat treatment may be performed at 100 to 200° C. for 1 to 30 hours in an air atmosphere. In this embodiment, the heat treatment is performed at 150° C. for 10 hours. Through this heat treatment, hydrogen is introduced from the oxide semiconductor film to the oxide insulating film; thus, a normally-off thin film transistor can be obtained. Thus, the reliability of a display panel can be improved.

Note that when the source electrode 365a and the drain electrode 365b are formed using titanium (Ti), the high-resistant drain region (or the high-resistant source region) is formed at an interface between the source electrode 365a and the drain electrode 365b, and the oxide semiconductor film which is contact with the drain electrode 365b (and the source electrode 365a), so that the reliability of the thin film transistor can be improved. Specifically, by the formation of the high-resistant drain region, a structure can be employed in which conductivity can be varied stepwise from the drain electrode to the channel formation region 363 via the high-resistant drain region. Thus, in the case where operation is performed with the drain electrode 365b connected to a wiring for supplying a high power supply potential VDD, the high-resistant drain region serves as a buffer and an electric field is not applied locally even if high voltage is applied between the gate electrode 361 and the drain electrode 365b, so that the withstand voltage of the thin film transistor can be improved.

A protective insulating film 323 is formed over the source electrode 365a, the drain electrode 365b, and the oxide insulating film 366. In this embodiment, the protective insulating film 323 is formed using a silicon nitride film (see FIG. 19D).

Next, although not illustrated, the planarization insulating film 115 for planarization that is illustrated in FIGS. 2A and 2B may be provided over the protective insulating film 323. Then, an opening which reaches the drain electrode 365b is formed in the protective insulating film and the planarization insulating film, and a pixel electrode (not illustrated) which is electrically connected to the drain electrode 365b is formed in the opening.

When display on a display panel of an e-book reader is controlled by a thin film transistor including a highly purified oxide semiconductor whose concentration of hydrogen is low as described in this embodiment, the number of scanning of pixels can be reduced and the drive frequency of a scan line driver circuit can be lowered. Thus, the power consumption of the e-book reader can be reduced and images can be held for a long time. Further, the off-state current of the thin film transistor including a highly purified oxide semiconductor whose concentration of hydrogen is low is decreased to $1\times 10^{-13}$ A or less, a capacitor for holding signal voltage applied to the pixel can be made small, so that the area of the capacitor and the area of the pixel can be made small. Therefore, the resolution of the e-book reader can be increased.

This embodiment can be combined with any of the structures described in the other embodiments as appropriate.

Embodiment 8

In this embodiment, a different embodiment of a thin film transistor applicable to the display panel in Embodiment 1 is described. A thin film transistor 350 illustrated in this embodiment can be used as the thin film transistor 106 in Embodiment 1 (see FIGS. 2A and 2B).

One embodiment of the thin film transistor in this embodiment and a method for manufacturing the thin film transistor is described with reference to FIGS. 20A to 20D.

Although the thin film transistor 350 is described as a single-gate thin film transistor, a multi-gate thin film transistor including a plurality of channel formation regions can be formed when needed.

Steps of forming the thin film transistor 350 over a first substrate 340 are described below with reference to FIGS. 20A to 20D.

First, a conductive film is formed over the first substrate 340, and then etching is performed on the conductive film with the use of a resist mask formed in a first photolithography process so that a gate electrode 351 is formed. The gate electrode 351 can be formed in a manner similar to that of the gate electrode 411 in Embodiment 2.

Next, a gate insulating film 342 is formed over the gate electrode 351. The gate insulating film 342 can be formed in a manner similar to that of the gate insulating film 402 in Embodiment 2.

Figure 20A:
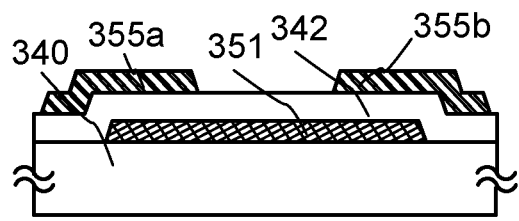
FIGS. 20A to 20D illustrate a method for manufacturing a thin film transistor.

Next, a conductive film is formed over the gate insulating film 342; a resist mask is formed over the conductive film in a second photolithography process; a source electrode 355a and a drain electrode 355b are formed by selective etching; then, the resist mask is removed (see FIG. 20A).

Figure 20B:
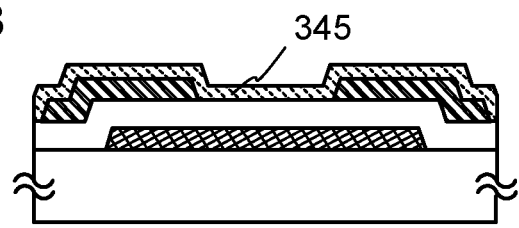
Figure 20C:
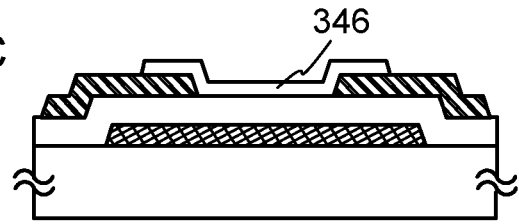
Figure 20D:
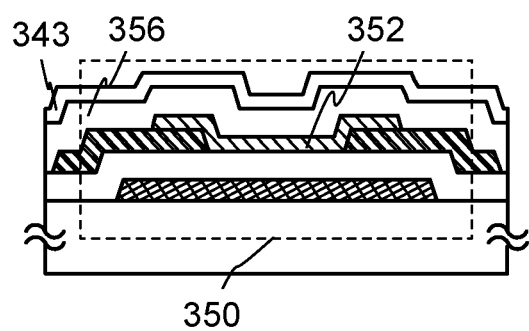

Then, an oxide semiconductor film 345 is formed (see FIG. 20B). The oxide semiconductor film 345 can be formed in a manner similar to that of the oxide semiconductor film in Embodiment 2. In this embodiment, the oxide semiconductor film 345 is deposited by sputtering with the use of an In—Ga—Zn—O-based oxide semiconductor target. The oxide semiconductor film 345 is processed into an island-shaped oxide semiconductor film in a third photolithography process.

In this case, it is preferable to form the oxide semiconductor film 345 while moisture remaining in a treatment chamber is removed in order that hydrogen, a hydroxyl group, or moisture be not contained in the oxide semiconductor film 345. In order to remove moisture remaining in the treatment chamber, an adsorption vacuum pump is preferably used.

Then, the oxide semiconductor film is dehydrated or dehydrogenated. The temperature of first heat treatment for dehydration or dehydrogenation is 400 to 750° C., preferably higher than or equal to 400° C. and lower than the strain point of the substrate. Here, after the substrate is put in an electric furnace which is a kind of heat treatment apparatus and the oxide semiconductor film is subjected to heat treatment at 450° C. for one hour in a nitrogen atmosphere, water or hydrogen is prevented from being mixed into the oxide semiconductor film by preventing the substrate from being exposed to the air; thus, an oxide semiconductor film 346 is obtained (see FIG. 20C).

For example, as the first heat treatment, GRTA may be performed as follows. The substrate is transferred and put in an inert gas heated at a high temperature of 650 to 700° C., is heated for several minutes, and is transferred and taken out of the inert gas heated at the high temperature. GRTA enables high-temperature heat treatment in a short time.

An oxide insulating film 356 which serves as a protective insulating film formed in contact with the oxide semiconductor film 346 is formed.

The oxide insulating film 356 can be formed in a manner similar to that of the oxide insulating film 316 in Embodiment 6. Here, it is preferable to form the oxide insulating film 356 while moisture remaining in the treatment chamber is removed in order that hydrogen, a hydroxyl group, or moisture be not contained in the oxide semiconductor film 346 and the oxide insulating film 356. In order to remove moisture remaining in the treatment chamber, an adsorption vacuum pump is preferably used.

Next, as in Embodiment 2, second heat treatment (preferably at 200 to 400° C., for example, 250 to 350° C.) may be performed in an inert gas atmosphere or an oxygen gas atmosphere. In the second heat treatment, heat is applied while a channel formation region of the oxide semiconductor film is in contact with the oxide insulating film 356.

Through the above steps, after the first heat treatment for dehydration or dehydrogenation is performed on the deposited oxide semiconductor film in order to lower the resistance of the oxide semiconductor film, the oxide semiconductor film is made to be in an oxygen excess state. Accordingly, an intrinsic (i-type) oxide semiconductor film 352 is formed. Through the above steps, the thin film transistor 350 is formed.

Further, heat treatment may be performed at 100 to 200° C. for 1 to 30 hours in an air atmosphere. In this embodiment, the heat treatment is performed at 150° C. for 10 hours. Through this heat treatment, hydrogen is introduced from the oxide semiconductor film to the oxide insulating film; thus, a normally-off thin film transistor can be obtained. Thus, the reliability of a display panel can be improved.

A protective insulating film may be formed over the oxide insulating film 356. For example, a silicon nitride film is formed by RF sputtering. In this embodiment, a protective insulating film 343 is formed using a silicon nitride film as the protective insulating film (see FIG. 20D).

Next, although not illustrated, the oxide insulating film 114 and the planarization insulating film 115 for planarization that are illustrated in FIGS. 2A and 2B are provided over the protective insulating film 343. Then, an opening which reaches the drain electrode 355b is formed in the protective insulating film and the planarization insulating film, and a pixel electrode (not illustrated) which is electrically connected to the drain electrode 355b is formed in the opening.

When display on a display panel of an e-book reader is controlled by a thin film transistor including a highly purified oxide semiconductor whose concentration of hydrogen is low as described in this embodiment, the number of scanning of pixels can be reduced and the drive frequency of a scan line driver circuit can be lowered. Thus, the power consumption of the e-book reader can be reduced and images can be held for a long time. Further, the off-state current of the thin film transistor including a highly purified oxide semiconductor whose concentration of hydrogen is low is decreased to $1 \times 10^{-13}$ A or less, a capacitor for holding signal voltage applied to the pixel can be made small, so that the area of the capacitor and the area of the pixel can be made small. Therefore, the resolution of the e-book reader can be increased.

This embodiment can be combined with any of the structures described in the other embodiments as appropriate.

Embodiment 9

In this embodiment, a different embodiment of a thin film transistor applicable to the display panel in Embodiment 1 is described. A thin film transistor 380 illustrated in this embodiment can be used as the thin film transistor 106 in Embodiment 1 (see FIGS. 2A and 2B).

Figure 21:
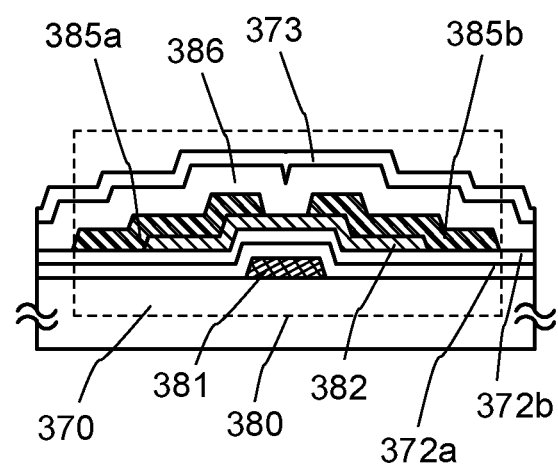
FIG. 21 illustrates a thin film transistor.

In this embodiment, FIG. 21 illustrates an example of a thin film transistor whose manufacturing steps are partly different from those in Embodiment 6. Since FIG. 21 is the same as FIGS. 18A to 18E except for some steps, the same portions are denoted by the same reference numerals and detailed description of the same portions is omitted.

As in Embodiment 6, a gate electrode 381 is formed over a first substrate 370, and a first gate insulating film 372a and a second gate insulating film 372b are stacked. In this embodiment, the gate insulating film has a two-layer structure. A nitride insulating film is used as the first gate insulating film 372a, and an oxide insulating film is used as the second gate insulating film 372b.

As the oxide insulating film, a silicon oxide film, a silicon oxynitride film, an aluminum oxide film, an aluminum oxynitride film, or the like can be used. In addition, as the nitride insulating film, a silicon nitride film, a silicon nitride oxide film, an aluminum nitride film, an aluminum nitride oxide film, or the like can be used.

Then, an oxide semiconductor film is formed; and the oxide semiconductor film is etched using a resist mask formed in a photolithography process, so that an island-shaped oxide semiconductor film is formed. The oxide semiconductor film can be formed in a manner similar to that of the oxide semiconductor film in Embodiment 2. In this embodiment, the oxide semiconductor film is deposited by sputtering with the use of an In—Ga—Zn—O-based oxide semiconductor target.

In this case, it is preferable to form the oxide semiconductor film while moisture remaining in a treatment chamber is removed in order that hydrogen, a hydroxyl group, or moisture be not contained in the oxide semiconductor film. In order to remove moisture remaining in the treatment chamber, an adsorption vacuum pump is preferably used.

Then, the oxide semiconductor film is dehydrated or dehydrogenated. The temperature of first heat treatment for dehydration or dehydrogenation is 400 to 750° C., preferably 425 to 750° C. Note that in the case where the temperature of the first heat treatment is 425° C. or higher, the heat treatment time may be one hour or less. In the case where the temperature of the first heat treatment is lower than 425° C., the heat treatment time is longer than one hour. Here, after the substrate is put in an electric furnace which is a kind of heat treatment apparatus and the oxide semiconductor film is subjected to heat treatment in a nitrogen atmosphere, water or hydrogen is prevented from being mixed into the oxide semiconductor film by preventing the substrate from being exposed to the air; thus, the oxide semiconductor film is obtained. After that, a high-purity oxygen gas, a high-purity $N_2O$ gas, or ultra-dry air (having a dew point of −40° C. or lower, preferably −60° C. or lower) is introduced into the same furnace and cooling is performed. It is preferable that water, hydrogen, or the like be not contained in the oxygen gas or the $N_2O$ gas. Alternatively, the purity of the oxygen gas or the $N_2O$ gas which is introduced into the heat treatment apparatus is preferably 6N (99.9999%) or higher, more preferably 7N (99.99999%) or higher (that is, the impurity concentration in the oxygen gas or the $N_2O$ gas is 1 ppm or lower, preferably 0.1 ppm or lower).

Note that the heat treatment apparatus is not limited to the electric furnace. For example, an RTA apparatus such as a GRTA apparatus or an LRTA apparatus can be used.

Further, after the first heat treatment for dehydration or dehydrogenation, heat treatment may be performed at 200 to 400° C., preferably 200 to 300° C. in an oxygen gas atmosphere or an $N_2O$ gas atmosphere.

In addition, the first heat treatment for the oxide semiconductor film can be performed on the oxide semiconductor film before being processed into the island-shaped oxide semiconductor film. In that case, the substrate is taken out from a heat apparatus after the first heat treatment, and then a photolithography process is performed.

The entire oxide semiconductor film is made to be in an oxygen excess state through the above steps; thus, the oxide semiconductor film has higher resistance, that is, the oxide semiconductor layer becomes intrinsic. Accordingly, an oxide semiconductor film 382 whose entire region has i-type conductivity is formed.

Next, a resist mask is formed over the oxide semiconductor film 382 in a photolithography process; a source electrode 385a and a drain electrode 385b are formed by selective etching; and an oxide insulating film 386 is formed by sputtering.

In this case, it is preferable to form the oxide insulating film 386 while moisture remaining in the treatment chamber is removed in order that hydrogen, a hydroxyl group, or moisture be not contained in the oxide semiconductor film 382 and the oxide insulating film 386. In order to remove moisture remaining in the treatment chamber, an adsorption vacuum pump is preferably used.

Through the above steps, the thin film transistor 380 can be formed.

Next, in order to reduce variation in electrical characteristics of thin film transistors, heat treatment (preferably at higher than or equal to 150° C. and lower than 350° C.) may be performed in an inert gas atmosphere or a nitrogen gas atmosphere. For example, the heat treatment is performed at 250° C. for one hour in a nitrogen atmosphere.

Further, as in Embodiment 2, heat treatment may be performed at 100 to 200° C. for 1 to 30 hours in an air atmosphere. Through this heat treatment, hydrogen is introduced from the oxide semiconductor film to the oxide insulating film; thus, a normally-off thin film transistor can be obtained. Thus, the reliability of a display panel can be improved.

A protective insulating film 373 is formed over the oxide insulating film 386. In this embodiment, a 100-nm-thick silicon nitride film is formed as the protective insulating film 373 by sputtering.

The protective insulating film 373 and the first gate insulating film 372a which are formed using nitride insulating films do not contain an impurity such as moisture, hydrogen, hydride, or hydroxide and block entry of the impurity from the outside.

Therefore, in a manufacturing process performed after the formation of the protective insulating film 373, entry of an impurity such as moisture from the outside can be prevented. Further, even after a device is completed as a display panel, entry of an impurity such as moisture from the outside can be prevented in the long term, so that long-term reliability of the device can be improved.

Alternatively, the insulating film provided between the protective insulating film 373 and the first gate insulating film 372a which are formed using nitride insulating films may be removed so that the protective insulating film 373 and the first gate insulating film 372a are in contact with each other.

Therefore, the impurity such as moisture, hydrogen, hydride, or hydroxide contained in the oxide semiconductor film can be reduced as much as possible, entry of the impurity can be prevented, and the impurity concentration of the oxide semiconductor film can be kept low.

Next, although not illustrated, the planarization insulating film 115 for planarization that is illustrated in FIGS. 2A and 2B may be provided over the protective insulating film 373. Then, an opening which reaches the drain electrode 385b is formed in the protective insulating film and the planarization insulating film, and a pixel electrode (not illustrated) which is electrically connected to the drain electrode 385b is formed in the opening.

When display on a display panel of an e-book reader is controlled by a thin film transistor including a highly purified oxide semiconductor whose concentration of hydrogen is low as described in this embodiment, the number of scanning of pixels can be reduced and the drive frequency of a scan line driver circuit can be lowered. Thus, the power consumption of the e-book reader can be reduced and images can be held for a long time. Further, the off-state current of the thin film transistor including a highly purified oxide semiconductor whose concentration of hydrogen is low is decreased to $1 \times 10^{-13}$ A or less, a capacitor for holding signal voltage applied to the pixel can be made small, so that the area of the capacitor and the area of the pixel can be made small. Therefore, the resolution of the e-book reader can be increased.

This embodiment can be combined with any of the structures described in the other embodiments as appropriate.

Embodiment 10

In this embodiment, an e-book reader having a touch panel function is described with reference to FIG. 22 as one embodiment of the e-book reader described in the aforementioned embodiment.

Figure 22:
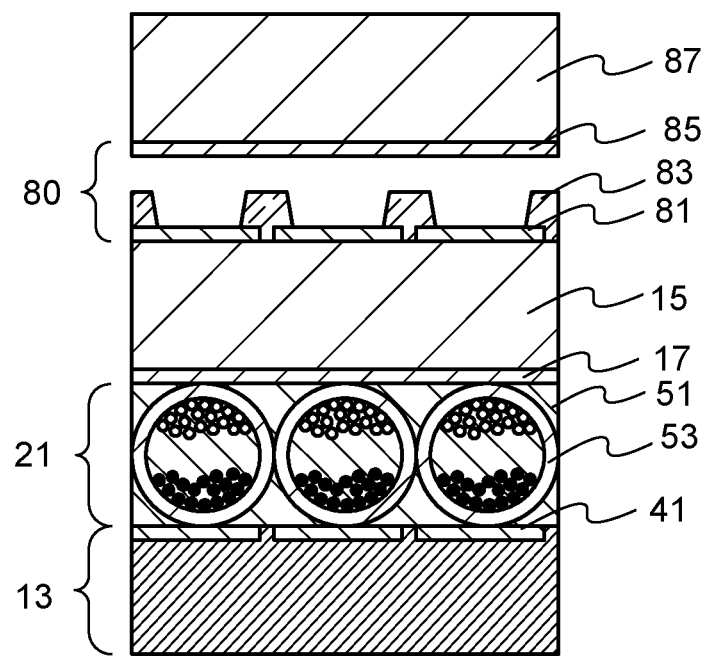
FIG. 22 is a cross-sectional view of a display panel.

FIG. 22 is a cross-sectional view of the display medium 21 and the vicinity thereof in the e-book reader having a touch panel function. A touch sensor portion 80 is provided over the second substrate 15. As the touch sensor portion 80, a resistive touch sensor, a surface capacitive touch sensor, a projected capacitive touch sensor, or the like can be used as appropriate. In this embodiment, a resistive touch sensor is used as the touch sensor portion 80.

The touch sensor portion 80 includes a third electrode 81 formed over the second substrate 15 and a fourth electrode 85 formed on a fourth substrate 87. A third electrode 81 and a spacer 83 are formed over the second substrate 15. In addition, the fourth substrate 87 on which the fourth electrode 85 is formed and the second substrate 15 are sealed with a sealant (not illustrated). Further, although not illustrated, the third substrate 27 in Embodiment 1 may be provided over the fourth substrate 87.

A substrate which is similar to the second substrate 15 can be used as the fourth substrate 87. In addition, the third electrode 81 and the fourth electrode 85 can be formed using a material which is similar to the material of the second electrode 17.

When a certain position is pressed with a pen or a finger from the outside, the shape of the fourth substrate is changed and current flows by contact between the third electrode 81 and the fourth electrode 85, so that data on the pressed position can be detected.

According to this embodiment, with the use of a thin film transistor including a highly purified oxide semiconductor film whose concentration of hydrogen is low as an element layer in an e-book reader having a touch panel function, power consumption can be reduced and images can be held for a long time. Therefore, the resolution of the e-book reader can be increased.

Note that this embodiment can be combined with any of the other embodiments as appropriate.

Embodiment 11

In this embodiment, an e-book reader capable of wirelessly storing and releasing electricity in/from a storage device is described with reference to FIGS. 23A and 23B.

Figure 23A:
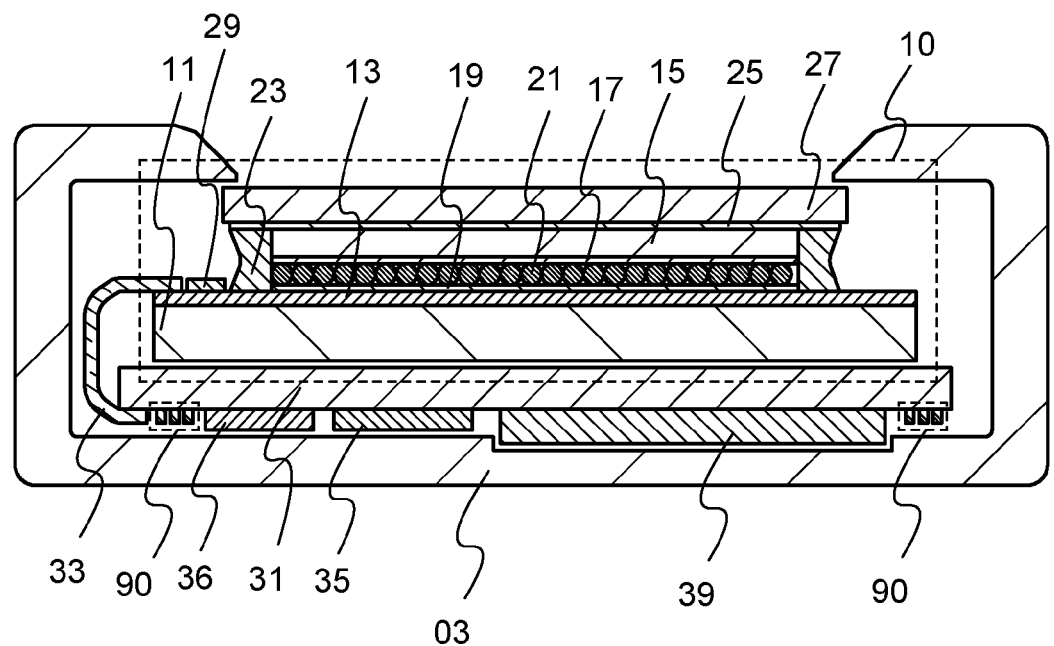
FIG. 23A is a perspective view of an e-book reader.

FIG. 23A illustrates a cross-sectional structure of an e-book reader in this embodiment. The e-book reader in this embodiment includes an antenna 90 and a semiconductor device 36 capable of wirelessly storing and releasing electricity in/from a storage device 39 on the wiring board 31.

As a method for wirelessly storing electricity in the storage device 39, any of the following methods can be used as appropriate: an electromagnetic induction method in which electromotive force generated by changes in electric fields between a coil provided in an external electric power supply device 91 and a coil provided in the e-book reader is used, a radio wave reception method in which a radio wave received by an antenna provided in the e-book reader is converted into DC voltage in a resonant circuit and a rectifier circuit and is used, and a resonant method in which electric fields or magnetic fields of the external electric power supply device 91 and the e-book reader are used.

In this embodiment, a method for storing electricity with the use of an electromagnetic induction method is described.

Figure 23B:
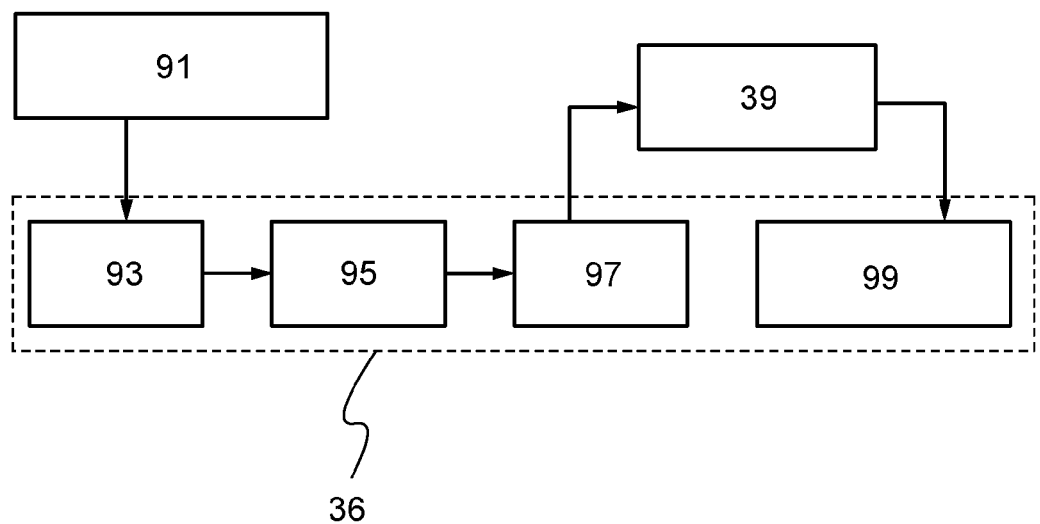
FIG. 23B is a block diagram of a semiconductor device.

FIG. 23B illustrates one embodiment of a block diagram in which the semiconductor device 36 for wirelessly storing and releasing electricity in/from the storage device receives a radio signal from the external electric power supply device 91. The semiconductor device 36 includes an antenna circuit 93, a rectifier circuit 95, a charging circuit 97, and a stabilizing power supply circuit 99.

In the case of performing communication with a magnetic field, the antenna circuit 93 includes at least a coiled antenna and a tuning capacitor. The rectifier circuit 95 includes a diode and a smoothing capacitor. Note that in the case of performing communication with the external electric power supply device 91 not with a magnetic field but with an electric field, the shape of the antenna is not necessarily a coiled shape.

The external electric power supply device 91 includes an electric power transmission control portion and an antenna circuit and an antenna circuit. The antenna circuit in the external electric power supply device 91 includes a coiled antenna and a resonant capacitor. The electric power transmission control portion modulates an electric signal for electric power transmission that is transmitted to the semiconductor device 36 in the e-book reader, supplies induction current to the antenna circuit, and outputs a signal for electric power transmission to the semiconductor device 36 from the antenna.

When the antenna included in the antenna circuit in the external electric power supply device 91 and the antenna included in the antenna circuit in the semiconductor device 36 in the e-book reader are moved closer to each other, an AC magnetic filed is generated from the antenna when the antenna included in the antenna circuit in the external electric power supply device 91 is a coiled antenna. The AC magnetic field penetrates the antenna circuit 93 in the semiconductor device 36 in the e-book reader, and voltage is generated between terminals (one end and the other end of the antenna) of the antenna circuit 93 in the semiconductor device 36 in the e-book reader by electromagnetic induction. The voltage is half-rectified by the diode in the rectifier circuit 95 and is smoothed by the smoothing capacitor. The charging circuit 97 is operated with the smoothed voltage, and electricity is stored in the storage device 39.

Voltage output from the storage device 39 is stabilized by the stabilizing power supply circuit 99. Voltage which has been stabilized is supplied to the semiconductor devices 29 and 35 which drive a display panel.

Note that in the case where the storage device 39 is a capacitor, typically a lithium ion capacitor, charge and discharge can be performed quickly. Thus, electricity can be stored in the storage device 39 through the antenna 90 in a short time.

According to this embodiment, with the use of a thin film transistor including a highly purified oxide semiconductor film whose concentration of hydrogen is low as an element layer in an e-book reader capable of wirelessly storing and releasing electricity, power consumption can be reduced and images can be held for a long time. Therefore, the resolution of the e-book reader can be increased.

Note that this embodiment can be combined with any of the other embodiments as appropriate.

Embodiment 12

In this embodiment, one embodiment of an e-book reader including a flexible display panel is described with reference to FIG. 24.

Figure 24:
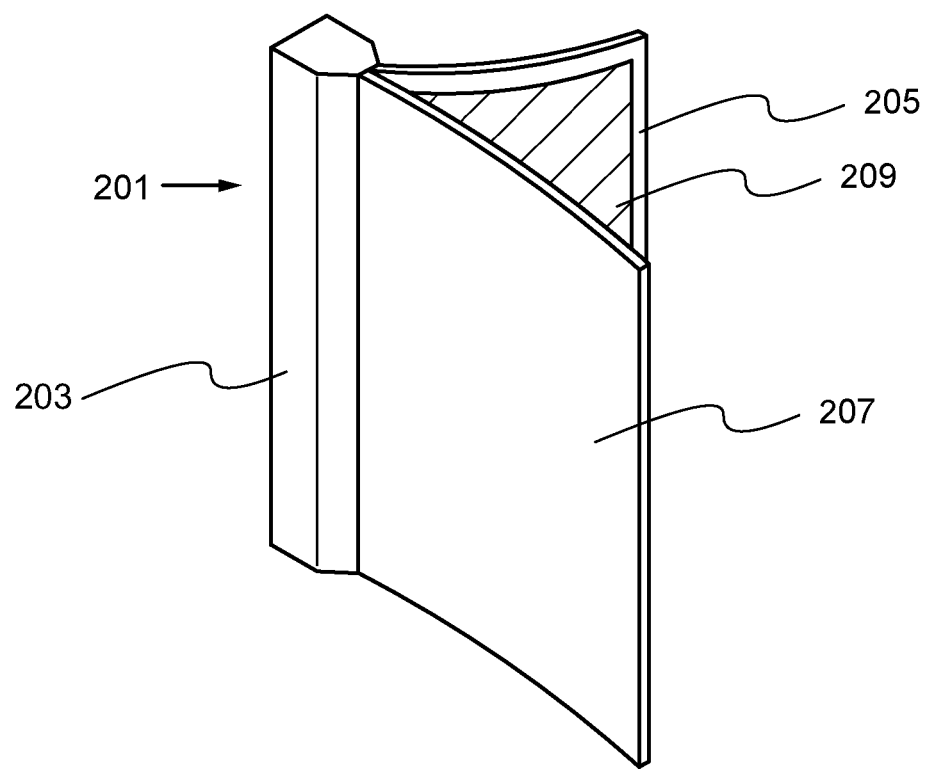
FIG. 24 illustrates an e-book reader.

FIG. 24 is a perspective view of an e-book reader 201 including two flexible display panels. The e-book reader 201 includes display panels 205 and 207 held with a hinge portion 203. The display panel 205 includes a display portion 209.

Note that although not illustrated, the display panel 207 includes a display portion on a reverse side of the display panel 207 (i.e., on a side facing the display portion 209).

The flexible display panels 205 and 207 can be manufactured when flexible substrates are used as all the first to third substrates in the display panel in Embodiment 1. In addition, when a glass substrate and a plastic film are stacked to be used, the mechanical strength of the display panel can be increased. With the use of a prepreg which includes a fibrous body in a partially-cured organic resin, the mechanical strength of the display panel can be increased.

The hinge portion 203 is formed using a columnar or cylindrical housing having a hollow. A wiring board which is connected to the display panels with an FPC is mounted on the hollow of the hinge portion 203. Further, a semiconductor device for controlling display on the display panels 205 and 207 is mounted on the wiring board. A storage device is electrically connected to the wiring board. Furthermore, the hinge portion 203 has an operation key.

According to this embodiment, with the use of a thin film transistor including a highly purified oxide semiconductor film whose concentration of hydrogen is low as an element layer in a flexible e-book reader, power consumption can be reduced and images can be held for a long time. Therefore, the resolution of the e-book reader can be increased.

Note that this embodiment can be combined with any of the other embodiments as appropriate.

Embodiment 13

In this embodiment, a step-up DC-DC converter is described as one embodiment of a voltage control circuit which can control voltage from the electric power supply device 37 included in the e-book reader and can supply electric power to the semiconductor device.

Figure 25:
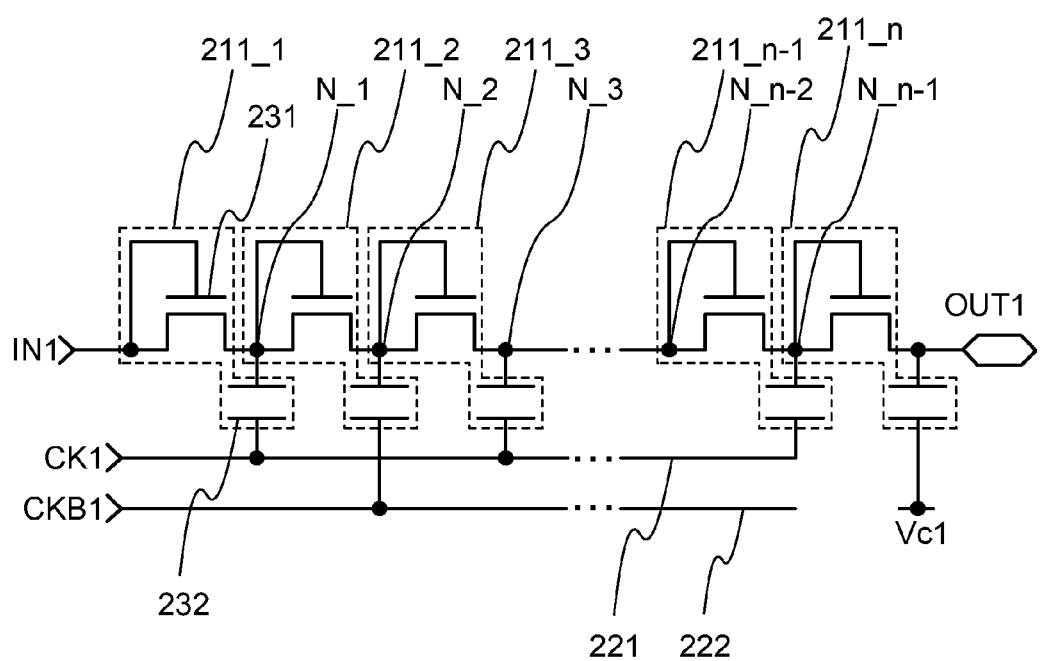
FIG. 25 is an equivalent circuit diagram of a step-up DC-DC converter.

One embodiment of the circuit structure of a step-up DC-DC converter in this embodiment is described with reference to FIG. 25. FIG. 25 is a circuit diagram illustrating one embodiment of the circuit structure of the step-up DC-DC converter in this embodiment.

The step-up DC-DC converter illustrated in FIG. 25 includes unit step-up DC-DC converters 211_1 to 211_n (n is a natural number). Each of the unit step-up DC-DC converters 211_1 to 211_n is formed using n-stage unit step-up DC-DC converters electrically connected in series.

The unit step-up DC-DC converters 211_1 to 211_n include a thin film transistor 231 and a capacitor 232.

As the thin film transistor 231, a thin film transistor including a highly purified oxide semiconductor film whose concentration of hydrogen is low as described in Embodiment 1 can be used.

In the unit step-up DC-DC converters 211_1 to 211_n, a gate of the thin film transistor 231 is electrically connected to one of a source and a drain of the thin film transistor 231. That is, the thin film transistor 231 is diode-connected. In addition, a first electrode of the capacitor 232 is electrically connected to the other of the source and the drain of the thin film transistor 231.

In a unit step-up DC-DC converter in a K-th stage (K is a natural number of any one of 2 to n), one of a source and a drain of the thin film transistor 231 is electrically connected to the other of the source and the drain of the thin film transistor 231 in a unit step-up DC-DC converter in a (K−1)th stage. A portion where the other of the source and the drain of the thin film transistor 231 in the unit step-up DC-DC converter in the (K−1)th stage and one of the source and the drain of the thin film transistor 231 in the unit step-up DC-DC converter in the K-th stage are connected to each other is denoted by a node N_M (M is a natural number of any one of 1 to (n−1)).

In a unit step-up DC-DC converter in a (2M−1)th stage, a second electrode of the capacitor 232 is electrically connected to a clock signal line 221. In a unit step-up DC-DC converter in a 2M-th stage, a second electrode of the capacitor 232 is electrically connected to a clock signal line 222. A clock signal CK1 is input to the clock signal line 221. A clock signal CKB1 is input to the clock signal line 222. The clock signal CK1 and the clock signal CKB1 have opposite phases. For example, when the clock signal CK1 is a high-level signal, the clock signal CKB1 is a low-level signal. As the clock signal CKB1, for example, a signal obtained by inversion of the clock signal CK1 can be used. The clock signal CKB1 can be generated by inversion of the voltage level of the clock signal CK1 with a NOT circuit such as an inverter, for example.

In a unit step-up DC-DC converter in a first stage, that is, the unit step-up DC-DC converter 211_1, a signal IN1 is input to one of a source and a drain of the thin film transistor 231.

In a unit step-up DC-DC converter in the last stage, that is, the unit step-up DC-DC converter 211_n, the voltage of the other of the source and the drain of the thin film transistor 231 is the voltage of a signal OUT1 which is an output signal of the step-up DC-DC converter. Voltage $V_{c1}$ is applied to a second electrode of the capacitor 232 in the unit step-up DC-DC converter 211_n. The voltage $V_{c1}$ can be any voltage. For example, voltage which has the same level as voltage $V_H$ or voltage $V_L$ can be used. In addition, the capacitance of the capacitor 232 in the unit step-up DC-DC converter 211_n is preferably larger than that of the capacitor 232 in the other unit step-up DC-DC converters. When the capacitance of the capacitor 232 in the unit step-up DC-DC converter 211_n is large, the voltage level of the output signal of the unit step-up DC-DC converter 211_n, that is, the signal OUT1 which is the output signal of the step-up DC-DC converter can be further stabilized.

As described above, one example of the step-up DC-DC converter in this embodiment includes n-stage unit step-up DC-DC converters. Each unit step-up DC-DC converter includes a diode-connected thin film transistor and a capacitor. As the diode-connected thin film transistor, a thin film transistor including a highly purified oxide semiconductor film whose concentration of hydrogen is low. Thus, the voltage of each node can be held for a longer time, it takes a shorter time to reach desired voltage, and voltage conversion efficiency can be improved.

Next, one embodiment of the operation of the step-up DC-DC converter illustrated in FIG. 25 is described.

The operation of the step-up DC-DC converter illustrated in FIG. 25 can be described by division of the whole period into a plurality of periods. The operation in each period is described below. Note that in one embodiment of the operation of the step-up DC-DC converter illustrated in FIG. 25, a high-level signal is input as the signal IN1; a clock signal whose level is periodically changed between a high level and a low level is used as the clock signal CK1; a clock signal obtained by inversion of the clock signal CK is used as the clock signal CKB1; the thin film transistor 231 in each unit step-up DC-DC-converter is an n-channel thin film transistor; and the threshold voltages of the thin film transistors 231 in the unit step-up DC-DC converters have the same level.

First, in a first period, the clock signal CK1 becomes a low level, and the clock signal CKB1 becomes a high level.

In this case, in the unit step-up DC-DC converter 211_1, the diode-connected thin film transistor 231 is turned on, so that the voltage of a node N_1 starts to rise. The voltage of the node N_1 (also referred to as voltage $V_{N1}$) rises to $V_{IN1}$ (the voltage of the signal IN1)–$V_{th231}$ (the threshold voltage of the thin film transistor 231). When the voltage of the node N_1 becomes $V_{IN1}$–$V_{th231}$, the diode-connected thin film transistor 231 in the unit step-up DC-DC converter 211_1 is turned off, so that the node N_1 is made to be in a floating state.

Next, in a second period, the clock signal CK1 becomes a high level, and the clock signal CKB1 becomes a low level.

In this case, in the unit step-up DC-DC converter 211_1, the diode-connected thin film transistor 231 is kept off, the node N_1 is in a floating state, and voltage applied to a second electrode of the capacitor 232 in the unit step-up DC-DC converter 211_1 is changed into $V_H$. Thus, the voltage of the first electrode of the capacitor 232 starts to change in accordance with the change in the voltage of the second electrode of the capacitor 232. The voltage of the node N_1 rises to $V_{IN1}$–$V_{th231}$+$V_H$. In this case, voltage applied between the first terminal and the second terminal of the capacitor 232 is $V_{IN}$–$V_{th231}$. In this manner, in the second period, the voltage of the node N_1 is voltage obtained by boosting of the voltage of the node N_1 in the first period.

In addition, since the voltage of the node N_1 becomes $V_{IN}$–$V_{th231}$+$V_H$, in the unit step-up DC-DC converter 211_2, the diode-connected thin film transistor 231 is turned on, so that the voltage of a node N_2 starts to rise. The voltage of the node N_2 (also referred to as voltage $V_{N2}$) rises to $V_{N1}$–$V_{th231}$. When the voltage of the node N_2 becomes $V_{N1}$–$V_{th231}$, the diode-connected thin film transistor 231 in the unit step-up DC-DC converter 211_2 is turned off, so that the node N_2 is made to be in a floating state.

Next, in a third period, the clock signal CK1 becomes a low level, and the clock signal CKB1 becomes a high level.

In this case, in the unit step-up DC-DC converter 211_2, the diode-connected thin film transistor 231 is kept off, the node N_2 is in a floating state, and voltage applied to a second electrode of the capacitor 232 in the unit step-up DC-DC converter 211_2 is changed from $V_L$ into $V_H$. Thus, the voltage of the first electrode of the capacitor 232 starts to change in accordance with the change in the voltage of the second electrode of the capacitor 232. The voltage of the node N_2 rises to $V_{N1}$–$V_{th231}$+$V_H$. In this case, voltage applied between the first electrode and the second electrode of the capacitor 232 is $V_{N1}$–$V_{th231}$. In this manner, in the third period, the voltage of the node N_2 is voltage obtained by boosting of the voltage of the node N_2 in the second period.

In addition, since the voltage of the node N_2 becomes $V_{N1}$–$V_{th231}$+$V_H$, in the unit step-up DC-DC converter 211_3, the diode-connected thin film transistor 231 is turned on, so that the voltage of a node N_3 starts to rise. The voltage of the node N_3 (also referred to as voltage $V_N3$) rises to $V_{N2}$–$V_{th231}$. When the voltage of the node N_3 becomes $V_{N2}$–$V_{th231}$, the diode-connected thin film transistor 231 in the unit step-up DC-DC converter 211_3 is turned off, so that the node N_3 is made to be in a floating state.

Further, in each unit step-up DC-DC converter in a third or subsequent stage, operations which are similar to that of the unit step-up DC-DC converter are sequentially performed in accordance with a periodical change of the clock signal CK1 and the clock signal CKB1 between a high level and a low level. The voltage of each node N M is boosted to $V_{IN1}$+M($V_H$–$V_{th231}$) at a maximum, and the voltage of the signal OUT1 is boosted to $V_{IN1}$+n($V_H$–$V_{th231}$) at a maximum. In this manner, in the step-up DC-DC converter illustrated in FIG. 25, the voltage of the signal IN1 is boosted, and the signal OUT1 having the boosted voltage is output as an output signal.

As described above, in one embodiment of the step-up DC-DC converter in this embodiment, when boosting operation is performed in each unit step-up DC-DC converter, a signal whose voltage is higher than the voltage of an input signal can be output as an output signal.

Further, in one embodiment of the step-up DC-DC converter in this embodiment, the diode connected thin film transistor in each unit step-up DC-DC converter is a thin film transistor including a highly purified oxide semiconductor film whose concentration of hydrogen is low. Thus, the leakage current of the thin film transistor can be reduced, the voltage of each node can be held for a longer time, and it takes a shorter time to reach desired voltage by boosting operation.

Note that this embodiment can be combined with any of the other embodiments as appropriate.

This application is based on Japanese Patent Application serial No. 2009-242698 and Japanese Patent Application serial No. 2009-242707 filed with Japan Patent Office on Oct. 21, 2009, the entire contents of which are hereby incorporated by reference.

EXPLANATION OF REFERENCE

01: e-book reader, 03: housing, 05: display portion, 07: operation key, 09: operation key, 11: first substrate, 29: semiconductor device, 23: sealant, 13: element layer, 19: adhesive, 21: display medium, 17: second electrode, 15: second substrate, 25: adhesive, 27: third substrate, 10: display panel, 33: FPC, 35: semiconductor device, 31: wiring board, 37: power supply device, 102A: second wiring, 103: oxide semiconductor film, 106: thin film transistor, 101: first wiring, 102B: third wiring, 105: pixel electrode, 100: pixel, 104: capacitor line, 123: scan line driver circuit, 124: signal line driver circuit, 122: pixel portion, 121: pixel, 120: first substrate, 21: display medium, 57: white particle, 51: filler, 53: microcapsule, 41: first electrode, 55: black particle, 59: disperse medium, 67: white electronic liquid powder, 61: rib, 63: space, 65: black electronic liquid powder, 71: filler, 77: white region, 73: microcapsule, 79: liquid, 75: black region, 111: first substrate, 112: base film, 113: gate insulating film, 114: oxide insulating film, 115: planarization insulating film, 133: writing period, 135: non-writing period, 131: image rewriting period, 137: writing period, 143: writing period, 145: non-writing period, 141: image rewriting period, 147: writing period, 155: storage cell, 157: terminal portion, 159: terminal portion, 151: storage device, 153: exterior material, 171: negative electrode collector, 173: negative electrode active material, 163: negative electrode, 167: separator, 177: positive electrode active material, 175: positive electrode collector, 165: positive electrode, 169: electrolyte, 414a: wiring, 415a: source electrode or drain electrode, 411; gate electrode, 412: oxide semiconductor film, 415b: source electrode or drain electrode, 414b: wiring, 410: thin film transistor, 407: insulating film, 400: first substrate, 402: gate insulating film, 460: thin film transistor, 465b: source electrode or drain electrode, 461: gate electrode, 462: oxide semiconductor film, 468: wiring, 452: gate insulating film, 461a: gate electrode, 461b: gate electrode, 468: wiring, 464: wiring, 465a2: source electrode or drain electrode, 457: insulating film, 465a1: source electrode or drain electrode, 450: first substrate, 422: insulating film, 412: oxide semiconductor film, 425: thin film transistor, 411: gate electrode, 427: conductive film, 424: conductive film, 426: thin film transistor, 394: first substrate, 393: oxide semiconductor film, 391: gate electrode, 397: gate insulating film, 399: oxide semiconductor film, 395: source electrode, 395b: drain electrode, 396: oxide semiconductor film, 390: thin film transistor, 392: oxide semiconductor layer, 398: protective insulating film, 300: first substrate, 311: gate electrode, 330: oxide semiconductor film, 302: gate insulating film, 331: oxide semiconductor film, 315*a*: source electrode, 315*b*: drain electrode, 316: oxide insulating film, 310: thin film transistor, 313: channel formation region, 312: oxide semiconductor film, 303: protective insulating film, 322: gate insulating film, 361: gate electrode, 332: oxide semiconductor film, 320: first substrate, 366: oxide insulating film, 362: oxide semiconductor film, 365*b*: source electrode, 365*b*: drain electrode, 323: protective insulating film, 363: channel formation region, 362: oxide semiconductor film, 360: thin film transistor, 340: first substrate, 355*a*: source electrode, 351: gate electrode, 342: gate insulating film, 355*b*: drain electrode, 345: oxide semiconductor film, 346: oxide semiconductor film, 343: protective insulating film, 356: oxide insulating film, 352: oxide semiconductor film, 350: thin film transistor, 385*a*: source electrode, 386: oxide insulating film, 373: protective insulating film, 385*b*: drain electrode, 372*b*: second gate insulating film, 372*a*: first gate insulating film, 382: oxide semiconductor film, 380: thin film transistor, 381: gate electrode, 370: first substrate, 80: touch sensor portion, 81: third electrode, 83: spacer, 85: fourth electrode, 87: fourth substrate, 90: antenna, 91: external electric power supply device, 93: antenna circuit, 95: rectifier circuit, 97: charging circuit, 99: stabilizing power supply circuit, 201: e-book reader, 203: hinge portion, 205: display panel, 207: display panel, 209: display portion, 221: signal line, 222: clock signal line, 231: thin film transistor, and 231: capacitor.

The invention claimed is:

1. An e-book reader comprising:
a transistor including a gate electrode, a gate insulating film, an oxide semiconductor film, a source electrode and a drain electrode;
a pixel electrode electrically connected to the oxide semiconductor film;
a common electrode facing the pixel electrode; and
a display panel including a display medium between the pixel electrode and the common electrode,
wherein a concentration of hydrogen in the oxide semiconductor film measured by secondary ion mass spectrometry is $5\times10^{19}/cm^3$ or lower,
wherein an outer periphery of the gate electrode has a circular shape with a circular opening at a center thereof when viewed from a top of the transistor, and
wherein the oxide semiconductor film is over and in contact with one of the source electrode and the drain electrode, and the other of the source electrode and the drain electrode is over and in contact with the oxide semiconductor film.

2. The e-book reader according to claim 1, wherein the display panel is an electrophoretic display panel.

3. The e-book reader according to claim 1, wherein the display panel is a particle movement display panel.

4. The e-book reader according to claim 1, wherein the display panel is a particle rotation display panel.

5. The e-book reader according to claim 1, wherein the display panel is a liquid crystal display panel.

6. The e-book reader according to claim 1, wherein the display panel is an electrolytic precipitation display panel.

7. The e-book reader according to claim 1, wherein the display panel is an electrochromic display panel.

8. The e-book reader according to claim 1, wherein the display panel is a film transfer display panel.

9. The e-book reader according to claim 1, further comprising a primary battery, a secondary battery, or a capacitor.

10. The e-book reader according to claim 1, wherein an off-state current of the transistor is less than $1\times10^{-13}$ A.

11. An e-book reader comprising:
a transistor including a gate electrode, a gate insulating film, an oxide semiconductor film, a source electrode and a drain electrode;
a pixel electrode electrically connected to the oxide semiconductor film;
a common electrode facing the pixel electrode; and
a display panel including a display medium between the pixel electrode and the common electrode,
wherein an outer periphery of the gate electrode has a circular shape with a circular opening at a center thereof when viewed from a top of the transistor, and
wherein the oxide semiconductor film is over and in contact with one of the source electrode and the drain electrode, and the other of the source electrode and the drain electrode is over and in contact with the oxide semiconductor film.

12. The e-book reader according to claim 11, wherein the display panel is an electrophoretic display panel.

13. The e-book reader according to claim 11, wherein the display panel is a particle movement display panel.

14. The e-book reader according to claim 11, wherein the display panel is a particle rotation display panel.

15. The e-book reader according to claim 11, wherein the display panel is a liquid crystal display panel.

16. The e-book reader according to claim 11, wherein the display panel is an electrolytic precipitation display panel.

17. The e-book reader according to claim 11, wherein the display panel is an electrochromic display panel.

18. The e-book reader according to claim 11, wherein the display panel is a film transfer display panel.

19. The e-book reader according to claim 11, further comprising a primary battery, a secondary battery, or a capacitor.

20. The e-book reader according to claim 11, wherein an off-state current of the transistor is less than $1\times10^{-13}$ A.

21. The e-book reader according to claim 1, wherein a concentration of a carrier in the oxide semiconductor film is $5\times10^{12}/cm^3$ or lower.

22. The e-book reader according to claim 11, wherein a concentration of a carrier in the oxide semiconductor film is $5\times10^{12}/cm^3$ or lower.

* * * * *